(12) United States Patent
Oura et al.

(10) Patent No.: US 6,523,256 B1
(45) Date of Patent: Feb. 25, 2003

(54) METHOD OF MANUFACTURING A WIRING BOARD

(75) Inventors: Kikuo Oura, Shiga (JP); Kenzo Fujii, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/553,866

(22) Filed: Apr. 20, 2000

Related U.S. Application Data

(62) Division of application No. 09/307,139, filed on May 7, 1999.

(30) Foreign Application Priority Data

| May 8, 1998 | (JP) | ............................................. | 10-126285 |
| May 14, 1998 | (JP) | ............................................. | 10-132241 |
| Jun. 29, 1998 | (JP) | ............................................. | 10-183037 |
| Jul. 13, 1998 | (JP) | ............................................. | 10-197615 |
| Sep. 30, 1998 | (JP) | ............................................. | 10-276861 |
| Oct. 19, 1998 | (JP) | ............................................. | 10-297303 |

(51) Int. Cl.[7] .................................................. H01K 3/10
(52) U.S. Cl. ............................. 29/852; 29/830; 29/846; 174/257; 174/260; 174/266
(58) Field of Search .......................... 29/830, 852, 846; 174/255, 257, 260, 266

(56) References Cited

U.S. PATENT DOCUMENTS 5,517,758 A  *  5/1996  Nakamura
6,175,084 B1 *  1/2001  Saitoh et al.

* cited by examiner

Primary Examiner—Carl J. Arbes
(74) Attorney, Agent, or Firm—Choate, Hall & Stewart

(57) ABSTRACT

A resin structure includes a resin layer and a metal layer. The resin layer is formed of a single material. The metal layer is laminated directly on the resin layer without intervention of an adhesive layer between the resin layer and the metal layer. A surface of the resin layer, on which the metal layer is laminated, has a surface roughness of a value in a range of 0.1 microns to 10 microns, as a rough surface. The metal layer is formed on the rough surface of the resin layer.

8 Claims, 59 Drawing Sheets

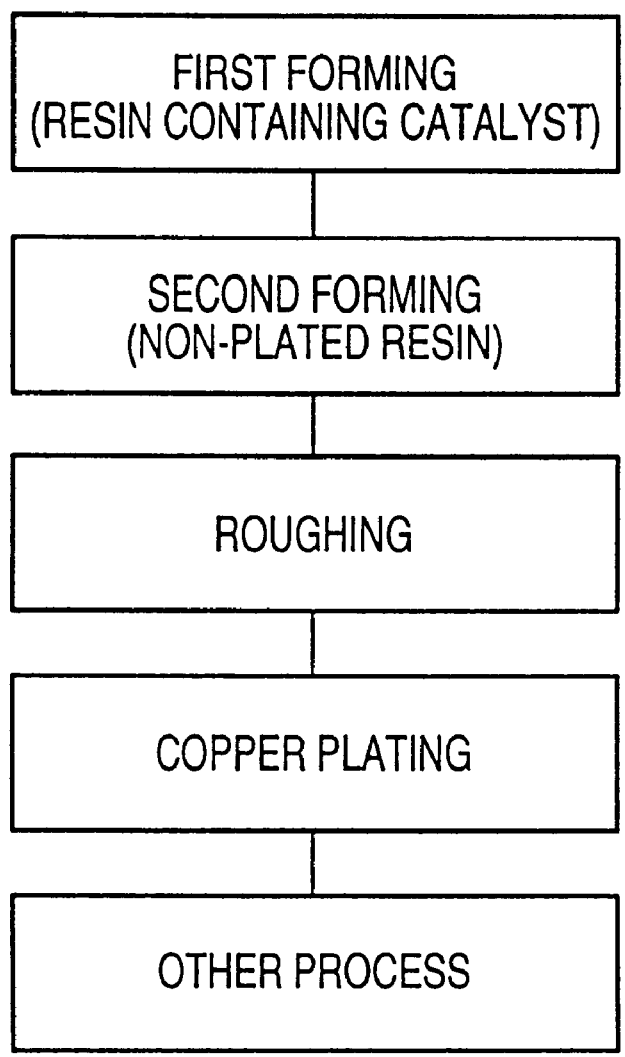

Fig.15A — FORMING BLOCK

Fig.15B — FORMING TREATMENT

Fig.15C — CLEANING

Fig.15D — ROUGHING

Fig.15E — CLEANING

Fig.15F — DRY

Fig.15G — ELECTROLESS PLATING (FORM METAL LAYER)

Fig.15H — CLEANING

Fig.15I — DRY

Fig.15J — PRODUCT

Fig.15K — OTHER PROCESS

| ITEM | PREDETERMINED VALUE |
|---|---|
| PUMP PRESSURE | 1~5kg/cm² |
| COMPRESSED AIR PRESSURE | 1~6kg/cm² |
| MEDIUM PARTICLE DIAMETER | 40~300 μmφ |
| RATIO OF GRINDING MATERIAL TO LIQUID | 5~40vol% |

Fig.24

| No. | CENTRAL PARTICLE DIAMETER (μm) | HARDNESS | TRUE SPECIFIC GRAVITY | SHAPE | RESULT |
|---|---|---|---|---|---|
| 1 | 210~297 | KNOOP 2200 | 3.9 | POLYGONAL | ◎ |
| 2 | 88~125 | KNOOP 2200 | 3.9 | POLYGONAL | ◎ |
| 3 | 210~297 | KNOOP 1770 | 4.3 | POLYGONAL | ◎ |
| 4 | 40 | MOHS 12 | 3.85 | POLYGONAL | ◎ |
| 5 | 11.5 | MOHS 12 | 3.75 | POLYGONAL | ◎ |
| 6 | 45~90 | KNOOP 500 | 2.5 | TRUE BALL-SHAPED | × |
| 7 | 75~150 | KNOOP 500 | 2.5 | TRUE BALL-SHAPED | × |
| 8 | 150~250 | ROCKWELL 110~120 | 1.3 1.5 | POLYGONAL | × |

Fig.25A
Fig.25B
Fig.25C
Fig.25D
Fig.25E
Fig.25F
Fig.25G
Fig.25H
Fig.25I
Fig.25J
Fig.25K
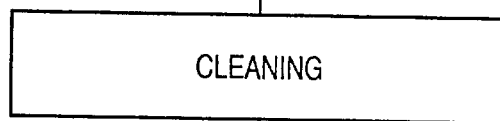
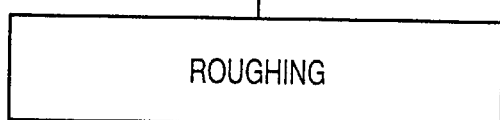
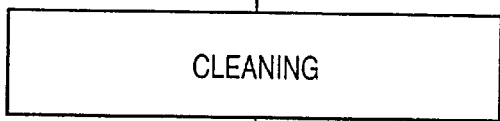
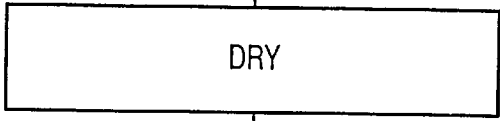
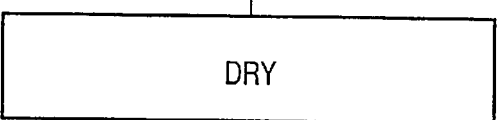
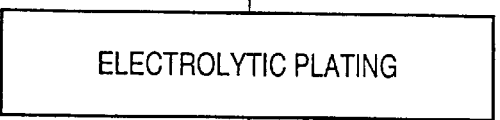
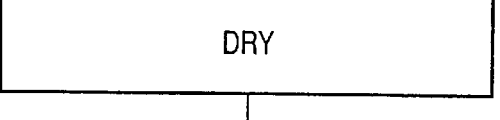
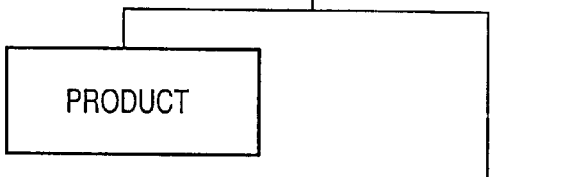

151 RESIN BOARD

SURFACE ROUGHNESS 0.1 TO 10 μm

153 ELECTROLESS PLATING

154 ELECTROLYTIC PLATING

152 WIRING

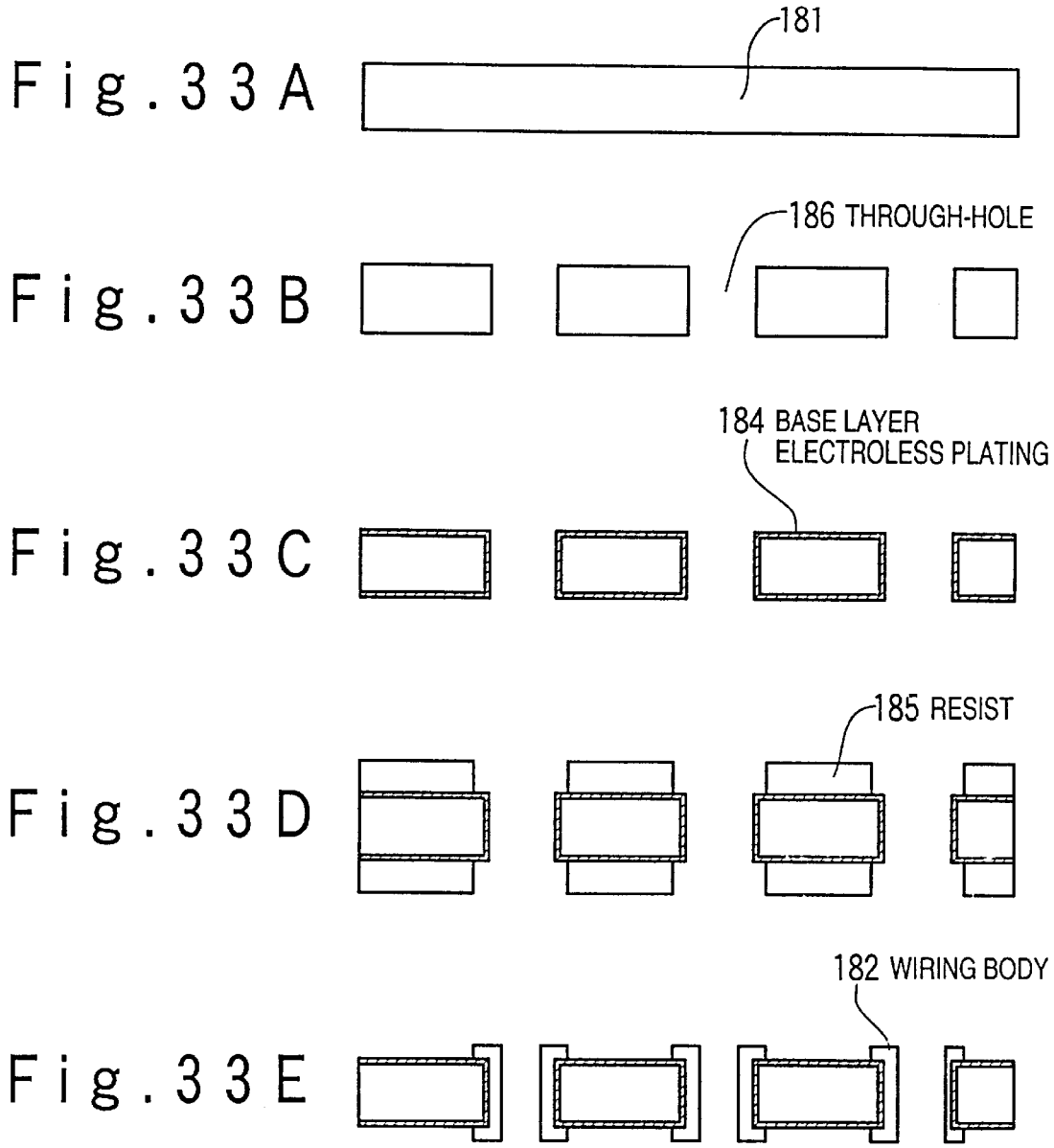

| RESIN SUBSTRATE | SUBSTRATE SURFACE REACTION DEGREE | ACTIVATION EASINESS DEGREE | REDUCING DEGREE IN NON-FORMALIN |
|---|---|---|---|
| HIGH HEAT RESISTANCE | × | × | × |
| HEAT RESISTANCE | △ | △ | △ |
| NON-HEAT RESISTANCE | ○ | ○ | ○ |

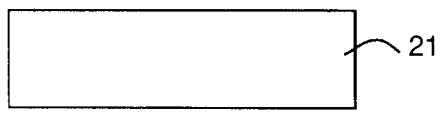
FIG. 52A
FIG. 52B
FIG. 52C
FIG. 52D
Fig.51
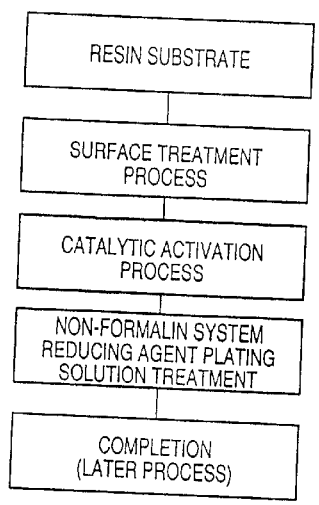
0.1-10μm
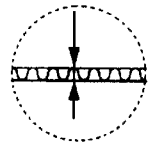
FIG. 52E
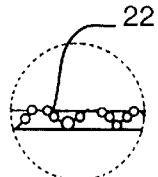
FIG. 52F
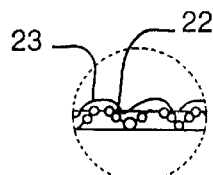
FIG. 52G

Fig.55

| RESIN SUBSTRATE | SUBSTRATE SURFACE REACTION DEGREE | ACTIVATION EASINESS DEGREE | REDUCING DEGREE IN NON-FORMALIN |
|---|---|---|---|
| HIGH HEAT RESISTANCE | ×→○ | ×→○ | ×→○ |
| HEAT RESISTANCE | △→○ | △→○ | △→○ |
| NON-HEAT RESISTANCE | ○ | ○ | ○ |

Fig.62

CLASSIFICATION BASED ON KIND OF
MAKING CONDUCTIVE

PALLADIUM SYSTEM

USE OF CONDUCTIVITY OF PALLADIUM COLLOID

USE OF CONDUCTIVITY OF PALLADIUM SULFIDE

USE OF CONDUCTIVITY OF METAL PALLADIUM TIN

CONDUCTIVE POLYMER SYSTEM

CARBON SYSTEM

Fig.63

ELECTRICAL RESISTANCE OF
VARIOUS CONDUCTIVE FILM

| KIND OF CONDUCTIVE FILM | ELECTRICAL RESISTANCE |
|---|---|
| ELECTROLESS COPPER | 1Ω OR LESS |
| CONDUCTIVE POLYMER SYSTEM | 100KΩ |
| CARBON SYSTEM | 100KΩ |
| METAL PALLADIUM TIN | 10Ω OR LESS |
| PALLADIUM COLLOID SYSTEM | SEVERAL MEGOHMS |
| PALLADIUM SULFIDE SYSTEM | 100KΩ |

CONSIDERATION RESULT OF ROUGHNESS ON BASIC SURFACE

| METHOD | RESULT |
| --- | --- |
| REVERSE SPUTTERING | LITTLE ROUGHNESS |
| PLASMA ETCHING | UNIFORM ETCHING |
| WET ETCHING | SMOOTH FUSION |
| DRY BLAST | NON-UNIFORM, RELATIVELY ROUGH TREATMENT |
| WET BLAST | UNIFORM FINE TREATMENT |

METHOD OF MANUFACTURING A WIRING BOARD

CROSS REFERENCE TO RELATED APPLICATIONS

This application is a divisional of U.S. patent application Ser. No. 09/307,139 filed May 7, 1999 (pending).

BACKGROUND OF THE INVENTION

1. Field of the Invention

The present invention relates to a resin structure and method of manufacturing it. More particularly, the present invention relates to a resin structure in which manufacturing cost is cheap and sufficient adhesive strength can be obtained and method of manufacturing it.

2. Description of the Related Art

Recently, a wiring board in which wiring of a fine pattern is provided on the surface of resin substrate is essential for a precise electronic apparatus. As the material for the resin substrate, for example, there are a printed circuit board using epoxy resin, a flexible printed circuit board on which the wiring is formed on a soft flexible film. In such a circuit board and resin substrate, the weights thereof are light, the treatments are easy, and the formations of the fine patterns are also easy. Moreover, multiple-layer structure is possible, and further it is easy to make the wiring highly dense. Thus, the above-mentioned circuit board or resin substrate can be provided in all kinds of electronic apparatuses, as the substrate of forming the wiring.

Especially in recent years, an IC chip, an LSI chip, an MPU have been provided on the board and the film formed of the above-mentioned resin materials. Accordingly, the compact cheap product has been manufactured. In the above-mentioned product, a copper wiring is typically formed on the resin substrate with plating. Then, the copper wiring and a bump electrode of the IC chip are pressed and bonded to each other, or a bonding ground of the IC chip and a bonding ground on the resin substrate are bonded to each other with wire bonding. Accordingly, an electronic circuit device is formed on the wiring substrate, and the circuit board device is completed.

To make the circuit board device further reliable, or for the sake of other reasons, the IC chip, the LSI, the MPU and other various electronic parts which are placed on the wiring substrate are sealed with seal resin. Accordingly, the influence from external environment can be shielded, which enables the high reliability of the electronic circuit to be kept. Hyper-fineness is performed on the above-mentioned wiring so that a line width thereof is about several tens of microns and also a line pitch thereof is about several tens of microns. Thus, it becomes difficult to precisely form such a hyper-fine pattern on the resin substrate.

Traditionally, this kind of laminated film has been formed by bonding copper foil to resin. As this resin layer, there is polyamide or polyimide system film. The polyamide or polyimide system film is poor in adhesive property to the copper foil. Thus, the emphasis falls on the improvement of this poor adhesive property. Various adhesives are designed and invented to improve this adhesive property. For example, the mixture of ethylene system copolymer and polyamide resin is proposed. Moreover, a mixture of cyanic acid ester system resin and butadiene system resin and acrylic acid or methacrylic acid epoxy ester is proposed. Furthermore, there are additive reaction crosslinked type of silicon rubber and the like, as material in which epoxy modification nylon has both properties of flame resistance and chemical resistance.

The polyamide or polyimide has film formation property. Thus, it is difficult to bond the polyamide or polyimide to the copper foil directly and strongly. However, it has constant adhesive property. Thus, they are the resin materials very frequently used up to now. A method of forming the copper foil is referred to as a subtractive method.

A method of directly pressing and fitting a copper foil film into the surface of the resin substrate to pattern it, is performed on a non-fine pattern. However, the copper foil film can not be reduced to a sufficiently thin thickness. Moreover, the surface is not always flat. Thus, it is difficult to attain the line width of several tens of microns or the line pitch of several tens of microns.

There is another method of forming a thin film, instead of the method of forming the coil foil on the resin layer of the resin material. This is an additive method of using electroless plating, electrolytic plating or the like.

The additive method does not require the etching removal of a large amount of coil foil, as compared with the subtractive method. Moreover, in this method, the method of forming a circuit is simplified, and this is a non-polluting and resource saving type, and further the accuracy of a circuit pattern is excellent. Thus, in recent years, this has been used more and more in many cases. However, the additive method has a problem that the adhesive property between the plated circuit pattern and the printed circuit board is poor even as compared with the subtractive method. Hence, although the improvement in the above-mentioned problem is eagerly tried, a so-called photo forming method of using photo sensitive material for generating a plating core is prominent as a main inventive idea until now.

Moreover, a method of making the surface of a board rough is used overwhelmingly in many cases, as a method of improving the adhesive property between an electroless circuit pattern and the printed circuit board. In this case, adhesive is mainly coated on the surface of the board, and then the surface of the adhesive is made rough. That is, at first, this is a method of bonding to the board a plastic sheet whose surface is made rough. Secondly, diene system synthetic rubber adhesive is coated on aluminum foil on which rugged surface is formed by an alkaline zincification process, and then this coated foil and the printed circuit board are integrated with each other. Thirdly, after the integrated formation, this aluminum foil and the galvanized layer are removed to thereby form the rough surface.

In addition, there is a method of providing on a printed circuit board a coated layer having hollow holes. There is a method in which after diene system synthetic rubber system adhesive is coated on the printed circuit board, a part of the surface layer of the adhesive is cut away in a constant depth.

However, even if using the above-mentioned methods, it is very difficult to form a metal layer having the strongly adhesive force, especially the copper layer, on the so-called resin layer by the electroless plating. Moreover, since all the methods need the adhesive layer, a manufacturing cost becomes high. Thus, it is not always the that the above-mentioned methods are excellent.

There is a method of using a vacuum evaporating apparatus, a sputtering apparatus or the like, as a method in which a constantly adhesive force can be obtained between the resin layer and the metal layer. This is done through processes as shown in FIG. 1. As shown in FIG. 1, the resin substrate to form the resin layer of the laminated film is firstly prepared. Next, the metal layer serving as a base layer for planting is formed on the resin substrate by the sputtering operation, the evaporating operation or the like. Moreover, the electrolytic plating operation is performed with this metal layer as the base layer. Then, the metal layer is grown to a predetermined thickness. After that, a patterning operation, using resist and the like, is performed on the metal layer. Then, the wiring treatment is carried out with the etching operation and the like.

As another method, there is a method shown in FIG. 2. As shown in FIG. 2, at first, resin substrate is prepared, and then through-holes, via-holes and the like are formed in the resin substrate. The through-holes and the via-holes are formed with a drill. If the resin substrate is film-shaped, they are formed with a laser and the like. Next, the base layer for plating is formed with the sputtering operation or the evaporating operation, similarly to the method shown in FIG. 1. After that, the resist is used to generate a portion in which the electrolytic plating is selectively grown, namely, a portion serving as the wiring. After that, the electrolytic plating is performed, and then the resist and the base layer are removed to thereby complete the electronic circuit device in which the wiring is formed on the resin substrate.

However, in the methods shown in FIGS. 1 and 2, even if any of the sputtering operation and the evaporating operation is used to form the base layer for plating, it must be done in vacuum atmosphere. Thus, the vacuum apparatus and the like must be used although the adhesive layer and the like are not used differently from the above-mentioned methods. Hence, the facility investment becomes expensive. As a result, it is not the that this method is excellent.

By the way, a printed circuit board whose rigidity is relatively high is used in many cases, as the conventional such resin material. Especially in recent years, a multiple-layer board is used in many cases. Moreover, polyimide and the like are frequently used as a film-shaped board. Actually, other materials are limited to an extremely small number because of the problem of the adhesive strength between the material and the metal layer formed on the resin layer of the material.

As another method, a method shown in FIG. 3 is used especially in a case of a resin structure having a three-dimensional wiring. At first, catalyst that serves as the growth core for plating is mixed with resin to then form a first structure. After that, non-plated resin that does not have the growth core for plating is secondly formed, and then it is made rough, and further the electroless plating is selectively grown. However, this method also needs the process of mixing the growth core for plating with the resin and carrying out the second structure operation. The reason why the complex processes must be employed as mentioned above is that it is difficult to bond the electroless plating on the resin material under the sufficient strength.

At first, the conventional first method is as follows. When the metal layer is laminated and formed on the resin layer, the adhesive layer is used to make the surface of the adhesive layer rough to then perform the electroless plating on the rough surface of the adhesive layer. Or, the electroless plating is performed, and further the electrolytic plating is performed. In this first method, the adhesive layer must be separately formed on the resin layer, and also the surface of the adhesive layer must be made rough by using a predetermined treatment. This results in the confusingly manufacturing process and the expensive cost. Moreover, the reliability is not always high.

The second method uses the vacuum evaporating apparatus, the sputtering apparatus and the like, when forming the base layer for plating. According to this method, it is possible to form the metal layer on the resin layer under a certain adhesive strength. However, a large scale of facility, such as the vacuum apparatus and the like, must be used as mentioned above, which results in the problem that the manufacturing cost is high. In any of these methods, the adhesive strength between the resin layer and the metal layer is not always sufficient. Especially, the utilization of the fine pattern results in the problem that the stress occurring between the resin substrate and the wiring causes the wiring to be stripped from the surface of the resin substrate.

Moreover, as another method, especially in the case of the resin structure having the three-dimensional wiring, the growth core for plating is mixed with the resin, or the secondly structure operation is required. Thus, the confusion of the processes is similar to the other methods. The reason why the complex processes must be employed as mentioned above is that it is difficult to bond the electroless plating on the resin material under the sufficient strength.

SUMMARY OF THE INVENTION

The present invention has been made to solve the above-described problems of the conventional resin structure. An object of the present invention is to provide a resin structure to manufacture an electronic circuit device in which it can be bonded onto a resin layer by directly electroless plating and the mechanical strength is sufficiently high.

Another object is to provide the above-mentioned resin structure at a low cost.

In order to achieve an aspect of the present invention, a resin structure includes a resin layer formed of a single material, and a metal layer laminated directly on the resin layer without intervention of an adhesive layer between the resin layer and the metal layer, wherein a surface of the resin layer, on which the metal layer is laminated, has a surface roughness of a value in a range of 0.1 microns to 10 microns, as a rough surface, and wherein the metal layer is formed on the rough surface of the resin layer.

In this case, the resin structure is film-shaped.

Also in this case, the rough surface of the resin layer has a surface roughness of a value in a range of 1 microns to 5 microns.

Further in this case, the resin structure is film-shaped.

In this case, the single material is formed of one selected from a group consisting of polyimide, polyamideimide, polyetheretherketone,polyphenylene sulfide, liquid crystal polymer, fluorocarbon resin, polysulfone, polyethersulfone, polyamide 46, polyethylene naphthalate,polyebutylene terephthalate and aromatic polyester.

In order to achieve another aspect of the present invention, an electronic circuit device includes a resin substrate, and a wiring formed on the resin substrate, wherein a surface of the resin substrate, on which the wiring is formed, has a surface roughness of a value in a range of 1 micron to 5 microns.

In this case, the resin substrate is formed of one or more selected from a group consisting of polyimide, polyamideimide, polyetheretherketone,polyphenylene sulfide, liquid crystal polymer, fluorocarbon resin, polysulfone, polyethersulfone, polyamide 46, polyethylene naphthalate,polyebutylene terephthalate and aromatic polyester.

In order to achieve still another aspect of the present invention, an electronic circuit device includes a resin substrate, and a wiring formed on the resin substrate, wherein a surface of the resin substrate has a surface roughness of a value in a range of 0.1 microns to 10 microns, and wherein the electronic circuit device is used as an interposer.

In this case, the wiring contains an inductor.

In order to achieve yet still another aspect of the present invention, a build-up multiple-layer circuit board includes a core board having surfaces, and wirings and insulating layers which are sequentially laminated on one of the surfaces or both of the surfaces, wherein each of the insulating layers is formed of resin material, and a surface of each of the insulating layers has a surface roughness of a value in a range of 0.1 microns to 10 microns as a rough surface, and wherein a metal layer serving as each of the wirings is directly formed on the rough surface of each of the insulating layers.

In this case, the resin material is one selected from a group consisting of epoxy resin, polymethyl pentene, polyphenylene ether, aromatic polyamide, polyacetal, polyetheramide, polyethylene terephthalate,polybutylene naphthalate, liquid crystal polyester, polyarylate, polyimide, polyamideimide, polyetheretherketone,polyphenylene sulfide, liquid crystal polymer, fluorocarbon resin, polysulfone, polyethersulfone, polyamide 46, polyethylene naphthalate,polyebutylene terephthalate and aromatic polyester.

In order to achieve another aspect of the present invention, a wiring board device includes a resin substrate, an electronic circuit being formed on a surface of the resin substrate, and a seal resin which is directly contact with the resin substrate to seal the electronic circuit of the resin substrate, wherein a surface of the resin substrate, which is directly contact with the seal resin is made rough.

In order to achieve still another aspect of the present invention, a method of manufacturing a resin structure includes providing a resin formed of a single material, making a surface of the resin rough such that a surface roughness of the surface is a value in a range of 0.1 microns to 10 microns, and forming a metal layer directly on the rough surface of the resin with an electroless plating without intervention of an adhesive layer between the metal layer and the rough surface of the resin to manufacture the resin structure.

In this case, the resin structure is film-shaped.

Also in this case, the making a surface of the resin rough includes making a surface of the resin rough such that the rough surface has a surface roughness of a value in a range of 1 micron to 5 microns.

Further in this case, the making a surface of the resin rough includes making a surface of the resin rough by sandblastinging.

In this case, the making a surface of the resin rough includes making a surface of the resin rough by wet blastinging.

Also in this case, the single material is one selected from a group consisting of polyimide, polyamideimide, polyetheretherketone,polyphenylene sulfide, liquid crystal polymer, fluorocarbon resin, polysulfone, polyethersulfone, polyamide 46, polyethylene naphthalate,polyebutylene terephthalate and aromatic polyester.

Further in this case, a medium using in the wet blastinging is a polygonal particle in which a central particle diameter is in a range of 10 microns to 300 microns, and a hardness is in a range of 1300 to 2500 in Knoop hardness or in a range of 7 to 15 in Mohs scale.

In order to achieve yet still another aspect of the present invention, a method of manufacturing a resin structure includes providing a resin formed of a single material, making a surface of the resin rough such that a surface roughness of the surface is a value in a range of 0.1 microns to 10 microns, forming a conductive layer directly on the rough surface of the resin with an electroless plating, and forming a metal layer having a predetermined thickness by performing an electrolytic plating to the conductive layer as a base layer.

In this case, the conductive layer substantially consists of copper.

In order to achieve another aspect of the present invention, a method of manufacturing an electronic circuit device, includes providing a resin substrate, making a surface of the resin substrate rough with a sandblastinging such that a surface roughness of the resin substrate is in a range of 0.1 microns to 10 microns, and forming a conductive member serving as a wiring on the rough surface of the resin substrate by performing an electroless plating.

In order to achieve still another aspect of the present invention, a method of manufacturing an electronic circuit device includes providing a resin substrate, making a surface of the resin substrate rough with a sandblastinging such that a surface roughness of the resin substrate is in a range of 0.1 microns to 10 microns, forming a conductive member on the rough surface of the resin substrate by performing an electroless plating, and forming a wiring by performing an electrolytic plating to the conductive member as a base layer.

In order to achieve yet still another aspect of the present invention, a method of manufacturing an electronic circuit device, includes providing a resin substrate, forming a through-hole and/or a via-hole in the resin substrate, and making a surface of the resin substrate and an inner surface of the through-hole and/or the via-hole rough by sandblastinging such that a surface roughness of the surface of the resin substrate and the inner surface of the through-hole and/or the via-hole is in a range of 0.1 microns to 10 microns.

In this case, a method of manufacturing an electronic circuit device further includes forming a conductive member on the rough surface of the resin substrate and the rough inner surface of the through-hole and/or the via-hole by performing electroless plating, and forming a wiring by performing electrolytic plating to the conductive member as a base layer.

Also in this case, the conductive member substantially consists of copper.

In order to achieve yet still another aspect of the present invention, a method of manufacturing a build-up multiple-layer circuit board, includes providing a core board, providing an insulating layer formed of resin material, making a surface of the insulating layer rough such that a surface roughness of the surface of the insulating layer is in a range of 0.1 microns to 10 microns, forming a metal layer directly on the rough surface of the insulating layer with an electroless plating, and laminating the insulating layer on which the metal layer is formed, on the core board.

In order to achieve another aspect of the present invention, a method of manufacturing a build-up multiple-layer circuit board, includes providing a core board, providing an insulating layer formed of resin material, making a surface of the insulating layer rough such that a surface roughness of the surface of the insulating layer is in a range of 0.1 microns to 10 microns, laminating the insulating layer on the core board such that the rough surface of the insulating layer is exposed, and forming a metal layer directly on the rough surface of the laminated insulating layer with an electroless plating.

In order to achieve still another aspect of the present invention, a method of manufacturing a build-up multiple-layer circuit board according to Claim 27, wherein the laminating the insulating layer includes laminating the insulating layer on the core board by heating and compressing the insulating layer with a thermal roll.

In order to achieve yet still another aspect of the present invention, a method of manufacturing a build-up multiple-layer circuit board, includes providing a core board, providing an insulating layer formed of resin material, forming a via-hole and/or a through-hole in the insulating layer, making an inner surface of the via-hole and/or the through-hole rough such that a surface roughness of the inner surface is in a range of 0.1 microns to 10 microns, laminating the insulating layer on the core board, and forming a metal layer on the rough inner surface of the via-hole and/or the through-hole.

In order to achieve another aspect of the present invention, wherein the resin material is one selected from a group consisting of epoxy resin, polymethyl pentene, polyphenylene ether, aromatic polyamide, polyacetal, polyetheramide, polyethylene terephthalate,polyebutylene naphthalate, liquid crystal polyester, polyarylate, polyimide, polyamideimide, polyetheretherketone,polyphenylene sulfide, liquid crystal polymer, fluorocarbon resin, polysulfone, polyethersulfone, polyamide 46, polyethylene naphthalate,polyebutylene terephthalate and aromatic polyester.

In order to achieve still another aspect of the present invention, a method of manufacturing a build-up multiple-layer circuit board, includes providing a core board, providing an insulating layer formed of resin material, making a surface of the insulating layer rough such that a surface roughness of the surface of the insulating layer is in a range of 0.1 microns to 10 microns, forming a conductive layer directly on the rough surface of the insulating layer with an electroless plating, and forming a metal layer having a predetermined thickness by performing an electrolytic plating to the conductive layer as a base layer.

In order to achieve yet still another aspect of the present invention, a method of manufacturing a wiring board, includes providing a resin substrate, performing wet blastinging on a surface of the resin substrate such that a surface roughness of the surface of the resin substrate ranges from 0.1 microns to 10 micron, and forming a conductive layer by performing an electroless plating with non-formalin reducing plating solution on the rough resin substrate.

In this case, the performing wet blastinging includes performing wet blastinging selectively on a part of a surface of the resin substrate.

Also in this case, the non-formalin reducing plating solution is one selected from a group consisting of hypophosphite, hydrazine, boron hydride compound, amino-borane compound and glucose.

Further in this case, the non-formalin reducing plating solution is a mixture of an A solution and a B solution, and the A solution contains a 25% aqueous ammonia of 14 to 16 weight %, a copper sulfate of 3 to 5 weight %, an amino compound of 7 to 9 weight % and an ion exchange water as the remainder, and the B solution contains a dimethylamine borane of 4 to 6 weight % and an ion exchange water as the remainder.

In this case, a method of manufacturing a wiring board further includes forming a wiring layer on the conductive layer with an electrolytic plating.

Also in this case, the resin substrate has a heat resistance equal to or higher than 150° C. and is formed of one selected from a group consisting of polyimide, liquid crystal polymer, aromatic polyester, liquid crystal polyester, polyethylene, polyethylene terephthalate, polyebutylene terephthalate, teflon and fluorine system resin.

Further in this case, a method of manufacturing a wiring board further includes forming a through-hole and/or a via-hole in the resin substrate, and wherein the performing wet blastinging includes performing wet blastinging on an inner surface of the through-hole and/or the via-hole in addition to the surface of the resin substrate, and wherein the forming a conductive layer includes forming a conductive layer on the rough inner surface in addition to the rough resin substrate.

In order to achieve another aspect of the present invention, a method of manufacturing a wiring board, includes providing a resin substrate, performing wet blastinging on a surface of the resin substrate such that a surface roughness of the surface of the resin substrate ranges between from 0.1 microns and 10 micron, performing a catalytic activation on the rough resin substrate by using hydroxy carboxylic acid salt or inorganic metallic salt of copper family elements, platinum group elements and iron family elements, and performing an electroless plating on the resin substrate after the catalytic activation, with one selected from a group consisting of hypophosphite, hydrazine, boron hydride compound, amino-borane compound and glucose as a reducing plating solution to form a conductive layer.

In this case, a method of manufacturing a wiring board further includes performing an electrolytic plating on the formed conductive layer to form a wiring layer.

In order to achieve still another aspect of the present invention, a method of manufacturing a wiring board, includes providing a resin substrate, making a surface of the resin substrate rough with wet blastinging, making the rough surface of the resin substrate conductive by using a palladium catalyst, and performing an electrolytic plating on the conductive surface of the resin substrate.

In this case, the making the rough surface conductive includes making the rough surface conductive by using a metal palladium-tin mixture.

Also in this case, the providing a resin substrate includes providing a resin substrate formed of one selected from a group consisting of polyimide, polyamideimide, polyetheretherketone, polyphenylene sulfide, liquid crystal polymer, fluorocarbon resin, polysulfone, polyethersulfone, polyamide 46, polyethylene naphthalate, polyebutylene terephthalate and aromatic polyester.

In order to achieve yet still another aspect of the present invention, a method of manufacturing a wiring board, includes providing a resin substrate, forming a penetration hole in the resin substrate, making a surface of the resin substrate and an inner surface of the penetration hole rough, and performing a plating on the rough surface of the resin substrate and the rough inner surface of the penetration hole.

In this case, the making a surface of the resin substrate and an inner surface of the penetration hole rough includes making a surface of the resin substrate and an inner surface of the penetration hole rough, while removing a smear generated when the penetration hole is formed.

In order to achieve another aspect of the present invention, a method of manufacturing a wiring board, includes providing a resin substrate, forming a conductive layer on a bottom surface portion of the resin substrate, forming a hole which penetrates the resin substrate and does not penetrate the conductive layer, making a surface of the resin substrate and an inner surface of the hole rough, while removing a smear existing on the conductive layer corresponding to a bottom portion of the hole, and inside the hole, and performing a plating on the rough surface of the resin substrate and the rough inner surface of the hole.

In this case, the making a surface of the resin substrate and an inner surface of the penetration hole rough includes making a surface of the resin substrate and an inner surface of the penetration hole rough by using one of dry blasting and wet blastinging.

Also in this case, the making a surface of the resin substrate and an inner surface of the penetration hole rough includes making a surface of the resin substrate and an inner surface of the penetration hole rough such that a surface roughness of the surface of the resin substrate and the inner surface of the penetration hole is in a range of 0.1 microns to 10 microns.

In order to achieve still another aspect of the present invention, a method of manufacturing a wiring board, includes providing a resin substrate, making a surface of the resin substrate rough with one of dry blasting and wet blastinging, forming an electronic circuit on the rough surface of the resin substrate, and sealing with seal resin the rough surface on which the electronic circuit is formed.

In order to achieve yet still another aspect of the present invention, a method of manufacturing a wiring board, includes providing a resin substrate, making a surface of the resin substrate rough with one of dry blasting and wet blastinging, forming a wiring on the rough surface of the resin substrate, connecting electronic parts with the wiring by one of a flip-chip method and a wire bonding method to form an electronic circuit, and sealing with seal resin the rough surface on which the electronic circuit is formed.

BRIEF DESCRIPTION OF THE DRAWINGS

A more complete understanding of the teachings of the present invention may be acquired by referring to the accompanying figures, in which like reference numbers indicate like features and wherein:

FIG. 3 is a view showing a manufacturing process in a conventional still another wiring treating method;

FIG. 15A is a view showing a manufacturing process of a variation in the fourth embodiment;

FIG. 15B is a view showing a manufacturing process of a variation in the fourth embodiment;

FIG. 15C is a view showing a manufacturing process of a variation in the fourth embodiment;

FIG. 15D is a view showing a manufacturing process of a variation in the fourth embodiment;

FIG. 15E is a view showing a manufacturing process of a variation in the fourth embodiment;

FIG. 15F is a view showing a manufacturing process of a variation in the fourth embodiment;

FIG. 15G is a view showing a manufacturing process of a variation in the fourth embodiment;

FIG. 15H is a view showing a manufacturing process of a variation in the fourth embodiment;

FIG. 15I is a view showing a manufacturing process of a variation in the fourth;

FIG. 15J is a view showing a manufacturing process of a variation in the fourth embodiment;

FIG. 15K is a view showing a manufacturing process of a variation in the fourth embodiment;

FIG. 24 is a view showing the optimal condition of a medium of wet blasting in an eighth embodiment of the present invention;

FIG. 25A is a view showing a manufacturing process of a ninth embodiment in the present invention;

FIG. 25B is a view showing a manufacturing process of the ninth embodiment in the present invention;

FIG. 25C is a view showing a manufacturing process of the ninth embodiment in the present invention;

FIG. 25D is a view showing a manufacturing process of the ninth embodiment in the present invention;

FIG. 25E is a view showing a manufacturing process of the ninth embodiment in the present invention;

FIG. 25F is a view showing a manufacturing process of the ninth embodiment in the present invention;

FIG. 25G is a view showing a manufacturing process of the ninth embodiment in the present invention;

FIG. 25H is a view showing a manufacturing process of the ninth embodiment in the present invention;

FIG. 25I is a view showing a manufacturing process of the ninth embodiment in the present invention;

FIG. 25J is a view showing a manufacturing process of the ninth embodiment in the present invention;

FIG. 25K is a view showing a manufacturing process of the ninth embodiment in the present invention;

FIG. 33A is a view showing a manufacturing process of a fifteenth embodiment in the present invention;

FIG. 33B is a view showing a manufacturing process of a fifteenth embodiment in the present invention;

FIG. 33C is a view showing a manufacturing process of a fifteenth embodiment in the present invention;

FIG. 33D is a view showing a manufacturing process of a fifteenth embodiment in the present invention;

FIG. 33E is a view showing a manufacturing process of a fifteenth embodiment in the present invention;

FIG. 51 is a view showing a manufacturing process of the twenty-third embodiment;

FIG. 52A is a view showing a plating process of the twenty-third embodiment;

FIG. 52B is a view showing a plating process of the twenty-third embodiment;

FIG. 52C is a view showing a plating process of the twenty-third embodiment;

FIG. 52D is a view showing a plating process of the twenty-third embodiment;

FIG. 52E is an enlarged view of part of FIG. 52B.

FIG. 52F is an enlarged view of part of FIG. 52C.

FIG. 52G is an enlarged view of part of FIG. 52D.

FIG. 53A is a view showing an example in which the wet blasting process is not performed on the twenty-third embodiment;

FIG. 53B is a view showing an example in which the wet blasting process is not performed on the twenty-third embodiment;

FIG. 53C is a view showing an example in which the wet blasting process is not performed on the twenty-third embodiment;

FIG. 53D is an enlarged view of part of FIG. 53A.

FIG. 53E is an enlarged view of part of FIG. 53B.

Figure 53A:
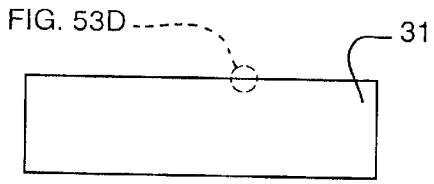
Figure 53B:
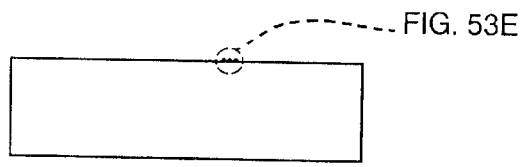
Figure 53C:
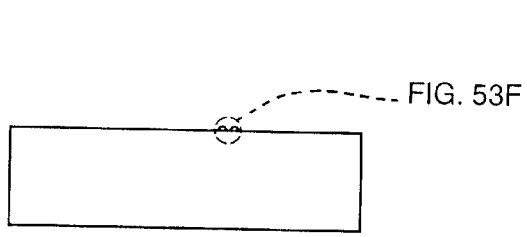
Figure 53D:
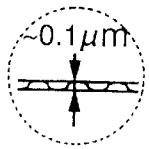
Figure 53E:
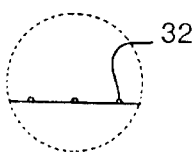
Figure 53F:
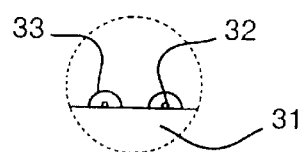

FIG. 53F is an enlarged view of part of FIG. 53C.

Figure 54:
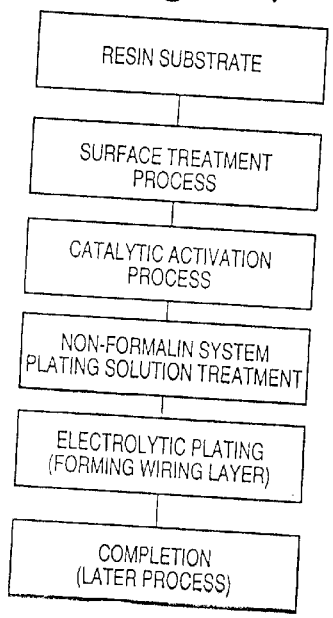
Figure 56A:
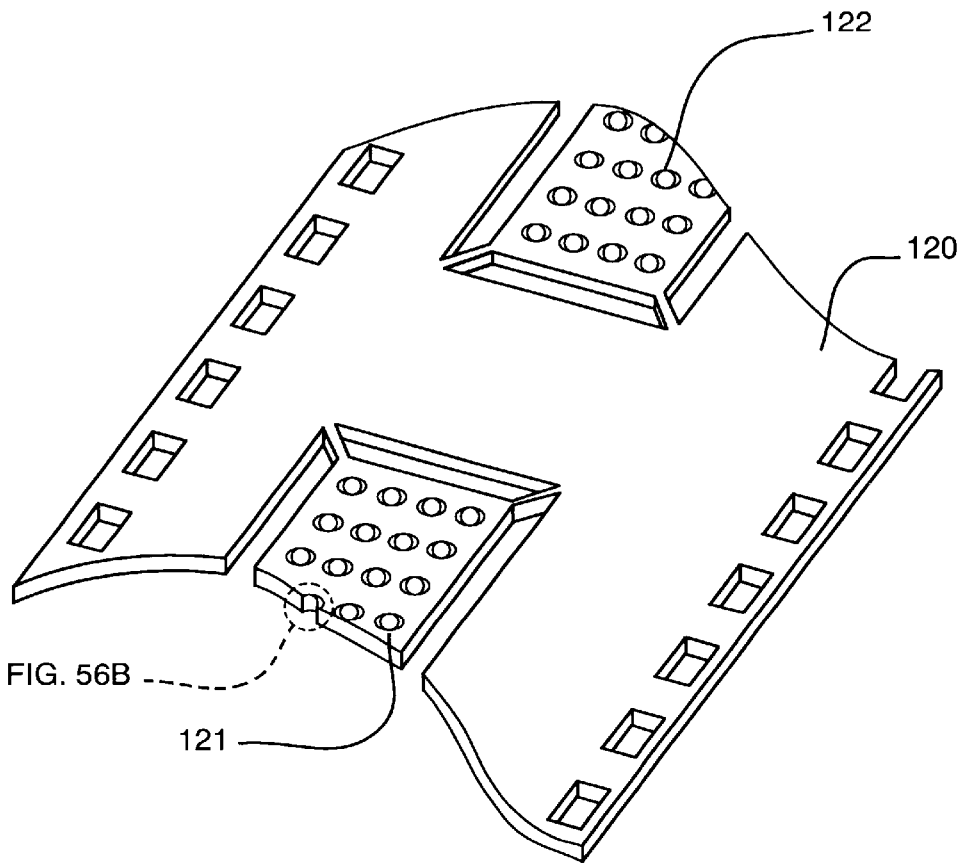
Figure 56B:
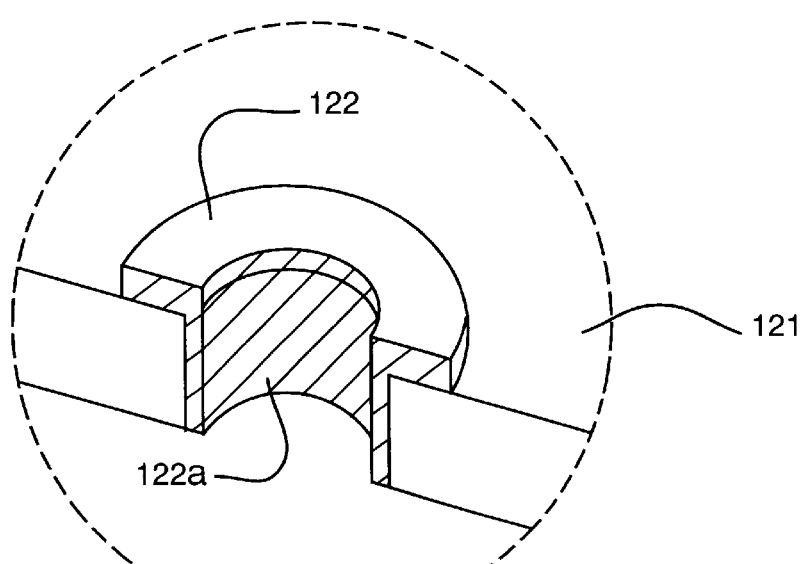
Figure 57:
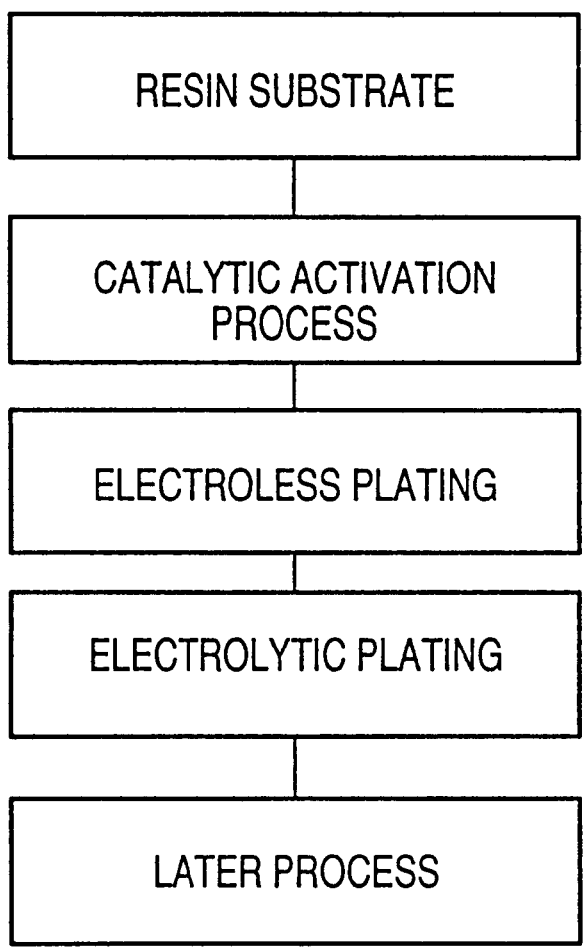
Figure 58:
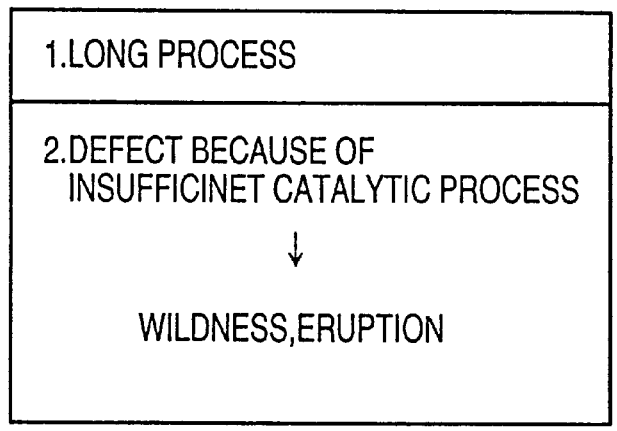
Figure 59:
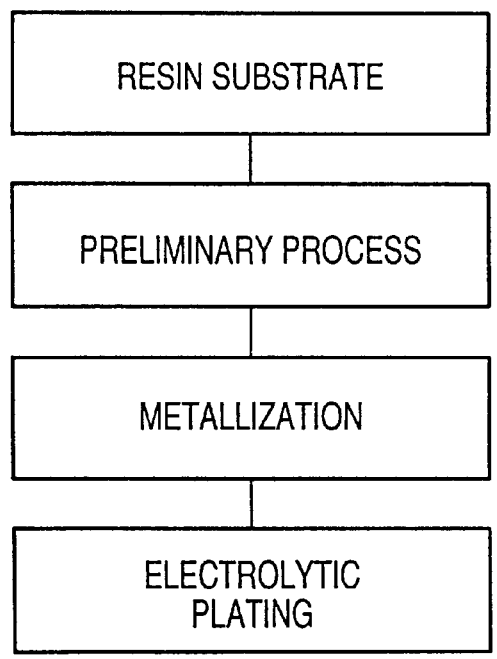
Figure 60:
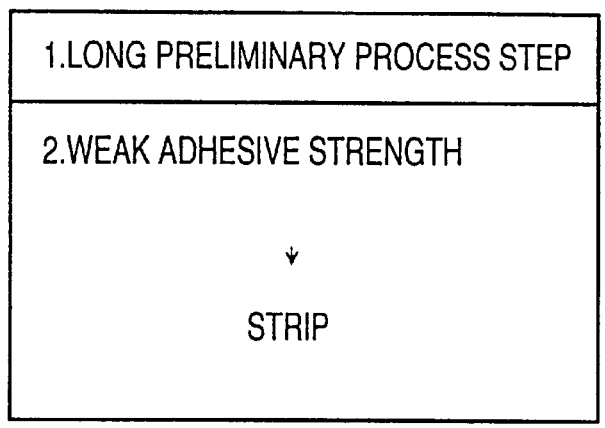
Figure 61:
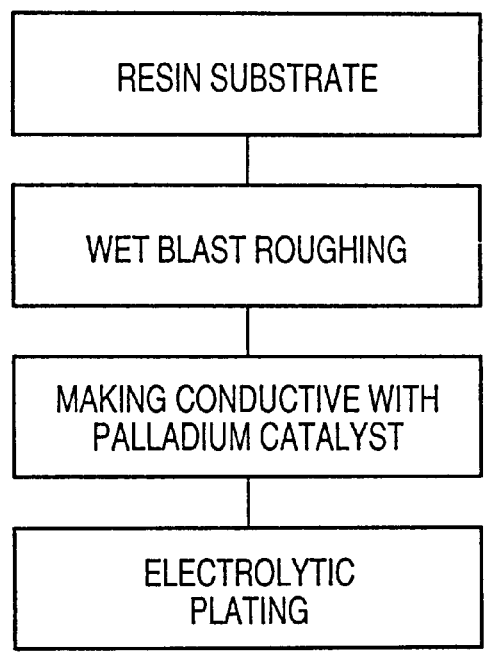
Figure 65A:
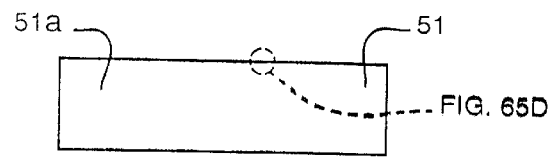
Figure 65B:
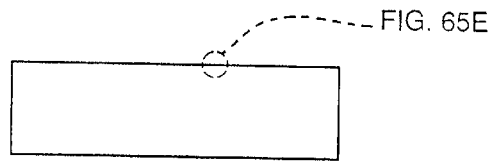
Figure 65C:
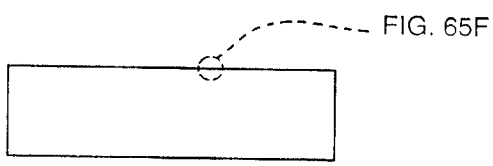
Figure 64A:
Figure 64B:
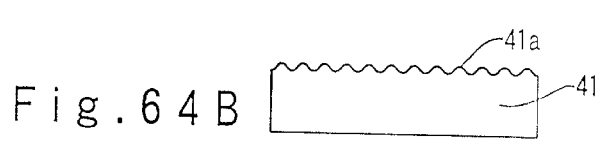
Figure 65D:
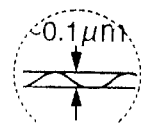
Figure 64C:
Figure 64D:

FIG. 54 is a view showing a manufacturing process of a twenty-sixth embodiment in the present invention;

FIG. 55 is a view showing a relation between heat resistance and reactivity of resin material in a twenty-seventh embodiment in the present invention;

FIG. 56 is a view showing a twenty-eighth embodiment in the present invention;

FIG. 57 is a view of a manufacturing process of background technique of a thirty-first embodiment in the present invention;

FIG. 58 is a view showing a problem in electroless plating with regard to the background technique of the thirty-first embodiment;

FIG. 59 is a view showing an example of a manufacturing process to solve the problem in FIG. 58, with regard to the background technique in the thirty-first embodiment;

FIG. 60 is a view showing a problem in the manufacturing process in FIG. 59;

FIG. 61 is a view showing the manufacturing process of the thirty-first embodiment;

FIG. 62 is a view showing material to make a film conductive in the thirty-first embodiment;

FIG. 63 is a view showing an electric resistance of a film that is made conductive in the thirty-first embodiment;

FIG. 64A is a view showing a treating process with catalyst in the thirty-first embodiment;

FIG. 64B is a view showing a treating process with catalyst in the thirty-first embodiment;

FIG. 64C is a view showing a treating process with catalyst in the thirty-first embodiment;

FIG. 64D is a view showing a treating process with catalyst in the thirty-first embodiment;

FIG. 65A is a view showing a conventional process, in comparison with FIGS. 64A to 64D;

FIG. 65B is a view showing a conventional process, in comparison with FIGS. 64A to 64D;

FIG. 65C is a view showing a conventional process, in comparison with FIGS. 64A to 64D;

FIG. 65D is an enlarged view of part of FIG. 65A.

Figure 65E:
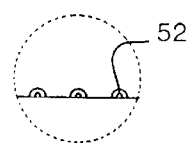

FIG. 65E is an enlarged view of part of FIG. 65B.

Figure 65F:
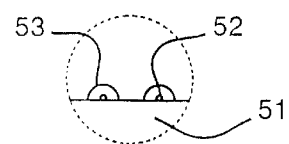

FIG. 65F is an enlarged view of part of FIG. 65C.

Figure 66A:
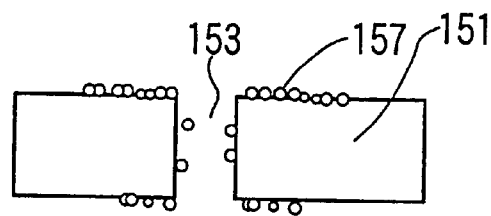
Figure 66B:
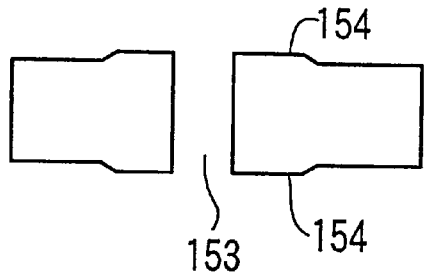
Figure 67A:
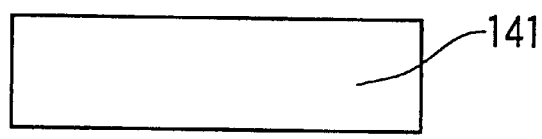
Figure 67B:
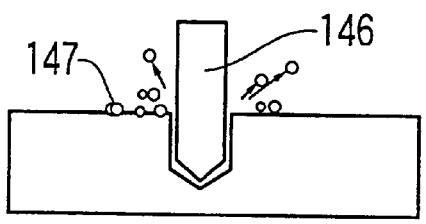
Figure 67C:
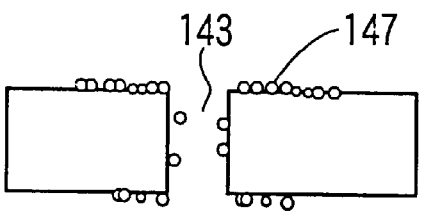
Figure 67D:
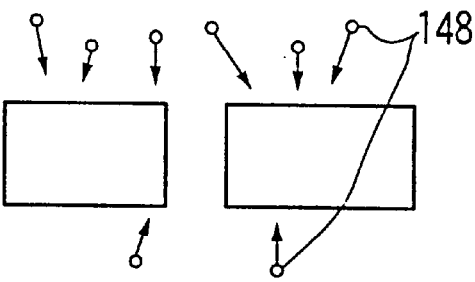
Figure 68A:
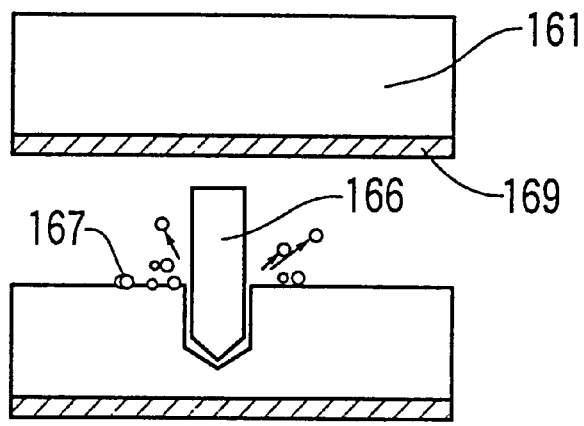
Figure 68B:
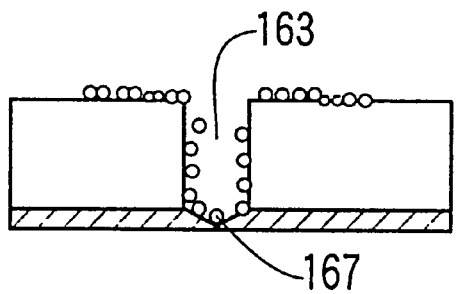
Figure 68C:
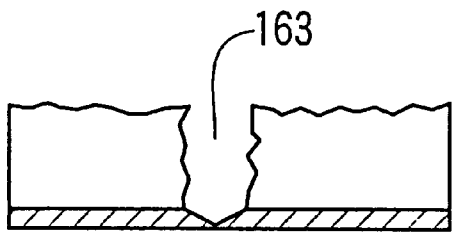
Figure 69A:
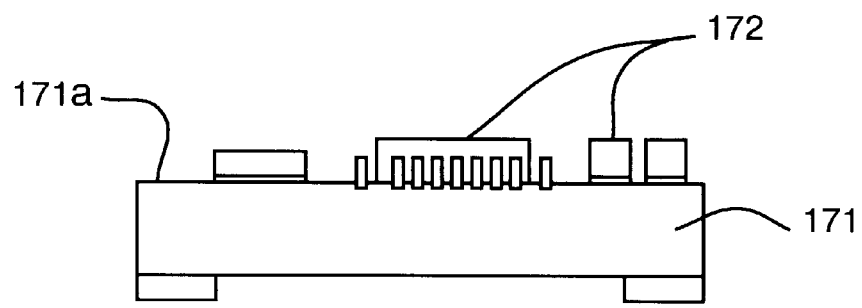
Figure 69B:
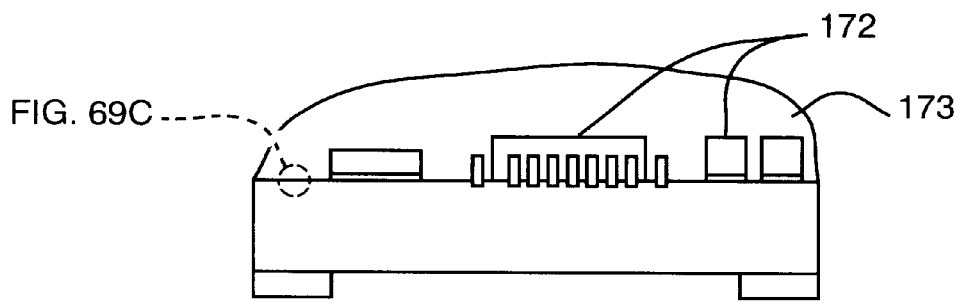
Figure 69C:
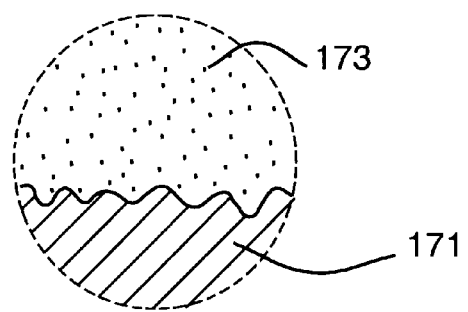

FIG. 66A is a view showing a problem in a thirty-fifth embodiment in the present invention;

FIG. 66B is a view showing a problem in the thirty-fifth embodiment in the present invention;

FIG. 67A is a view showing a manufacturing process in the thirty-fifth embodiment;

FIG. 67B is a view showing a manufacturing process in the thirty-fifth embodiment;

FIG. 67C is a view showing a manufacturing process in the thirty-fifth embodiment;

FIG. 67D is a view showing a manufacturing process in the thirty-fifth embodiment;

FIG. 68A is a view showing a manufacturing process of a thirty-sixth embodiment in the present invention;

FIG. 68B is a view showing a manufacturing process of a thirty-sixth embodiment in the present invention;

FIG. 68C is a view showing a manufacturing process of a thirty-sixth embodiment in the present invention;

FIG. 68D is a view showing a manufacturing process of a thirty-sixth embodiment in the present invention;

FIG. 69A is a view showing a thirty-ninth embodiment in the present invention;

FIG. 69B is a view showing a thirty-ninth embodiment in the present invention;

FIG. 69C is an enlarged view of part of FIG. 69B.

Figure 70A:
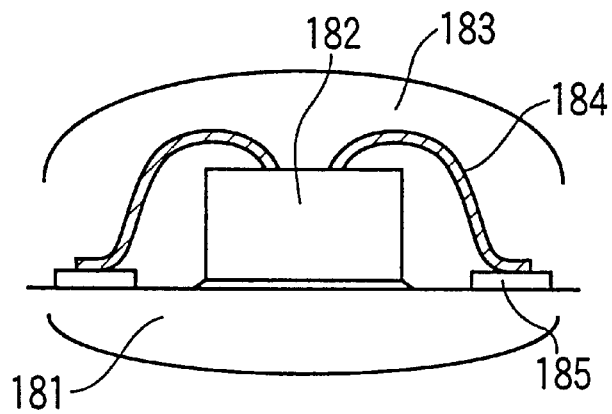
Figure 70B:
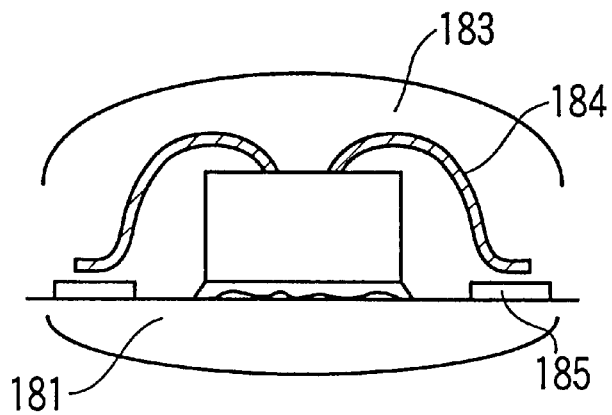
Figure 70C:
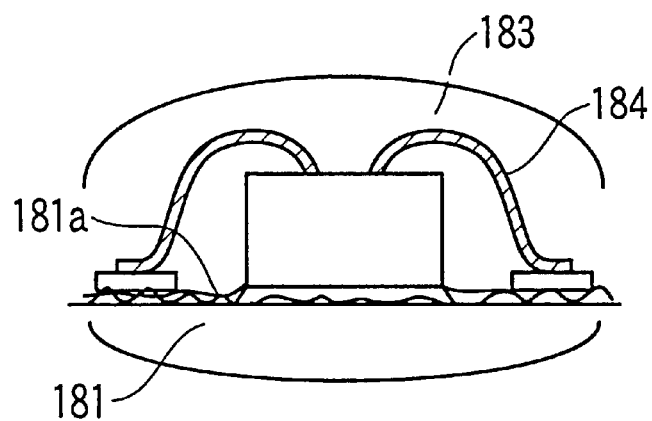

FIG. 70A is a view showing a problem in a fortieth embodiment in the present invention;

FIG. 70B is a view showing a problem in a fortieth embodiment in the present invention;

FIG. 70C is a section view showing the fortieth embodiment, and

FIG. 71 is a table showing the comparison result in which the dry blasting or the wet blasting is the optimal method in the tenth embodiment.

DESCRIPTION OF THE PREFERRED EMBODIMENTS

Referring now to drawings, various preferred embodiments according to the present invention will be described in detail. Embodiments of the present invention will be described below with reference to the attached drawings.

Embodiments of the present invention will be described below with reference to the attached drawings.

At first, a first embodiment is a resin structure which has a resin layer formed of a single material and a metal layer laminated directly on the resin layer without the intervention of an adhesive layer. In the above-mentioned resin structure, the surface of the resin layer on which the metal layer is laminated, a surface roughness thereof is rough to a value between 0.1 and 10 microns, and the metal layer is formed on the rough surface of the resin layer.

In the first embodiment, the reason why the resin layer is formed of the single material is that the adhesive layers are not separately intervened on the resin layer as in the conventional case. The metal layer implies that it contains a wiring pattern forming an electronic circuit in an electronic circuit device. The metal layer is typically formed of copper. However, the copper is the metal material optimal for this embodiment, from the viewpoint that the adhesive strength of the plating to such resin material is especially low. Moreover, the copper is the most excellent material for the metal layer of such resin structure, from the viewpoint that the cost of the copper is relatively low and an electrical conductivity thereof is high.

However, the metal layer in the first embodiment is not limited to the copper. Of course, any material can be used if the utilization of the material enables the wiring to be formed on the electronic circuit device and the like. The direct lamination implies that the resin layer and the metal layer are bonded to each other without the intervention of another adhesive layer between both the layers.

The metal layer can be directly laminated on the resin layer. The adhesive layer and the like are not required between both the layers. Thus, it is possible to omit a process of forming the adhesive layer and thereby save the material costs thereof. The surface roughness of the resin layer surface itself is made rough to the value between 0.1 and 10 microns. Hence, the adhesive strength between the resin layer and the metal layer is made further stronger, as compared with the case of using the vacuum evaporating apparatus, the sputtering apparatus and the like.

Figure 1:
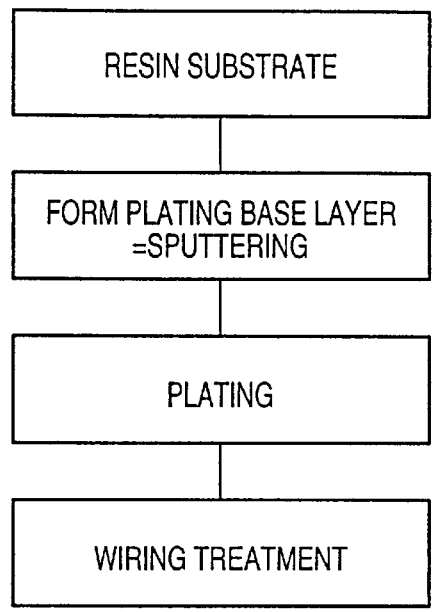
FIG. 1 is a view showing a manufacturing process in a conventional wiring treating method.
Figure 2:
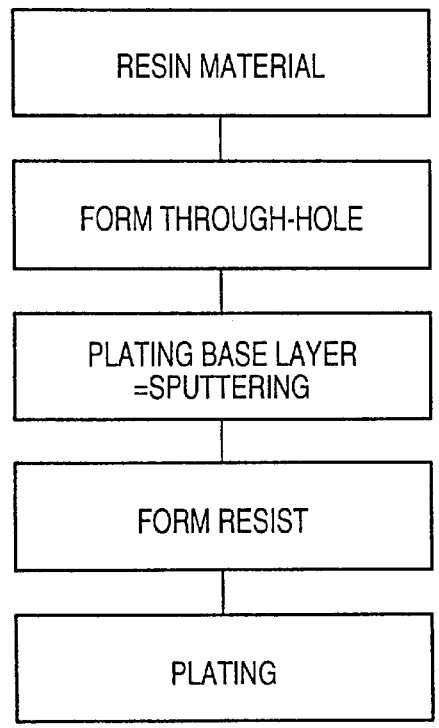
FIG. 2 is a view showing a manufacturing process in a conventional another wiring treating method.
Figure 4A:
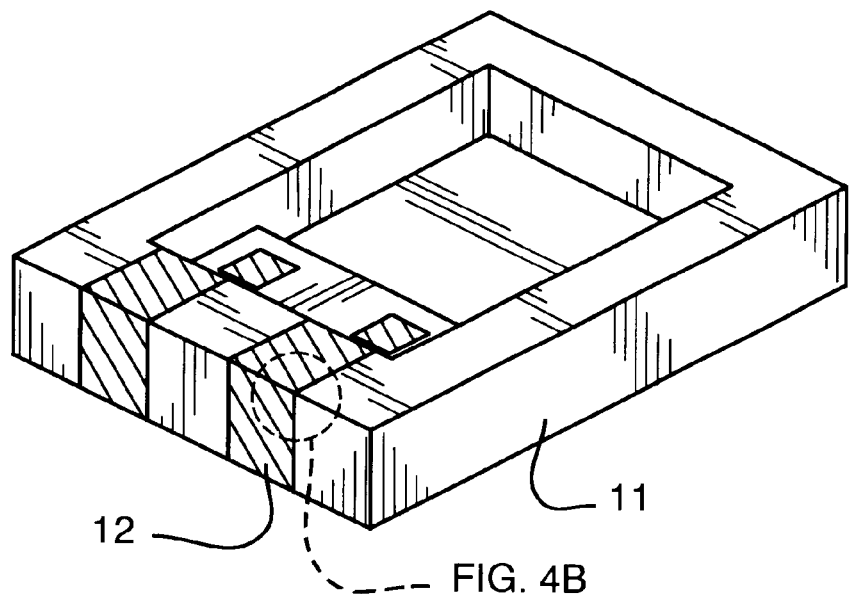
FIG. 4A is a perspective view showing a first embodiment of the present invention.
Figure 4B:
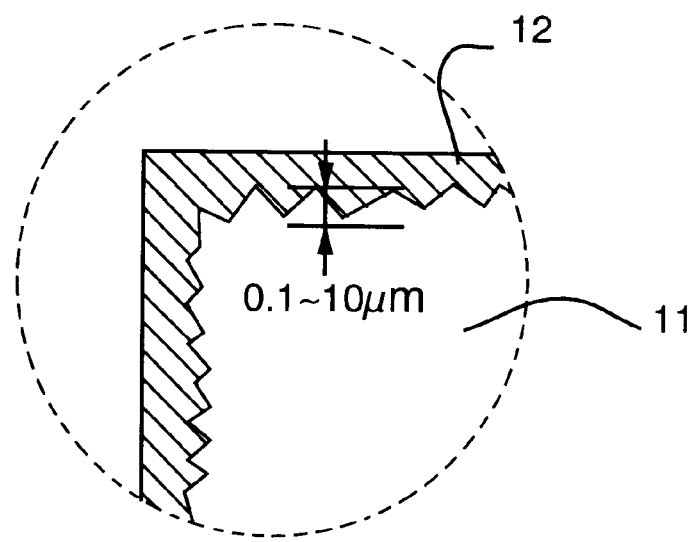
FIG. 4B is an enlarged section view showing a part of FIG. 4A.

A metal layer 12 is formed on a resin layer 11, as shown in FIGS. 4A and 4B. This surface of the resin layer 11 has a surface roughness between 0.1 and 10 microns. The reason why the surface roughness is set to 0.1 microns or more as mentioned above is that if the surface roughness is less than 0.1 microns, it is not possible to always obtain the sufficient adhesive strength to the metal layer 12. If the surface roughness is larger than 10 microns, the disconnection of the wiring is incurred on the metal layer 12 formed on the resin layer 11, since the pattern of the wiring is made hyperfine in recent years.

Thus, if the surface is made rough to have the surface roughness of the value between about 0.1 and 10 microns, the adhesive strength between the resin layer 11 and the metal layer 12 can be made extremely strong. Incidentally, FIGS. 4A and 4B show the case in which the metal layer 12 is put on a top side surface of the resin layer 11. However, the first embodiment is not always limited to this embodiment. It includes a case in which the metal layers are formed on both the surfaces of the resin layer. The portion on the resin layer is included in a concept that it implies not only the upper portion of the drawings, but also the lower portion of the drawings.

The first embodiment is not limited to the application to the resin structure only provided with the resin layer and the metal layer. There may be a plurality of resin layers, metal layers and other various layers.

Figure 5A:
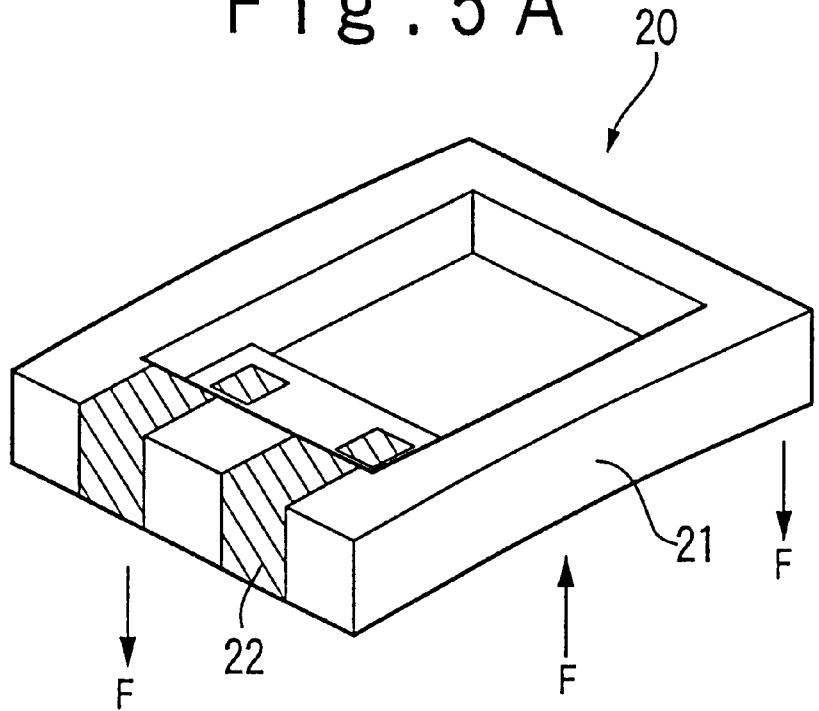
FIG. 5A is a view explaining the effect of the first embodiment.
Figure 5B:
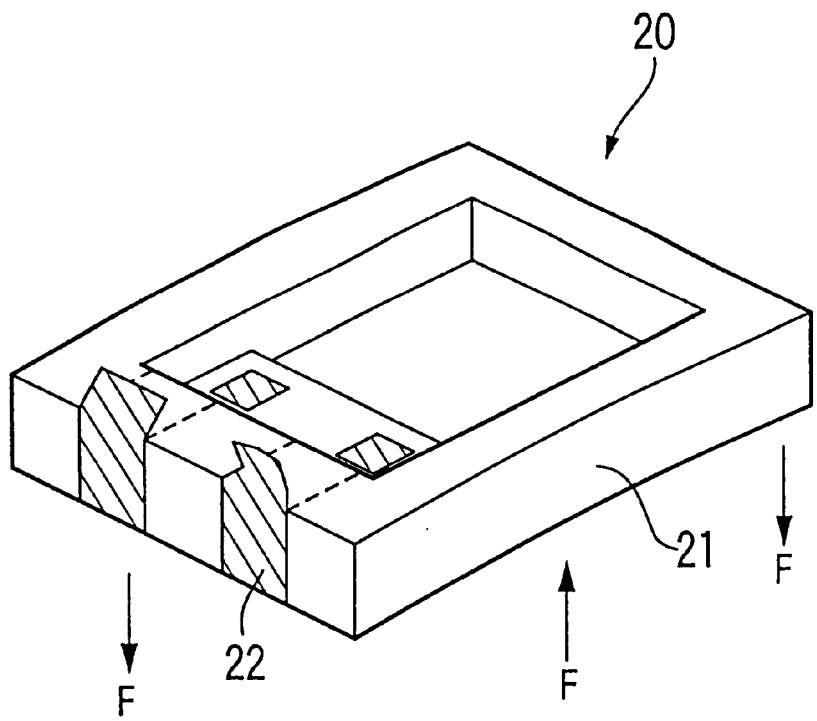
FIG. 5B is a view explaining the effect of the first embodiment together with FIG. 5A.

FIGS. 5A and 5B are views showing the effect of the first embodiment. FIG. 5B is a view showing the situation that a metal layer 22 is formed on a resin film 21 by using the conventional method, for example, the sputtering method, the evaporating method or the like, and then an outer force F is applied to the resin film, and accordingly it is curved, and further a part thereof is stripped. FIG. 5A is a view showing the situation that even if a resin structure 20 in the first embodiment is curved similarly to the situation of FIG. 5B, the metal layer 22 is not stripped.

Figure 6A:
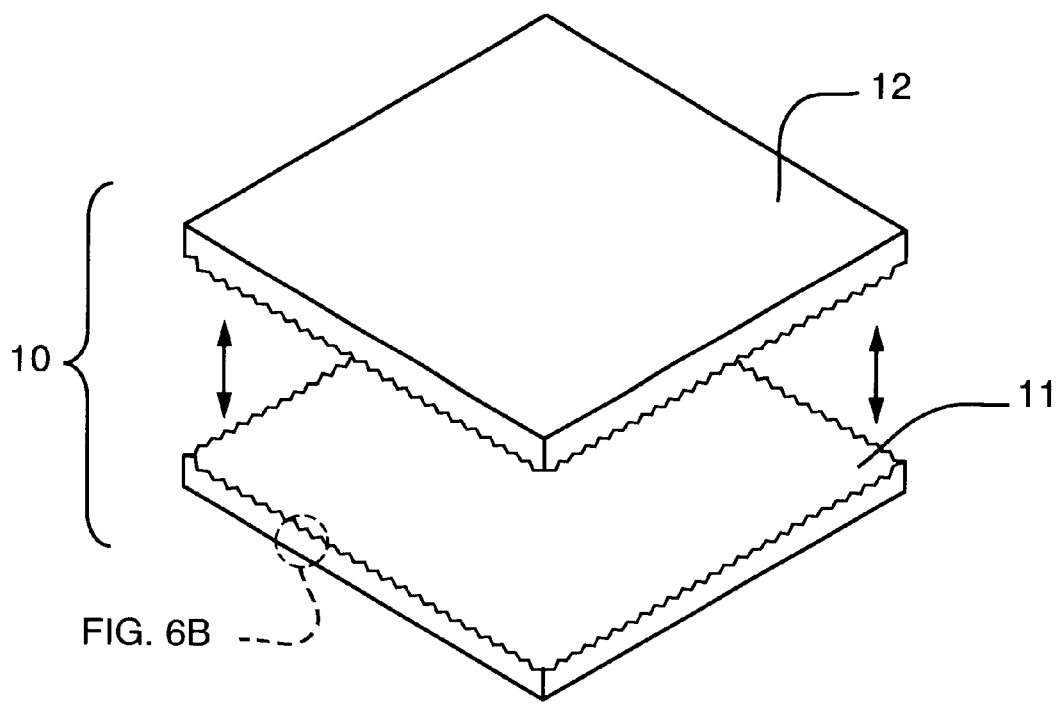
FIG. 6 is a view showing a variation of the first embodiment.
Figure 6B:
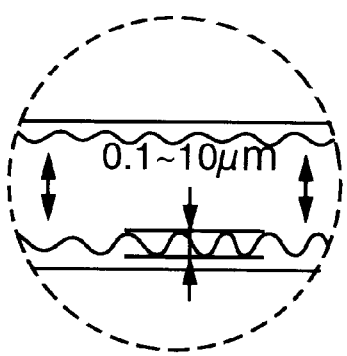

The resin structure in the first embodiment may be a film-shaped lamination film, as shown in FIG. 6. As shown in FIG. 6, a metal layer 12 is formed on a resin layer 11. This surface of the resin layer 11 has a surface roughness between 0.1 and 10 microns.

Figure 7A:
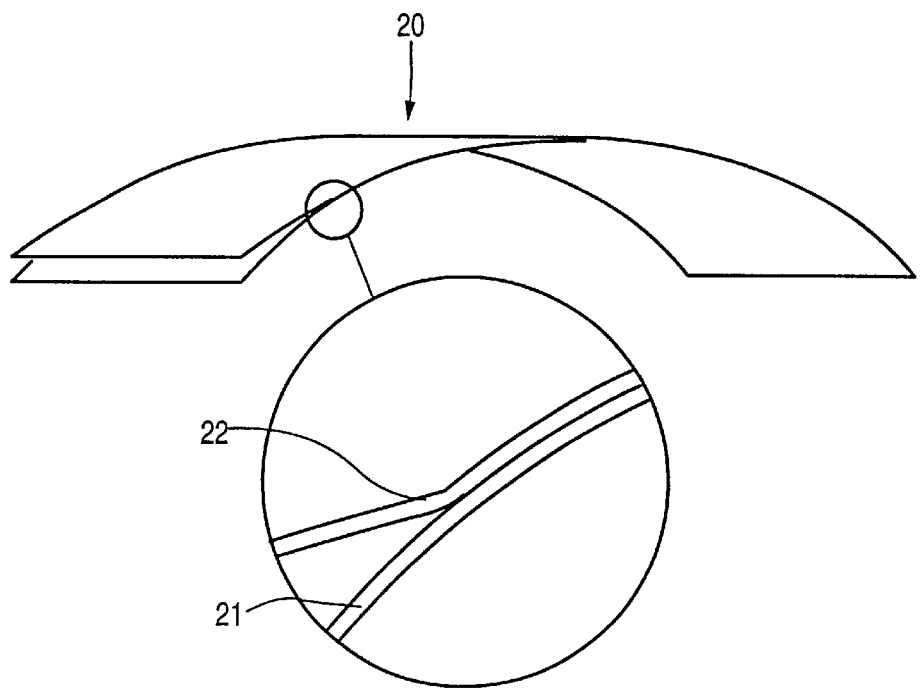
FIG. 7A is a view explaining the effect of the first embodiment.
Figure 7B:
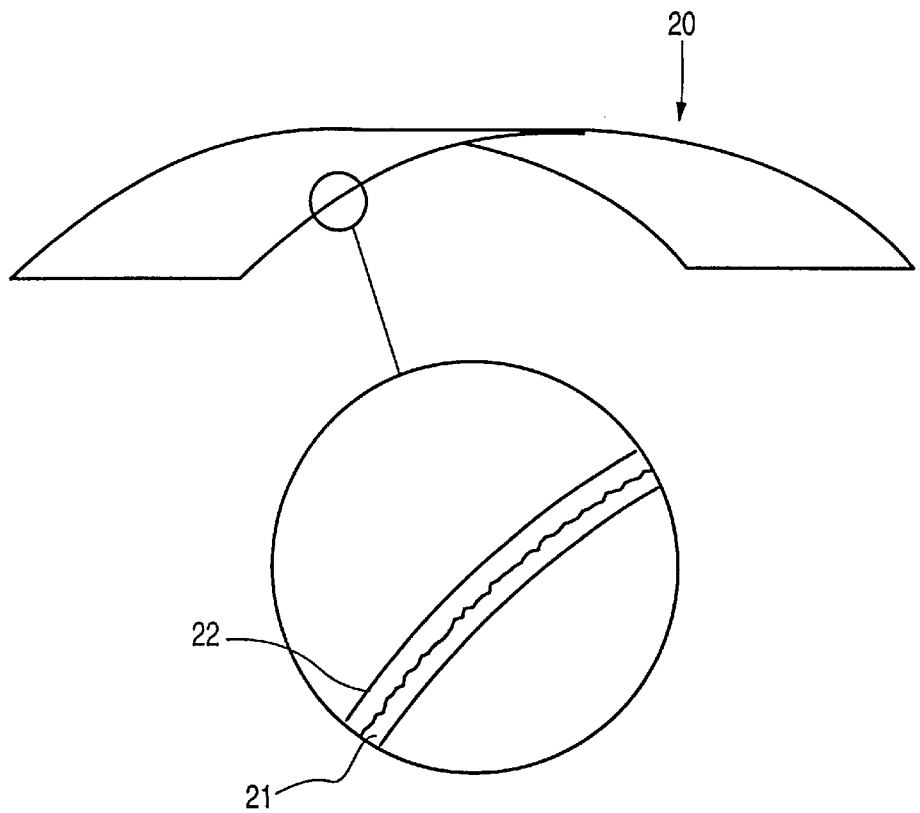
FIG. 7B is a view explaining the effect of the first embodiment together with FIG. 7A.

FIGS. 7A and 7B are views showing the effect of the first embodiment. FIG. 7A is a view showing the situation that a metal layer 22 is formed on, for example, a resin film 21 by using the conventional method, such as the sputtering method, the evaporating method or the like, and then it is curved, and further a part thereof is stripped. FIG. 7B is a view showing the situation that even if a laminated film 20 in the first embodiment is curved similarly to the situation of FIG. 7A, the metal layer 22 is not stripped.

In the conventional method, adhesive strength of a boundary between the resin layer 21 and the metal layer 22 in the laminated film 20 is not sufficient. This results in a problem that if a certain stress or the like is applied to the laminated film 20, both the layers are stripped from the boundary. On the contrary, as shown in FIG. 7B, in a case of the laminated film 20 in the first embodiment, the boundary is constituted by the metal layer 22 formed on the resin layer 21 roughed to the value between 0.1 and 10 microns. Thus, the adhesive strength between both the layers is extremely high as compared with that of the conventional case.

This reason is as follows. That is, since the portion on the resin layer is formed in the predetermined surface roughness, a surface area thereof is larger than that of the conventional case. Thus, the adhesive strength per unit area between the resin layer 21 and the metal layer 22 is stronger corresponding to the increase of the surface roughness.

Figure 8A:
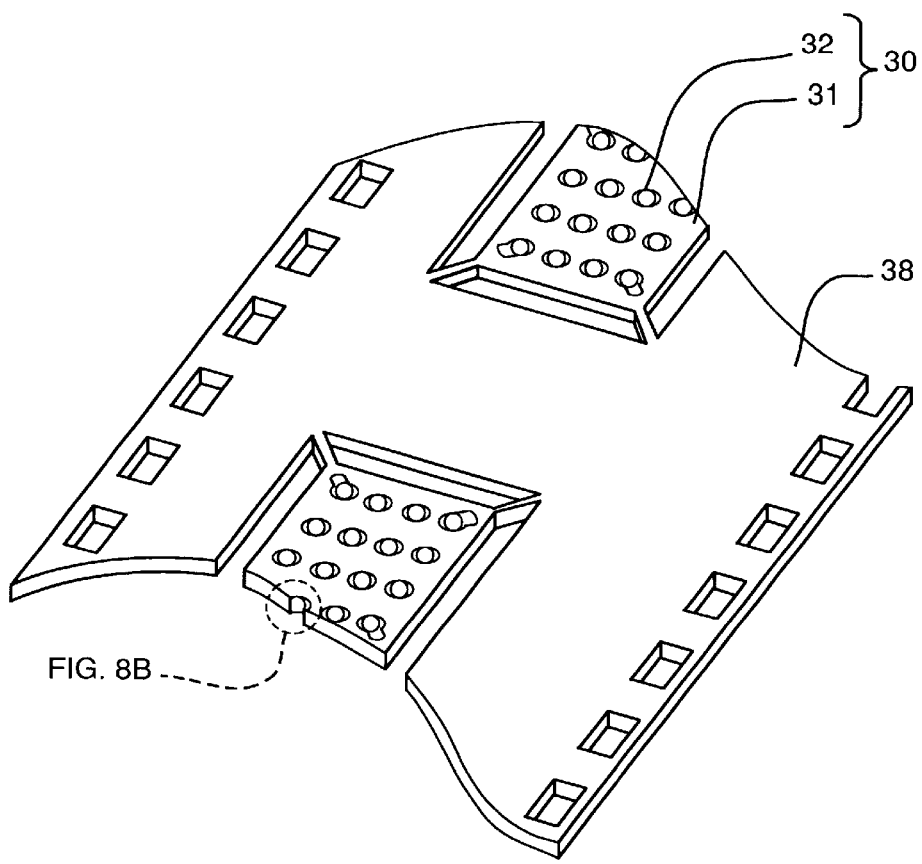
FIG. 8A is a perspective view showing a situation of an intermediate process when using the first embodiment to then manufacture an interposer.
Figure 8B:
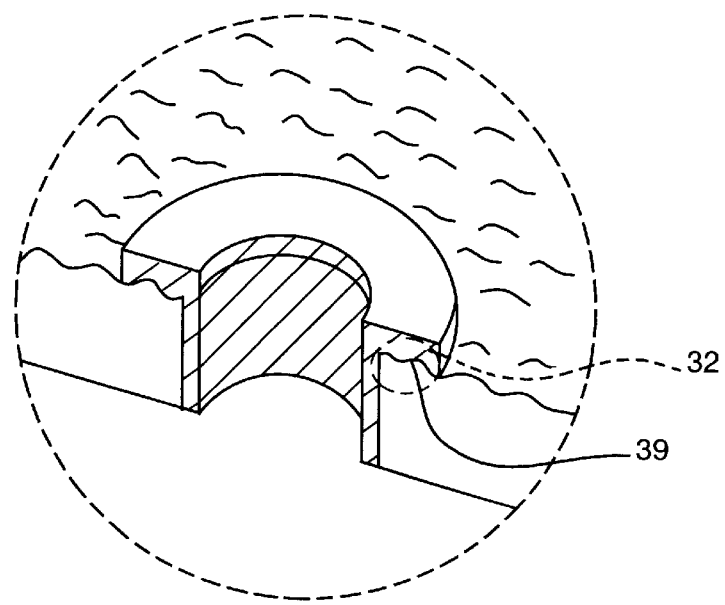
FIG. 8B is an enlarged section view of a part of FIG. 8A.

FIGS. 8A and 8B show an intermediate process of using a laminated film 30 in the first embodiment and then, for example, manufacturing an interposer to place a semiconductor device. A symbol 38 denotes a resin film in FIGS. 8A and 8B.

FIGS. 8A and 8B show the case of placing, for example, a semiconductor device manufactured by using the laminated film 30 in the first embodiment.

As mentioned above, a metal layer 32 can be formed on a resin layer 31, in the high adhesive strength. Thus, this improves the adhesive strength as compared with that of the conventional case to thereby improve the reliability of the semiconductor device as a whole. Moreover, the laminated film 30 can be held or used as a tape-shaped roll. Hence, a manufacturing cost can be made lower, or a manufacturing process can be made easier.

Figure 9A:
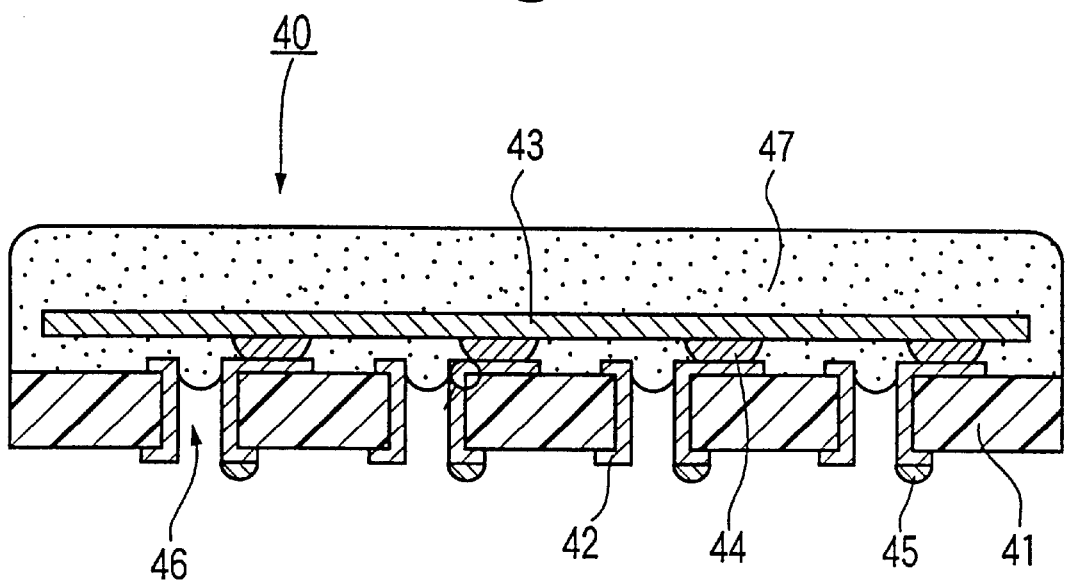
FIG. 9A is a section view showing an interposer to which the first embodiment is applied.
Figure 9B:
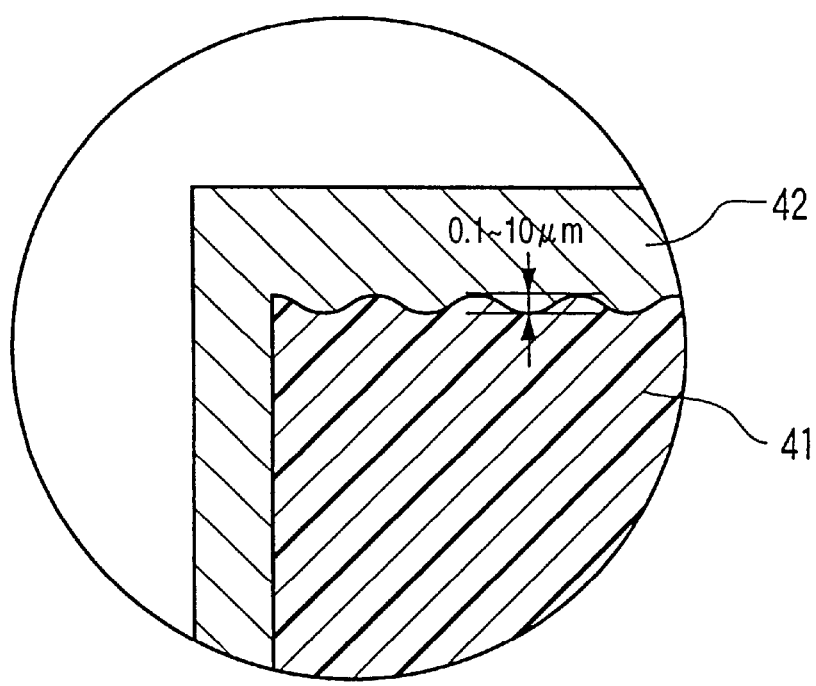
FIG. 9B is an enlarged section view of a part of FIG. 9A.

FIGS. 9A and 9B show a section view of a semiconductor device 40 that uses as the interposer the section in which a metal layer 42 is formed on a resin layer 41 by using the same method as the first embodiment.

If the semiconductor device is placed on the interposer manufactured by treating the laminated film in the first embodiment, its handling is easy. That is, as shown in FIG. 8A, the handling is easy since a film-shaped section can be carried or held as a roll. Moreover, even if a silicon chip is thermally pressed and fitted directly onto the interposer without using, for example, a wire boding operation, as mentioned above, there is no fear that the heating operation causes the wiring on the interposer to be stripped. Moreover, there is no fear that the stress in the press-fitting operation causes the strip. Hence, the laminated film in the first embodiment is the very optimal material as the interposer for the semiconductor device.

Figure 10A:
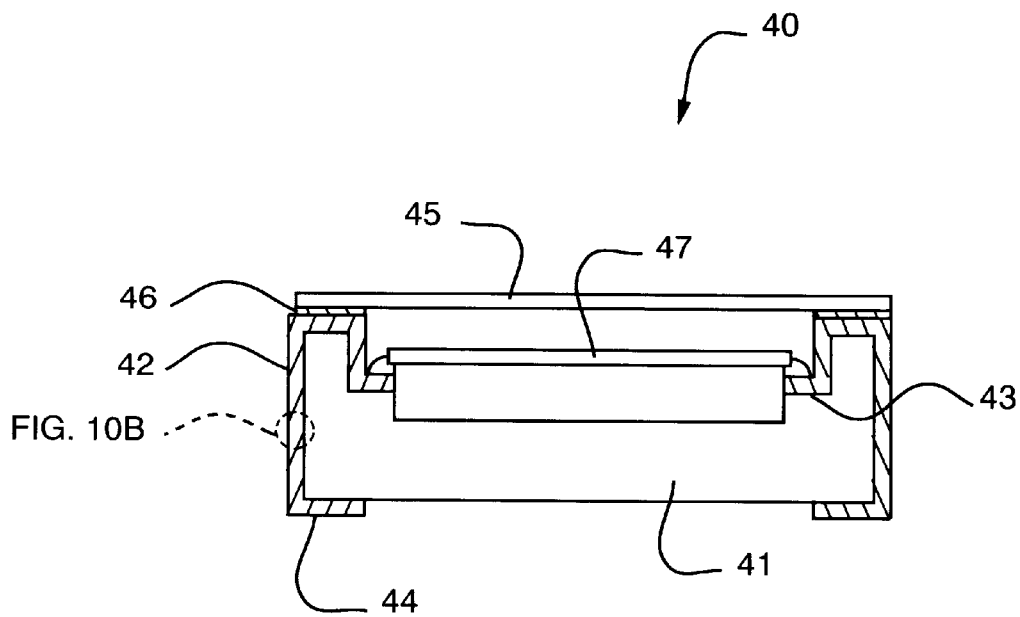
FIG. 10 is a section view showing a case to which the first embodiment is applied.
Figure 10B:
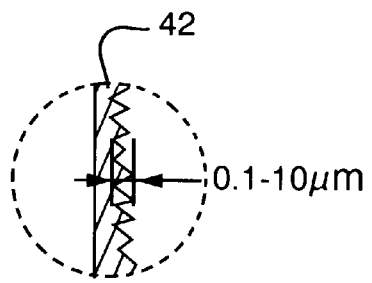

FIG. 10 shows a section view of a case manufactured by further laminating another resin material on the intermediate unit in which the metal layer 42 is formed on the resin layer 41, similarly to the first embodiment. That is, as shown in FIGS. 9A and 10, the metal layer 42 is formed not only on the surface of a resin structure 40 but also on an inner surface thereof. Accordingly, an inner electrode 43 and an outer connecting section 44 are connected to each other through the metal layer 42.

FIG. 10 shows a situation that a semiconductor device 47 is placed on a case manufactured by treating the resin structure 40 in the first embodiment and then a cover 45 is put by using a seal resin 46. In this situation, as shown in FIGS. 8A and 8B, its handling is easy, and the film-shaped section can be carried or held as the roll. Moreover, even if the silicon chip is thermally pressed and fitted directly onto the case without using, for example, the wire bonding, as shown in FIGS. 9A and 9B, there is no fear that the heating operation causes the wiring on the case to be stripped. Moreover, there is no fear that the stress in the press-fitting operation causes the strip. Thus, this is the very optimal material as the case for such semiconductor device. Especially, if a three-dimensional circuit wiring is provided, large stress is easily incurred between the resin 41 and the metal layer 42 constituting the wiring. Hence, this effect is very large.

A second embodiment will be described below. The second embodiment is a method that manufactures a resin structure. The method includes providing resin formed of a single material, making the surface of the resin rough so that a surface roughness thereof ranges between 0.1 and 10 microns, and directly forming a metal layer with the electroless plating without the intervention of the adhesive layer on the rough surface of the resin and, then manufacturing the resin structure. Here, the resin structure may be film-shaped.

The second embodiment includes making the surface itself of the resin layer rough so that the surface roughness ranges between 0.1 and 10 microns. Moreover, the second embodiment includes forming the metal layer directly on the thus-rough surface of the resin layer with the electroless plating. In the conventional technique, it is extremely difficult to form the electroless plating directly on the resin layer, in the process of manufacturing the resin structure.

In the conventional method, the special component serving as the growth core for plating is contained in the resin, in order to avoid the above-mentioned difficulty. For example, particles of palladium are contained in the resin. As another method, the conventional method performs the electroless plating by using, for example, the adhesive layer and the like and thereby making the surface rough. However, the second embodiment includes making the surface itself of this resin layer rough without using the component serving as the growth core for plating in the resin and without the intervention of the adhesive layer. The second embodiment can perform the electroless plating directly on the surface of the resin layer without the intervention of the adhesive layer. Accordingly, the second embodiment does not require the process of forming the adhesive layer and the process of using the evaporating operation, the sputtering operation and the like. Thus, the resin structure can be manufactured at a low cost.

Figure 11A:
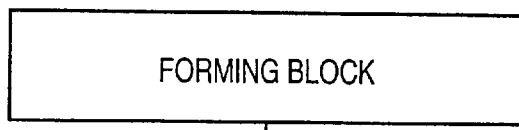
FIG. 11A is a view showing a manufacturing process of a second embodiment in the present invention.
Figure 11B:
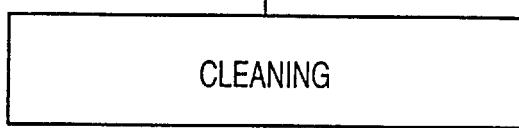
FIG. 11B is a view showing a manufacturing process of a second embodiment in the present invention.
Figure 11C:
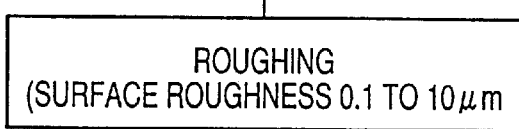
FIG. 11C is a view showing a manufacturing process of a second embodiment in the present invention.
Figure 11D:
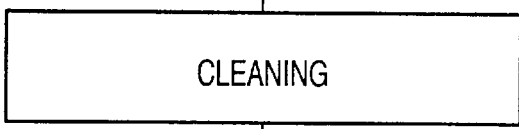
FIG. 11D is a view showing a manufacturing process of a second embodiment in the present invention.
Figure 11E:
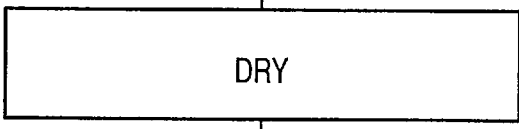
FIG. 11E is a view showing a manufacturing process of a second embodiment in the present invention.
Figure 11F:
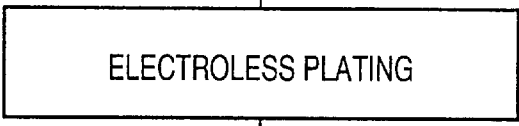
FIG. 11F is a view showing a manufacturing process of a second embodiment in the present invention.
Figure 11G:
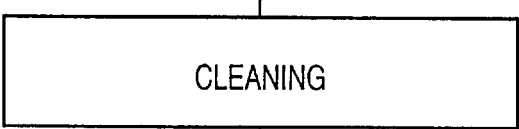
FIG. 11G is a view showing a manufacturing process of a second embodiment in the present invention.
Figure 11H:
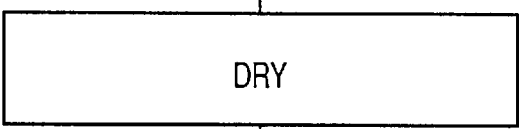
FIG. 11H is a view showing a manufacturing process of a second embodiment in the present invention.

The second embodiment has the processes especially shown in FIGS. 11C and 11F, of the processes shown in FIGS. 11A to 11H. That is, the resin film functioning as the resin layer is prepared in FIG. 11A. After that, this resin film is cleaned (FIG. 11B) and then roughed to the surface roughness between about 0.1 and 10 microns (FIG. 11C). Various methods may be considered as this roughing method. However, the inventor et al. discover that the roughing operation based on the particular method noted in a later-described embodiment is optimal.

Figures 11I, 11J:
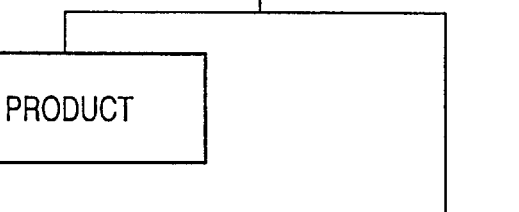
FIG. 11I is a view showing a manufacturing process of a second embodiment in the present invention.
FIG. 11J is a view showing a manufacturing process of a second embodiment in the present invention.

Next, the electroless plating is directly formed on this rough resin film through cleaning and drying processes (FIGS. 11D and 11E) after the roughing process (FIG. 11C). After the formation of the electroless plating, it is cleaned (FIG. 11G) and dried (FIG. 11H) and made into a product (FIG. 11I) or sent to another process (FIG. 11J). Thus, it is possible to manufacture the laminated film with high reliability, the intermediate unit of the laminated film, or the electronic circuit device.

Figure 12A:
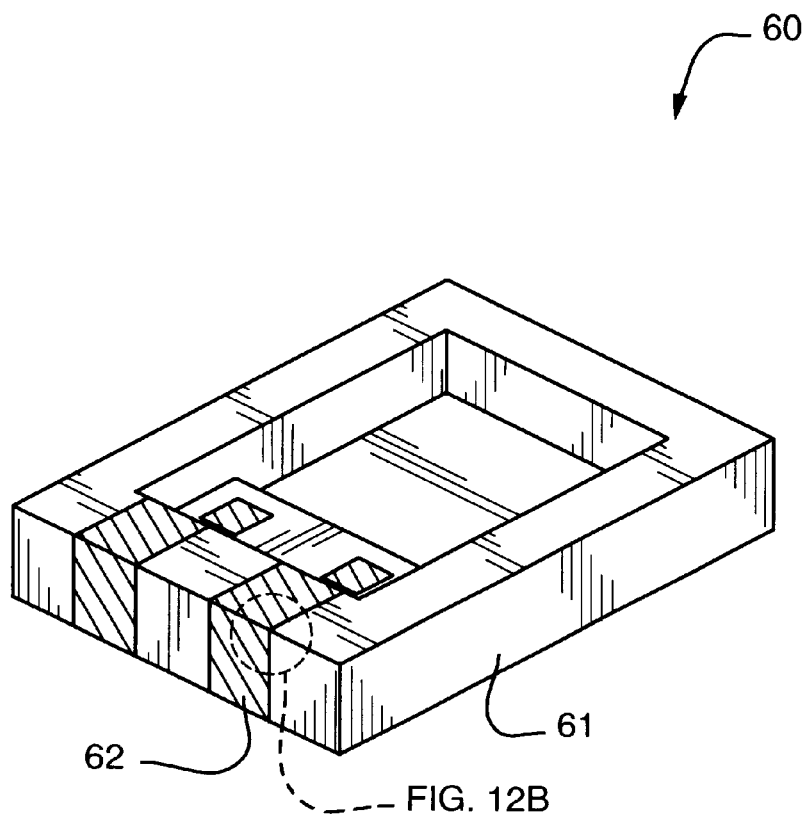
FIG. 12A is a perspective view of a third embodiment in the present invention.
Figure 12B:
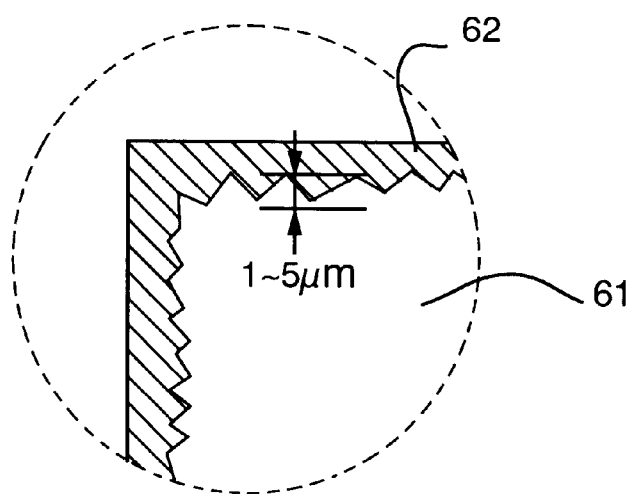
FIG. 12B is an enlarged section view of a part of FIG. 12A.
Figure 13A:
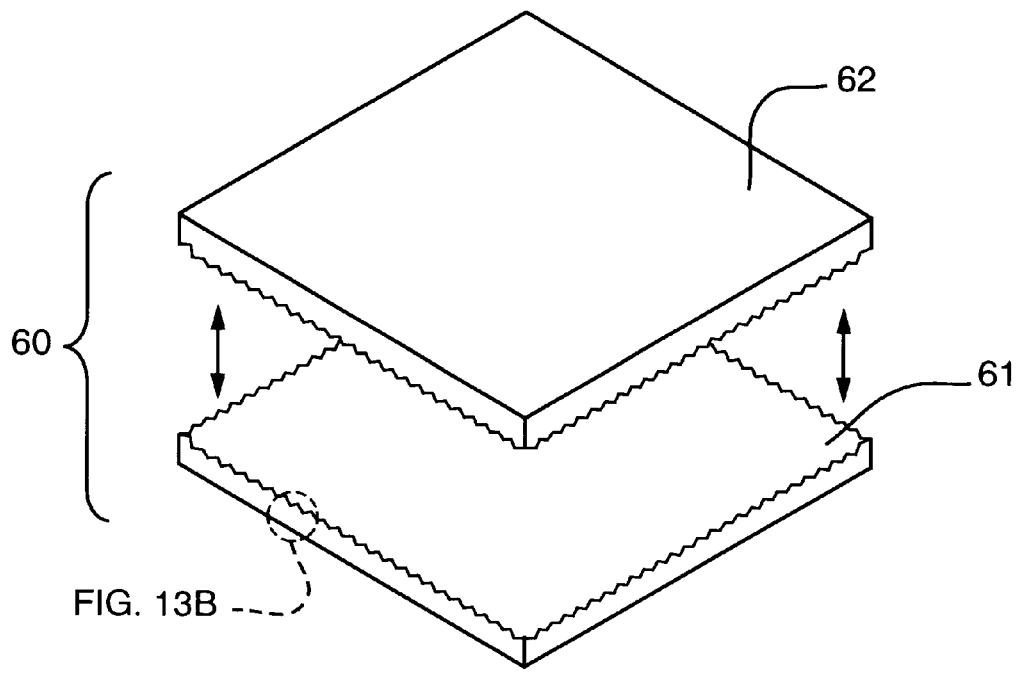
FIG. 13 is a view showing a variation of the third embodiment.
Figure 13B:
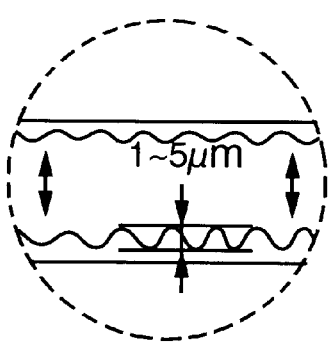

A third embodiment will be described below with reference to FIGS. 12A and 12B. The third embodiment is a resin structure having the resin layer formed of a single material and the metal layer directly laminated on the resin layer without the intervention of the adhesive layer. In this resin structure, the surface of the resin layer on which the metal layer is laminated is made rough so that a surface roughness thereof ranges between 1 and 5 microns, and the metal layer is formed on the rough surface of the resin layer. The resin structure may be a film-shaped lamination film, as shown in FIG. 13. The surface of a resin 61 is roughed to the value between 1 and 5 microns, as shown in FIGS. 12A, 12B and 13. A resin structure 60 is constituted such that a metal layer 62 is directly formed on the rough surface of the resin 61.

In addition, all the resin structure simply that each contains the film-shaped lamination film, in the following respective embodiments disclosed in this specification.

The inventor et al. eagerly try the research and the development, and discover that the optimal value for the surface roughness is especially in the range between 1 and 5 microns. If the surface roughness belongs to that range, the adhesive strength between the resin layer and the metal layer can be made especially stronger, and there may be no fear that the hyperfine wiring is disconnected, which enables the sufficient reliability to be ensured. If the surface roughness is greater than 1 micron, the resin material and the metal layer can be especially strongly bonded to each other. If the surface roughness is greater than 5 microns, it is difficult to make the wiring formed on the resin hyperfine. That is, if the surface roughness is greater than 5 microns, the thick film must be used as the wiring. This leads to the limitation on the hyperfine treatment for the wiring.

A fourth embodiment will be described below. The fourth embodiment is a method that manufactures a resin structure. The method includes providing the resin layer formed of a single material, making the surface of the resin layer rough so that a surface roughness thereof ranges between 1 and 5 microns, and forming the metal layer directly on the rough surface of the resin layer with the electroless plating.

In the fourth embodiment, the metal layer of the resin structure in the third embodiment is formed on the surface of the resin layer, by directly performing the electroless plating. Thus, the processes in the fourth embodiment are as shown in FIGS. 14A to 14J. In the fourth embodiment, the surface roughness is set to 1 micron or more and 5 microns or less, in the roughing process of FIG. 14C. Moreover, in the fourth embodiment, the metal layer is formed by the electroless plating, in the process of FIG. 14F.

The reason why the surface roughness is set to 1 micron or more and 10 microns or less is as follows. If it is greater than 1 micron, the adhesive strength is further greater than that of 0.1 microns in the first embodiment. Thus, the sufficiently adhesive strength can be ensured between the metal layer and the resin layer. If it is equal to or less than 5 microns, even when the wiring formed on the resin layer after the treatment of the metal layer is the very hyperfine copper wiring, it is not cut off in a case of getting over the stepped surface of the resin layer. Thus, the defective circuit is never incurred.

Figure 14A:
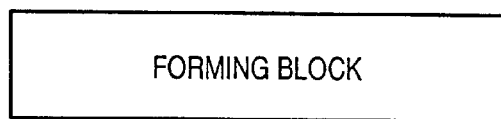
FIG. 14A is a view showing a manufacturing process of a fourth embodiment in the present invention.
Figure 14B:
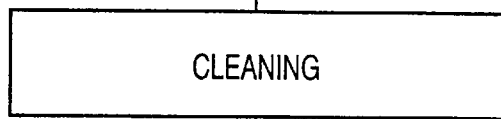
FIG. 14B is a view showing a manufacturing process of a fourth embodiment in the present invention.
Figure 14C:
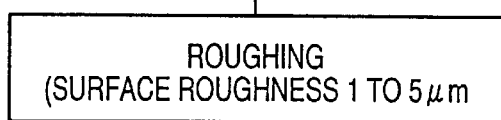
FIG. 14C is a view showing a manufacturing process of a fourth embodiment in the present invention.
Figure 14D:
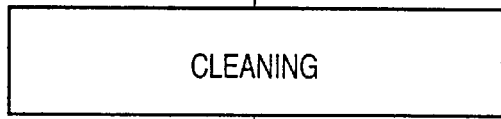
FIG. 14D is a view showing a manufacturing process of a fourth embodiment in the present invention.
Figure 14E:
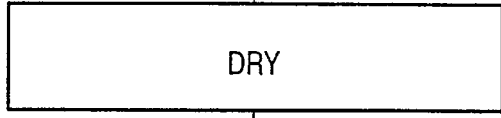
FIG. 14E is a view showing a manufacturing process of a fourth embodiment in the present invention.
Figure 14F:
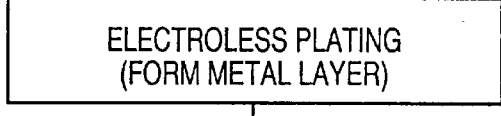
FIG. 14F is a view showing a manufacturing process of a fourth embodiment in the present invention.
Figure 14G:
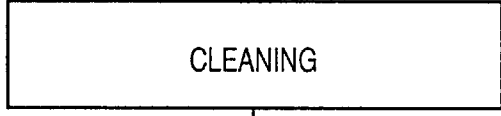
FIG. 14G is a view showing a manufacturing process of a fourth embodiment in the present invention.
Figure 14H:
FIG. 14H is a view showing a manufacturing process of a fourth embodiment in the present invention.
Figure 14I:
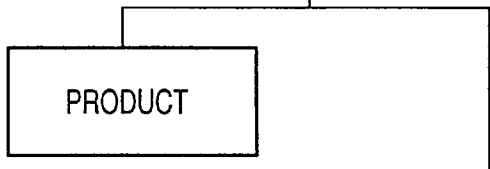
FIG. 14I is a view showing a manufacturing process of a fourth embodiment in the present invention.
Figure 14J:
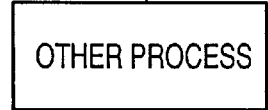
FIG. 14J is a view showing a manufacturing process of a fourth embodiment in the present invention.

The processes of FIGS. 14I and 14J show that the fourth embodiment may be a finished product or may be moved to other processes as an intermediate unit and further a laminated section of the electronic circuit device is laminated on the upper portion of the intermediate unit.

FIGS. 15A to 15K are those shown in other embodiments. The difference from those shown in FIGS. 14A to 14J is the presence of the process shown in FIG. 15B.

FIG. 15B is a process of forming and treating the resin film. The process of FIG. 15B shows, for example, a step of forming through-holes or via-holes in the resin film, a step of forming grooves or holes for alignment, and other steps. The resin structure or the laminated film is created such that the metal layer is laminated on the resin layer. However, the respective manufacturing processes are not always carried out in the condition that the resin film is not perfectly formed. There may be a case in which the laminated film is created by performing the forming treatment on a part thereof. The resin structure is produced in three-dimensionally various shapes. There are a lead frame insert board, a cubic board for large current, a cubic frame of jumper wire structure and the like. There may be a case in which although it is originally flat, it is formed and treated during the manufacturing process.

The method of manufacturing the resin structure in the fourth embodiment includes the case that the forming process is intermediately contained as mentioned above. The structure process shown in FIG. 15B not only includes the case that it is contained after the step of FIG. 15A, but also includes the case that the forming process is contained at other times.

A fifth embodiment will be described below. The fifth embodiment is a method that manufactures a resin structure. The method includes providing the resin layer formed of a single material, making the surface of the resin layer rough with sandblasting so that a surface roughness thereof ranges between 0.1 and 5 microns, and forming a metal layer directly on the rough surface of the resin layer with the electroless plating.

In the present invention, the surface of the resin layer is made rough when the metal layer is laminated on the resin film. The process of using the sandblasting is very effective for the roughing process to attain the value of the surface roughness between 0.1 and 10 microns and preferably between 1 and 5 microns.

Figure 16A:
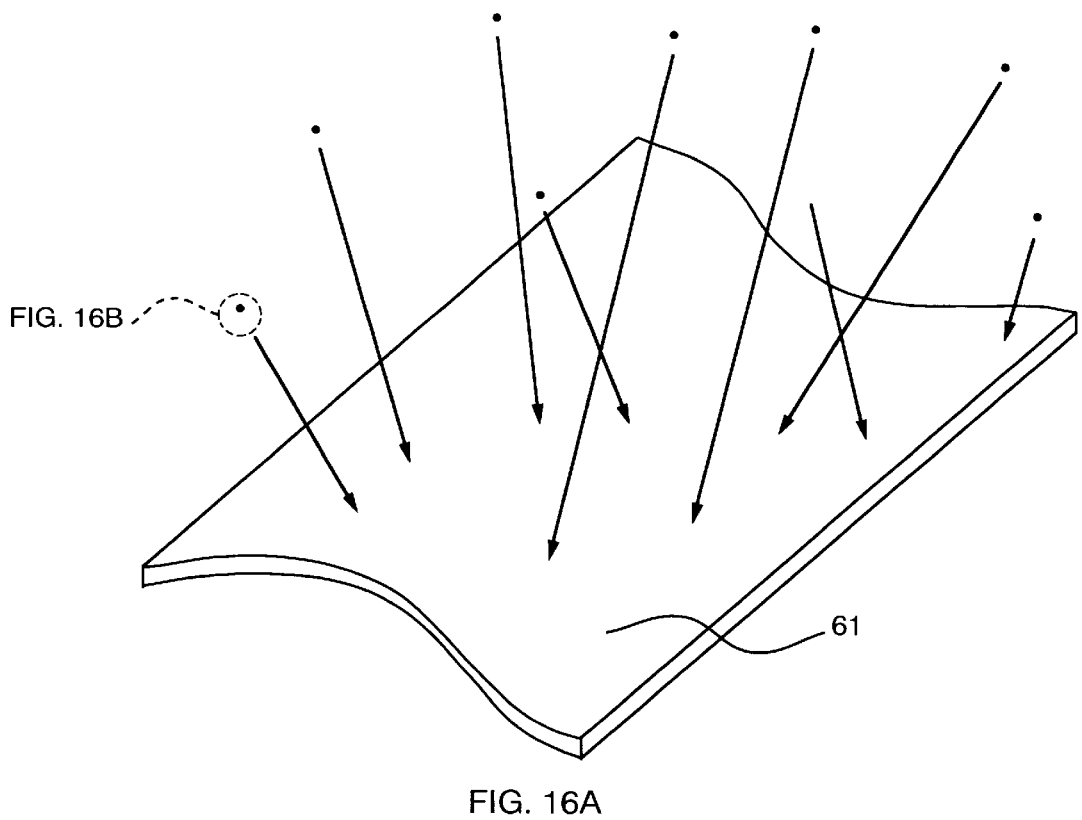
FIG. 16 is a perspective view showing a fifth embodiment in the present invention.
Figure 16B:
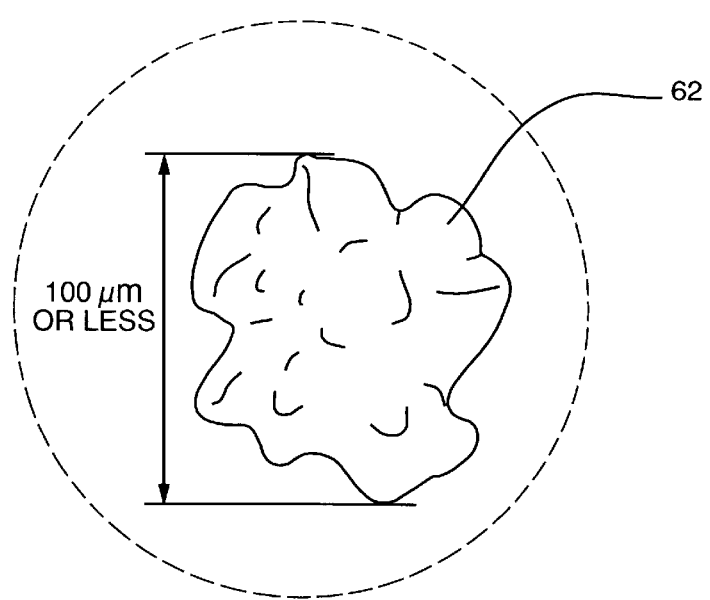
Figure 17A:
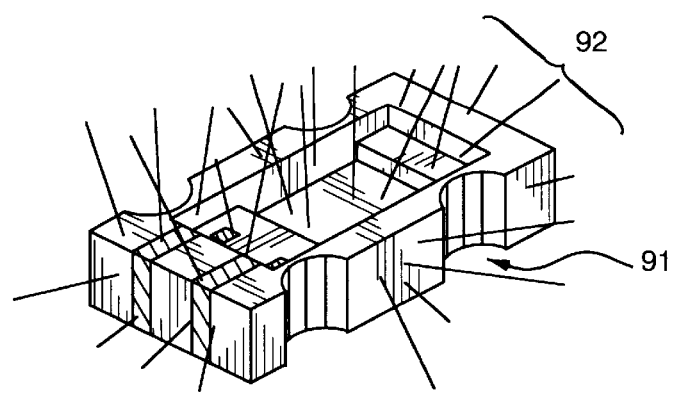
FIG. 17A is a perspective view showing an intermediately manufacturing process of the fifth embodiment.
Figure 17B:
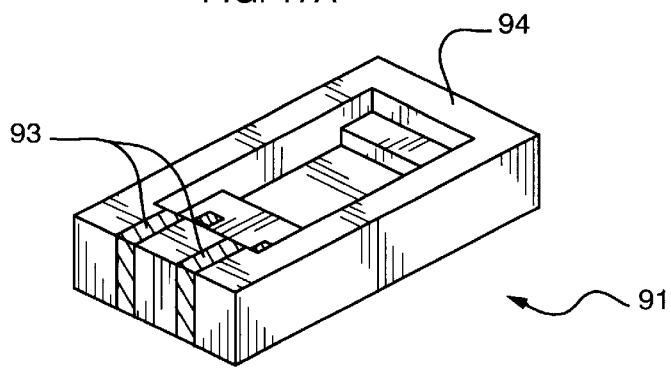
FIG. 17B is a perspective view showing the fifth embodiment manufactured after the process of FIG. 17A.

FIGS. 16, 17A and 17B conceptually show the fifth embodiment. The sandblasting has the same meaning as the blasting treatment. The sandblasting implies a typical method of a spray treatment in which particles are accelerated by centrifugal force generated by a rotated impeller and the like or sprayed together with compressed air, and thereby projected to a work piece, and accordingly the treatment is done.

As shown in FIG. 16, polygonal particles 62 in which each particle diameter is about 100 microns or less are collided against a resin substrate 61, for example, a film-shaped resin film, at a high speed. Impact force resulting from this collision causes the ruggedness to be formed on the surface of the resin substrate 61. Then, this ruggedness is adjusted such that it ranges between 0.1 and 10 microns.

The reason why this operation is typically referred to as the sandblasting is that sand is typically used as the particle. On the contrary, the sandblasting in this embodiment is not always limited to the case in which the sand is used as the particle. It also includes a case in which a particle formed of small steel, cast iron and the like is used (typically, referred to as shot blast and the like).

When the particle having a predetermined energy is collided against the resin film at the high speed, a part of the surface of the resin film is stripped or depressed. As a result, the ruggedness is created on the surface of the resin film so that it has a predetermined roughness.

Figure 18A:
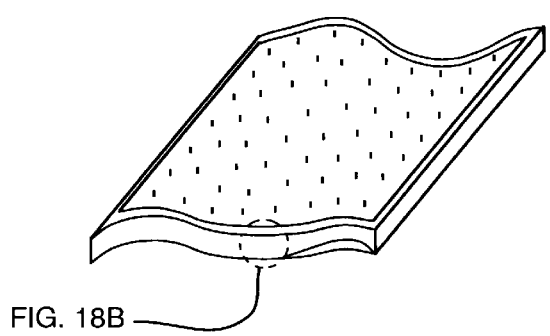
FIG. 18 is a view showing a surface situation of a resin layer in the fifth embodiment.
Figure 18B:
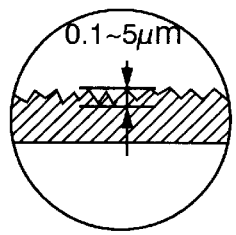

FIG. 18 shows the situation of the surface on the resin layer after the completion of the sandblasting process in the fifth embodiment.

Figure 19:
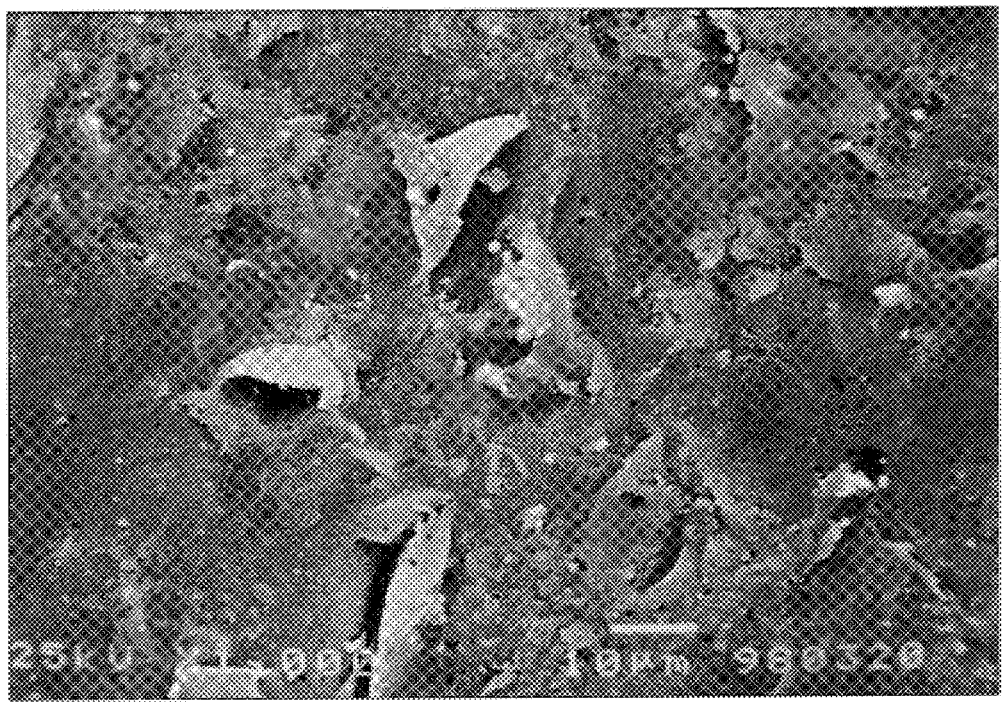
FIG. 19 is a photo showing the surface situation the resin layer in the fifth embodiment.

The enlarged portion of FIG. 18 shows only the concept. The ruggedness having the surface roughness between 1 and 5 microns (including the surface roughness between 0.1 and 10 microns, although this is not shown) is represented by a wave form in the enlarged portion of FIG. 18. Actually, this ruggedness is not always represented by such a wave form. This ruggedness has the situation that the surface is further sharply rugged. The photo of FIG. 19 shows that situation. As shown in the photo of FIG. 19, a part of the surface is stripped and dug. The ruggedness on the surface is created because of such strip and dig. The adhesive strength between the resin layer and the metal layer is made higher by the fact that the metal layer is sufficiently passed around and adhered to this ruggedness. In this way, the treatment of the sandblasting enables the ruggedness equal to or less than 10 microns to be formed, which sufficiently ensures the adhesive strength between the surface of the resin substrate and the wiring. Moreover, even in a case of the wiring having a width of about 20 microns, the disconnection is not incurred. Hence, the electronic circuit having the sufficiently fine pattern can be manufactured in the high reliability.

The utilization of the sandblasting as the manner of making the surface rough enables the ruggedness having the optimal size to be formed under excellent reproducibility without the dependency on the kind of material of work piece. The reason is that in the sandblasting process, the surface is treated under the mechanical impact energy as mentioned above, and thereby this does not require the process such as the chemical reaction depending on the material of the work piece and the like.

The followings are the merits of using the sandblasting and then achieving the above-mentioned surface roughness and further forming the metal layer. As shown in FIG. 17B, only a portion 93 on which the metal layer is desirably formed is exposed on the resin layer, and the other portion 94 is covered. Then, the execution of the sandblasting under that condition enables the roughing process to be selectively done. Accordingly, the metal layer can be formed only on the rough portion.

That is, according to this method, if roughing only the portion on which the metal layer is desirably formed, and maintaining the other portion in the original situation of the resin material, the metal layer is selectively grown on the rough portion without using the plated cover and the like, and the metal layer is not grown on portions other than the rough portion. Thus, this method simplifies the process. It can be the that this point is advantageous as compared with the conventional subtractive method and the two time forming method shown in FIG. 3.

A sixth embodiment will be described below. The sixth embodiment is a method that manufactures a resin structure. The method includes providing the resin layer formed of a single material, making the surface of the resin layer rough with wet blasting so that a surface roughness thereof ranges between 0.1 and 5 microns, and forming a metal layer directly on the rough surface of the resin layer with the electroless plating.

Figure 20:
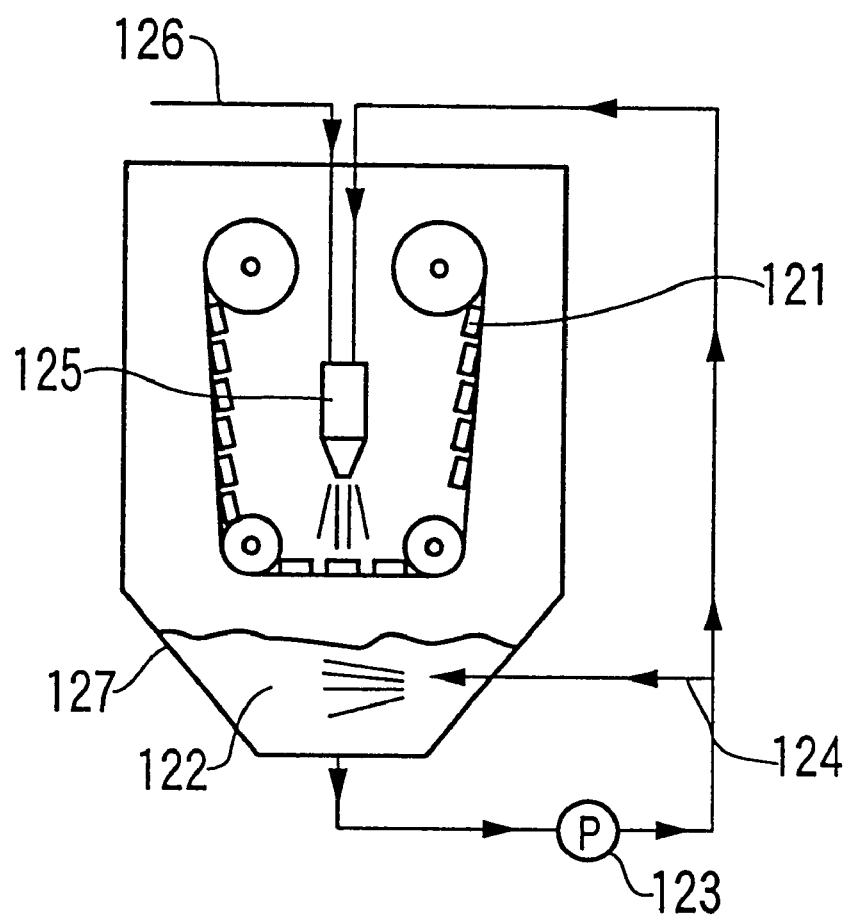
FIG. 20 is a side section view showing an apparatus for wet blasting used in a sixth embodiment in the present invention.

The inventor et al. discover that the wet blasting in the sandblasting is further suitable for the roughing process in this embodiment. FIG. 20 shows the concept of the wet blasting. Here, the wet blasting is the concept in comparison with dry blasting in the sandblasting. In the dry blasting, a so-called micro particle is directly collided against a work piece. In the wet blasting, fluid in which liquid and micro particles are mixed is collided against the work piece.

FIG. 20 shows a wet blasting apparatus. As shown in FIG. 20, mixture of the liquid and the particles serving as a grinding material 122 is contained at a slurry state in a tank 127. The material of this mixed state is always agitated by a spray flow 124 branched from a blast pump 123, and becomes in a uniformly mixed state. Then, a part of the material in the mixed state is compressed with the blast pump 123. Then, it is introduced to a projection gun 125. While mixed with a compressed air 126 by the projection gun 125, it is collided against the surface of a resin film that is the work piece, namely, a resin 121. A system in which the resin 121 is sequentially fed is provided in the tank 127.

The grinder (slurry) 122 and the compressed air 126 are mixed within the projection gun 125, and projected through a nozzle. The projected grinder (slurry) 122 is again returned to the tank 127 and again used.

Figures 21, 22:
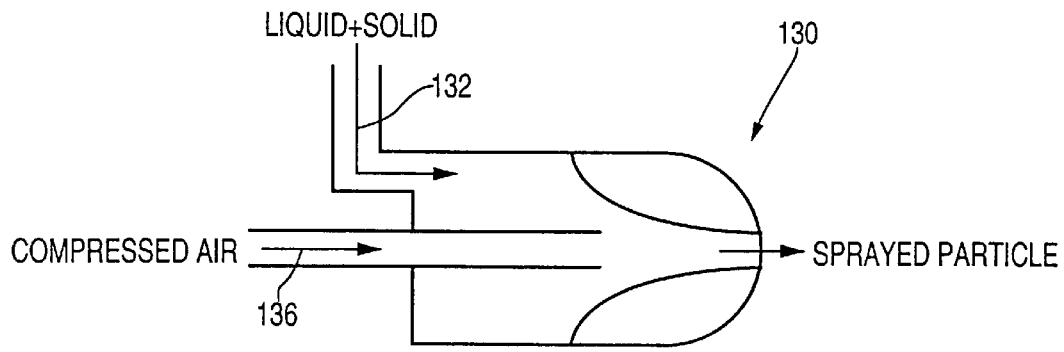
FIG. 21 is a side section view showing a projection gun in the apparatus of FIG. 20.
FIG. 22 is a view showing the optimal condition of the wet blasting.

A symbol 130 of FIG. 21 denotes a concept view showing the projection gun of FIG. 20.

As shown in FIG. 21, component including solid and liquid serving as a grinder (slurry) 132 is mixed with a compressed air 136. The mixture is sprayed forward from a tip of a projection gun 130 at a high pressure. Ruggedness is created on the surface of resin substrate, namely, on resin, by a fact that the sprayed mixture is collided against the surface of the resin substrate serving as the work piece.

FIG. 22 shows the optimal conditions for the wet blasting. As the optimal conditions for the wet blasting, a pressure of the pump is about 1 to 5 $kg/cm^2$, a pressure of the compressed air is about 1 to 6 $kg/cm^2$, a central value of a particle diameter of a micro particle (medium) contained in the slurry (wet blasting) is about 40 to 300 microns $\phi$, and a ratio of the grinder to the liquid is about 5 to 40 volume %.

Figure 23:
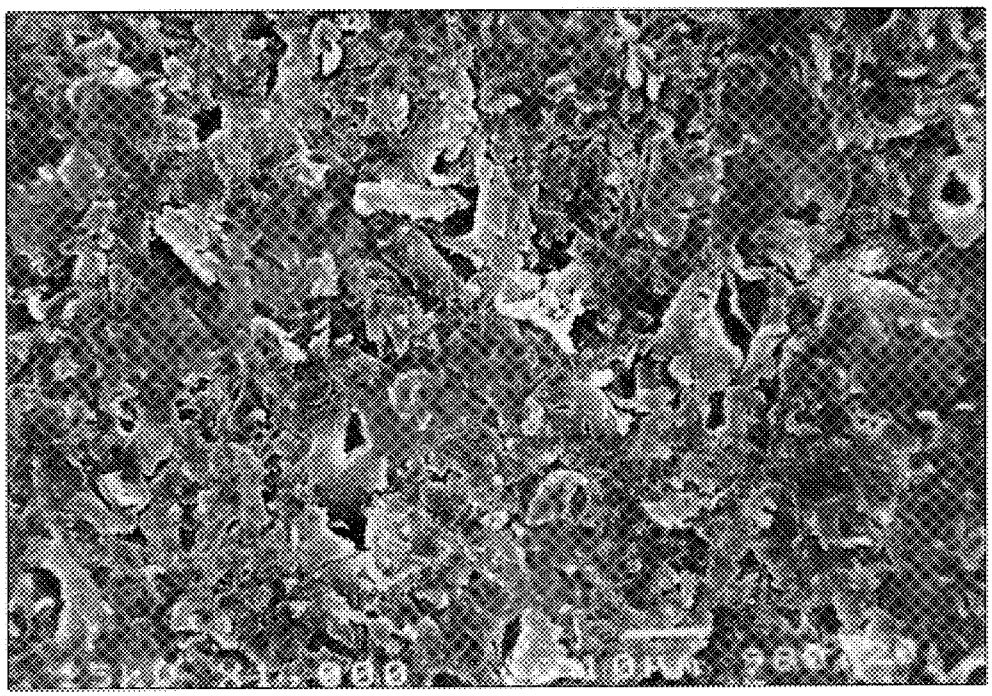
FIG. 23 is a photo showing a surface of resin formed by the wet blasting.

FIG. 23 shows a surface photo in which the ruggedness on the surface of the resin formed with the wet blasting is photographed by an electron microscope. As shown in this photo, in the case of the wet blasting, the surface of the resin is formed in the condition that it is further uniform, hyperfine and rugged as compared with the case of the dry blast. The surface roughness of the ruggedness is about 5 microns.

The surface roughness between about 1 and 5 microns can be ensured if the wet blasting is used as mentioned above. Thus, this is optimal for the purpose of this embodiment.

In addition, the meanings of the sandblasting and the wet blasting used by the inventor are obviously defined. The sandblasting implies the operation of using any micro particle as mentioned above and then carrying out the mechanical treatment. Further the sandblasting includes both of the dry blasting for spraying and treating only this particle and the wet blasting for spraying and treating this particle together with the liquid. Thus, the dry blasting is the subordinate concept of the sandblasting.

A seventh embodiment will be described below. In the seventh embodiment, in the above-mentioned method of manufacturing the resin structure, the single material is formed of one selected from a group consisting of epoxy resin, polymethyl pentene, polyphenylene ether, aromatic polyamide, polyacetal, polyetheramide, polyethylene terephthalate, polyebutylene naphthalate, liquid crystal polyester, polyarylate, polyimide, polyamideimide, polyetheretherketone, polyphenylene sulfite, liquid crystal polymer, fluorocarbon resin, polysulfone, polyethersulfone, polyamide 46, polyethylene naphthalate, polyebutylene terephthalate and aromatic polyester.

The above-mentioned materials are optimal for the single material. The reason is as follows. That is, when each of the surfaces of the above-mentioned materials is treated with the sandblasting, especially with the wet blasting, it is easy to form each surface to the ruggedness between 0.1 and 10 microns, especially between 1 and 5 microns.

The reason why such a group of materials is noted as a so-called Markush type claim in this embodiment depends on the following reasons. That is, these materials are common in high heat resistance, in addition to the easily treated property as mentioned above. The heat resistance of these high polymers results from the structure of the high polymers. It can be evaluated with a thermal decomposition start temperature, a melting point tm and a glass transition point tg peculiar to the high polymer as a scale.

As the conditions necessary for the heat resistant high polymer, the tg and the tm implying the physical meaning are sufficiently high, the high polymer can withstand high temperature softening, a pdt value involving chemical change is sufficiently high, and the high polymer can withstand thermal degradation.

As an actual example, the tg of the polyimide is about 420° C. and it is not almost decomposed until 500° C. Thus, it sufficiently satisfies the necessary condition for the heat resistance. Moreover, a heat resistant life of the polyimide film is eight years at 250° C., one year at 275° C., three months at 300° C., six days at 350° C., and twelve hours at 400° C. Hence, it can be the that the polyimide is the material having the high heat resistance. In addition, this heat resistance is common to the respective materials in the above-mentioned Markush type claim.

The important matters for the heat resistant high polymer are the heat resistant softening property and the heat resistant degradation property, as mentioned above. As for the first heat resistant softening property, at least tg and tm must be sufficiently high so that the shape of the high polymer material can be kept as the formed body at a high temperature. The above-mentioned group of materials sufficiently satisfies these important matters for the heat resistant softening property.

According to thermodynamics, the tm is given by a ratio of a fusion enthalpy $\delta$ hm to a fusion entropy $\delta$ sm. That is, tm=δ hm/δ sm. Here, the δ hm is a quantity in relation to an intermolecular force, and the δ sm is mainly a quantity in relation to a bending strength and a symmetry of the molecule. As the molecule design of the heat resistant high polymer, the point common to them is that the heat resistant softening property is high from the viewpoint of continuously using the heat resistant high polymer as the material for a long time. In particular, the tg over which the molecular motion become to active is the further important physical measurement than the tm. Thus, the high polymer having as high tg as possible is required.

The followings are the features common to the high polymers as the molecular design. That is, a connection radical having a strong molecular force is composed into a main chain of the high polymer. An aromatic circle that is excellent in symmetry is composed into the main chain of the high polymer. A high substituent radical is composed into a side chain of the high polymer. And, a double chain structure is introduced into the main chain of the high polymer.

The above-mentioned group of materials has the sufficiently high tm and the sufficiently mechanical strength, such as the bending property and the like. Thus, from such viewpoints, they are excellent for the material of the resin layer constituting the resin structure in this embodiment. Moreover, if the sandblasting treatment is performed on these materials as mentioned above, there is no substantially difference between the treatment situations of the surfaces, depending on the kind of material.

If the high heat resistant high polymer is used as the material of the resin substrate, it is possible to achieve the electronic circuit device which is strong in so-called heat cycle and has the high reliability and in which the resin substrate is not deteriorated in a soldering process necessary for a process of manufacturing the wiring.

An eighth embodiment will be described below. In the eighth embodiment, the medium of the wet blasting is a polygonal particle and has a central particle diameter between 10 and 300 microns, and as for a hardness, has a Knoop hardness between 1300 and 2500 or a Moh's hardness between 7 and 15, in the above-mentioned embodiment. Th inventor eagerly tries the consideration about the material optimal for the medium material. FIG. 24 shows this consideration result by using the typical materials.

In a case of the medium of the wet blasting, namely, the particle, as a first condition, it is necessary that the central particle diameter belongs to a certain range. That is, in order to obtain the surface roughness between 0.1 and 10 microns, especially preferably between 1 and 5 microns, it is necessary that the central particle diameter of the medium ranges between 10 and 300 microns. And, it is also necessary that the Knoop hardness ranges between 1300 and 2500 or that the Moh's hardness ranges between 7 and 15.

The further important factor is that the medium of the wet blasting is the polygonal particle. As shown in FIG. 24, consideration is performed on typical eight samples. The NO.1 to NO.5 samples agree with the above-mentioned embodiments. If the resin structure is manufactured in accordance with those conditions, it is possible to easily manufacture the resin substrate whose surface roughness ranges between about 1 and 5 microns, as a result. Thus, the wiring formed thereon can ensure the sufficient strength even if formed with the electroless plating.

In the case of NO.1, the central particle diameter ranges between about 210 and 297 microns, the Knoop hardness is 2200, the true specific gravity is 3.9, and the shape is polygonal. The detailed explanations of the respective NO.2 to NO.5 are omitted. If the conditions as noted in the NO.6 to NO.8 do not agree with those of the above-mentioned embodiments, the surface roughness between 1 and 5 microns or between about 0.1 and 10 microns can not be ensured as a result. The reason is that the surface of the resin substrate can not be made sufficiently rough since the Knoop hardness is small or the shape is a true ball and is not polygonal. The desirable surface roughness can be surely obtained in the case of the polygonal particle. On the contrary, the above-mentioned result can not be obtained in the case of the shape of the true ball. The reason is as follows. That is, in the case of the shape of the true ball, the impact on the resin does not scratch the surface of the resin. Hence, the surface of the resin can not be made sufficiently rough.

A ninth embodiment will be described below with reference to FIG. 25. The ninth embodiment includes providing the resin formed of a single material, making the surface of the resin rough so that a surface roughness thereof ranges between 0.1 and 10 microns, forming a conductive layer directly on the rough surface of the resin with the electroless plating, and forming a metal layer having a predetermined thickness by using the electrolytic plating with the conductive layer as the base layer.

In this embodiment, when the metal layer is formed in the resin structure, after the conductive layer is directly formed on the surface of the resin layer with the electroless plating, the metal layer is thickly formed by using the electrolytic plating with the conductive layer as the base layer. The specification necessary for the resin structure in this embodiment has been very various in recent years. As for a current value, there may be a case that the circuit that must treat a very large current is formed on the laminated film. In this case, the conductive layer having a sufficient thickness must be formed. Thus, it is difficult to form an electrical circuit for treating such a large current by using only the conductive layer formed with the electroless plating.

According to this embodiment, a manufacturing method is developed for strongly adhering and forming the conductive layer to and on the resin layer with the directly electroless plating. Thus, the thick metal layer can be extremely easily formed by using the conductive layer formed with the electroless plating as the base layer and then performing the electrolytic plating. According to this manner, it is possible to form on the film the electronic circuit device having the very thick metal layer or the very thick wiring generated by treating the metal layer.

As shown in FIG. 25, the resin film is prepared, cleaned and made rough, and further cleaned and dried. Then, the electroless plating is performed on the thus-treated resin layer. It is cleaned. Then, the metal layer having the sufficient thickness is formed thereon by using the electrolytic plating.

For example, the metal layer formed by using this electrolytic plating can have a thickness between about 50 and 100 microns. The component on which the electrolytic plating is performed is dried and made into a direct product as shown in FIG. 25, or sent through other processes to form the electronic circuit device or the intermediate unit of the electronic circuit device.

As explained above, even if the process of treating the resin film is included in any one of a series of processes in FIG. 25, the manufacturing process is included in this embodiment. In general, the process of structure the resin film is included between the process of preparing the resin film and the next process of cleaning the resin film. However, it is not always limited to that included in this portion.

A tenth embodiment will be described below. In the tenth embodiment, the conductive layer consisted of copper and inevitable impurity is formed directly on the rough surface of the resin with the electroless plating. After that, the metal layer having the predetermined thickness is formed with the electrolytic plating, to the conductive layer as the base layer.

As mentioned above, it is difficult to directly form the copper on the resin layer. This results from the surface situation based on the physical properties of both the materials of the resin layer and the copper, the thermal expansion coefficients of both the materials and the like.

Thus, a series of inventions of the inventor et al. is the optimal method to form on the resin layer the metal layer especially consisted of the copper and the inevitable impurity, if the metal layer is directly formed on the resin layer.

In this embodiment, the metal layer formed by using the electrolytic plating to the conductive layer formed by the electroless plating as the base layer may be consisted of the copper and the inevitable impurity. Or, the conductive layer serving as the base layer may be consisted of the copper and the inevitable impurity and another material is used as the metal layer. In any case, the copper and the inevitable impurity can be selected as the material layer directly formed on the resin.

As mentioned above, this embodiment is a laminated film in which the metal layer is directly laminated on the resin layer without the intervention of the adhesive layer, and the surface of the resin layer is roughed to the predetermined surface roughness. Especially, the inventor discovers that the sandblasting serving as the dry blasting or the wet blasting in the sandblasting is optimal for the roughing process. FIG. 71 shows a table showing the comparison with another manufacturing process, which comes to the conclusion in which the dry blasting or the wet blasting is the optimal method.

As shown in FIG. 71, the results of an inverse sputter in a so-called sputtering apparatus, a plasma etching, a wet etching, the dry blasting and the wet blasting constituting this embodiment are compared with each other. The inverse sputter is not desirable since the surface is made slightly rough and it is entirely smooth. In the plasma etching, only the whole is uniformly etched, and the surface is smooth as a result, and thereby the predetermined surface roughness in this embodiment can not be obtained. Also in a case of the wet etching, it is merely smoothly fused, and thereby the predetermined surface roughness in this embodiment can not be ensured.

On the other hand, in a case of the dry blasting in the sandblasting, the surface can be treated relatively rough although it is not uniform. Thus, the surface roughness suitable for the dry blasting is especially in the range between about 5 and 10 microns. In a case of the wet blasting, the surface of the resin layer can be treated smoothly and finely. Hence, the wet blasting is optimal for the insurance of the surface roughness especially in the range between 1 and 5 microns. The result of the comparison and consideration between the above-mentioned five methods comes to the conclusion that the dry blasting or the wet blasting is optimal in order to make the surface of the resin layer rough, in this embodiment.

The properties of the resin structures noted in the respective embodiments are explained. The tensile strength between the plated metal layer and the resin is 2.0 kN/m or more. Moreover, there is no strip of the metal layer even in the soldering process at 300° C. for about 60 seconds.

An eleventh embodiment will be described below. The eleventh embodiment implies an electronic circuit device including resin substrate and wiring formed on the resin substrate. The resin substrate is the electronic circuit device in which a surface roughness of a conjunction boundary to the wiring ranges between 1 and 5 microns.

In this embodiment, the surface roughness of the conjunction boundary to the wiring in the resin substrate is made sufficiently rougher than that of the usual type. Thus, the adhesive strength between the wiring and the resin substrate is sufficiently high. Moreover, accordingly, the electroless plating can be performed directly on the resin substrate in the wiring treating process.

Figure 26A:
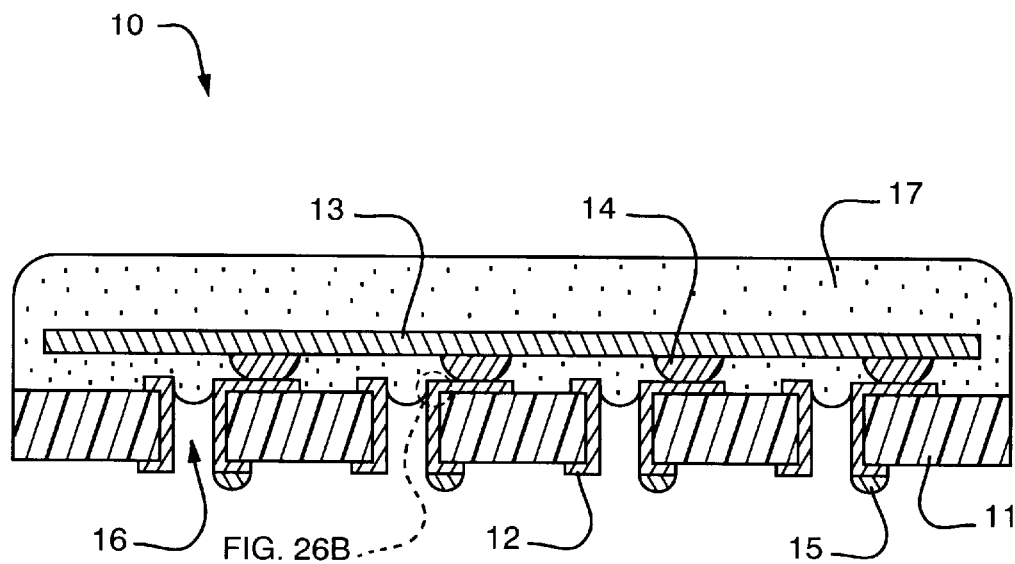
FIG. 26A is a side section view showing an eleventh embodiment in the present invention.
Figure 26B:
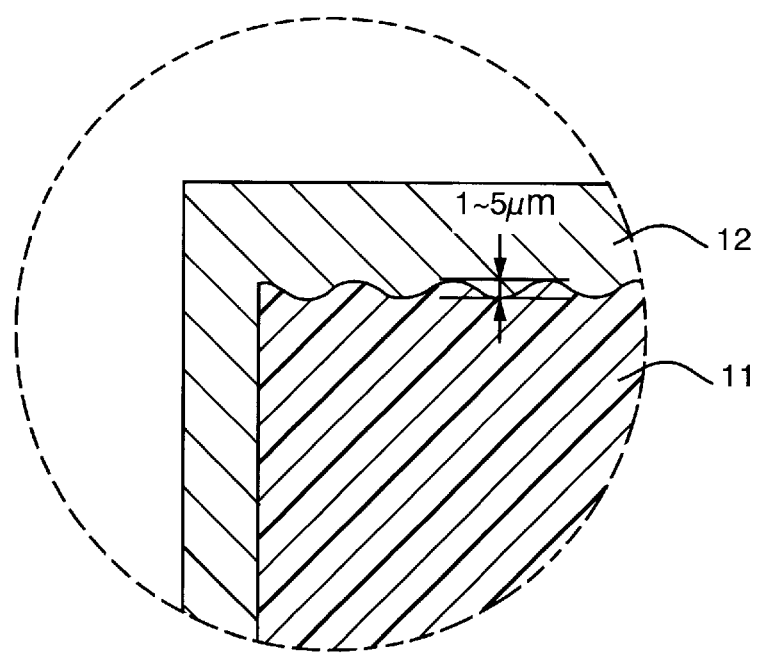
FIG. 26B is an enlarged section view of a part of FIG. 26A.

FIGS. 26A and 26B show a case in which an electronic circuit device 10 in this embodiment is a so-called semiconductor device. Resin substrates 11 in this electronic circuit device 10 are located in the portions indicated by the slant lines of FIGS. 26A and 26B. Wirings 12 are provided on the resin substrates 11. Above the wiring 12, an IC chip 13 is arranged and bonded to the wiring 12 on the resin substrates 11 through bump electrodes 14. Soldering bumps 15 for outer terminals are formed on rear sides of the resin substrates 11 to thereby form the electronic circuit together with an outer electronic circuit.

As can be seen from FIGS. 26A and 26B, in the surface portion of the resin substrate 11, the conjunction boundary to the wiring 12 has a surface roughness between 1 and 5 microns, as can be seen from the enlarged view of FIG. 26B. In general, the surface roughness of the resin substrate used in such printed circuit board is about several thousands of angstroms at the most. In this embodiment, this surface roughness is set to 0.1 microns or more and 10 microns or less.

Setting the surface roughness to 1 micron or more and 5 microns or less in this way enables the adhesive strength between the wiring formed on the surface of the resin substrate as mentioned above and the surface of this resin substrate to be higher. Accordingly, the wiring density of the wiring formed on this resin substrate at its maximum, namely, the inter-wiring distance, or the wiring pitch can be made very higher. The stronger adhesive strength between the surface of the resin substrate and the wiring formed on the resin substrate prevents the wiring from being stripped from the resin substrate, even if somewhat thermal stress is generated between the surface and the wiring. By the way, the wiring in this embodiment typically includes an electrode such as a merely bonding land, in addition to the wiring having a predetermined length.

FIG. 26A is further explained. This wiring 12, namely, the electrode is bonded to the bump electrode 14 of the IC chip 13, on the bonding ground formed on a through-hole 16 of the resin substrate 11 with the plating. The IC chip 13 is sealed with a seal resin 17 so as to be integrated with the upper portion of the resin substrate 11, and thereby the environment resistance of the IC chip 13 is kept. A bonding section 15 to the outer circuit is integrated with the plating formed on the through-hole 16 in FIG. 26A, and formed on the rear side of the resin substrate 11. In addition, an outer electrode (not shown) can be formed on a portion other than the bump electrode 14, by a conductive land provided through the through-hole 16.

Figure 27A:
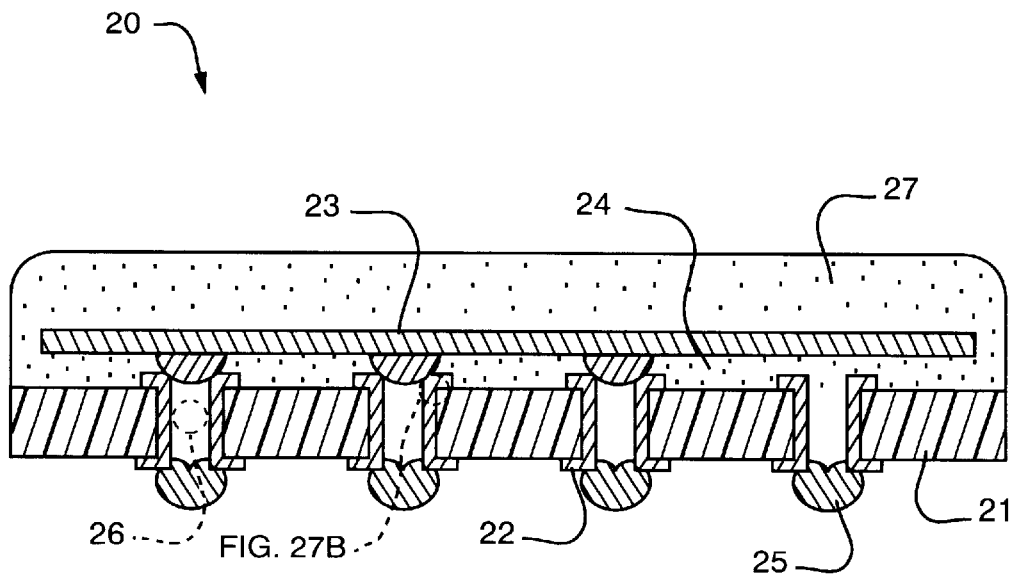
FIG. 27A is a side section view showing a variation of the eleventh embodiment.
Figure 27B:
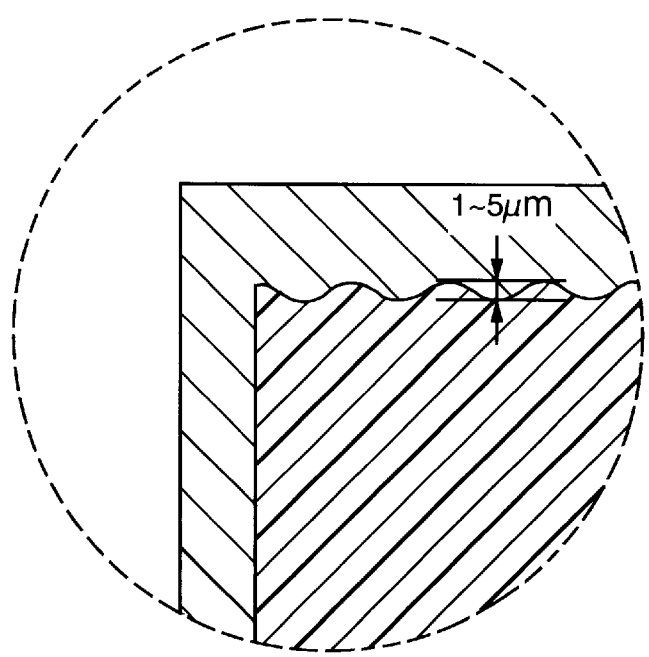
FIG. 27B is an enlarged section view of a part of FIG. 27A.

FIGS. 27A and 27B are another embodiment in this embodiment. As shown in FIG. 27A, a bump electrode 24 of an IC chip 23 is directly bonded onto the plating formed on an edge of a through-hole 26 of a resin substrate 21. Moreover, a soldering bump 25 for an outer terminal is directly formed on an electrode of the plating formed on an edge of the through-hole 26 of the resin substrate 21. Although such formation structure is disadvantageous in stress, it enables the miniaturization as a whole. By the way, the surface roughness of the conjunction boundary to the wiring in the resin substrate is 0.1 microns or more and 10 microns or less, similarly to FIG. 26B, even in the case of FIG. 27B.

Figure 28A:
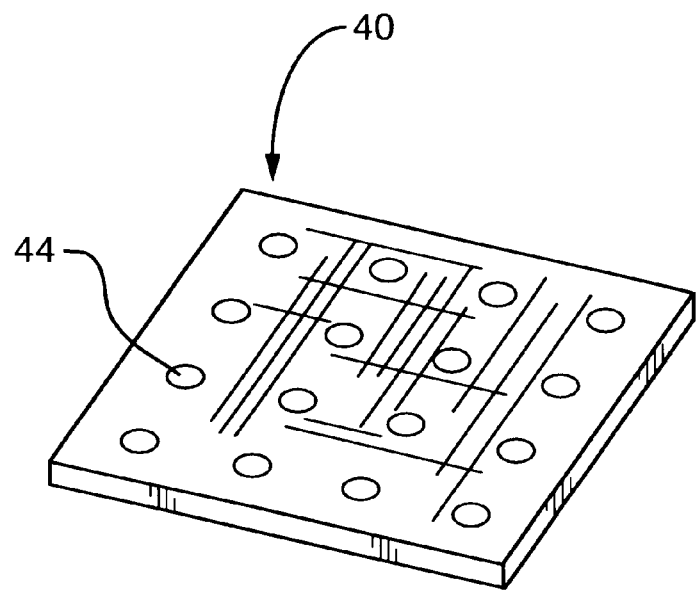
FIG. 28 is a view showing a manufacturing process of the eleventh embodiment.
Figure 28B:
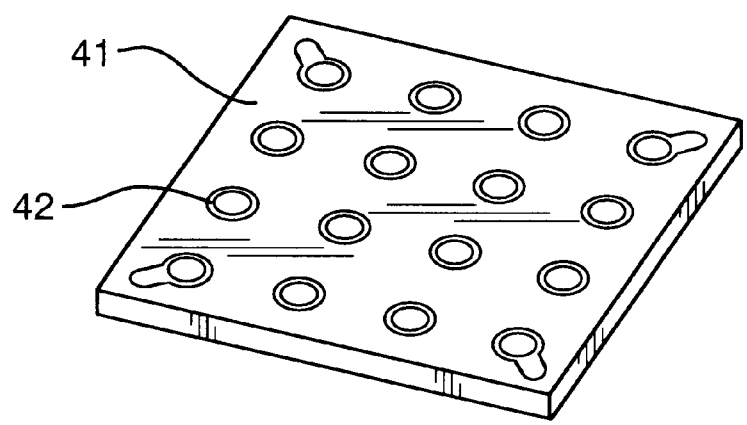

FIG. 28 shows a situation that an IC chip 40 is placed on a resin substrate 41. A gold-plated bump electrode 44 having a height of about 5 to 30 microns is formed on a rear side (that is, a front side in a manufacturing process) of the IC chip 40, with a bump plating. This bump electrode 44 and a wiring 42 (namely, an electrode and the like) including a plated section formed on a through-hole portion on the resin substrate 41 are overlapped with each other, and thermally pressed and adhered to each other. Accordingly, the IC chip 40 can be placed on the resin substrate 41.

At this time, the IC chip and the metal material serving as the wiring material and the resin substrate are different in thermal expansion coefficient from each other. Thus, when a temperature is increased, the whole resin substrate on which this IC chip is placed becomes in a high temperature, especially if this IC chip has a large output even if it is MPU or the like. Hence, the high reliability can be ensured since the wiring formed on this resin substrate, namely, the electrode from being stripped from this resin substrate, also by the difference between the thermal expansion coefficients in such high temperature situation.

Figure 29A:
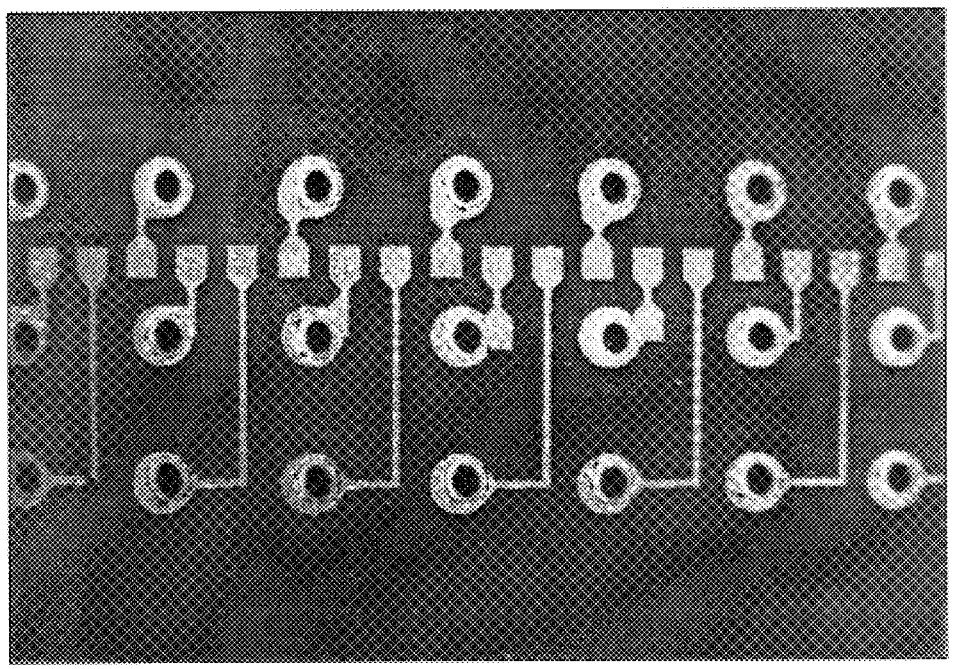
FIG. 29A is a photo showing the eleventh embodiment.
Figure 29B:
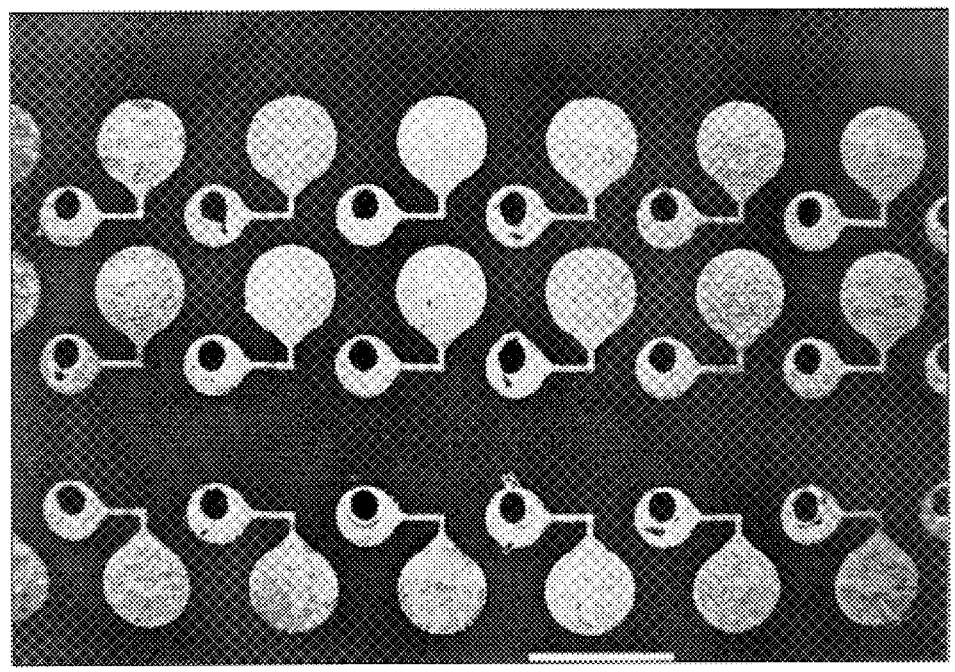
FIG. 29B is a photo showing the eleventh embodiment.

FIGS. 29A and 29B are photos of a product in this embodiment. Black circle portions shown in FIGS. 29A and 29B are the through-holes or the via-holes. After the plating is performed on these portions, the wiring is provided, and the bonding ground is formed for the bonding connection or the direct connection to the IC chip and the like. Moreover, it is possible to form at such a fine pitch to thereby miniaturize the electronic circuit device as a whole.

In the electronic circuit device in this embodiment, the resin substrate is formed of any one or more materials of a group consisted of epoxy resin, polymethyl pentene, polyphenylene ether, aromatic, polyamide, polyacetal, polyetheramide, polyethylene terephthalate, polyebutylene naphthalate, liquid crystal polyester, polyarylate, polyimide, polyamideimide, polyetheretherketone, polyphenylene sulfite, liquid crystal polymer, fluorocarbon resin, polysulfone, polyethersulfone, polyamide 46, polyethylene naphthalate, polyebutylene terephthalate and aromatic polyester. The reason why this material is selected is as described above.

A twelfth embodiment will be described below. This is a method that manufactures an electronic circuit device in which wiring is formed on resin substrate. The method includes providing resin substrate, treating the surface of the resin substrate with the sandblasting so that a surface roughness thereof ranges between 0.1 and 10 microns, and forming a conductive member serving as the wiring on the treated surface of the resin substrate with the electroless plating. Here, the reason why the sandblasting is used is as mentioned above.

A thirteenth embodiment will be described below. This is a method that manufactures an electronic circuit device in which wiring is formed on resin substrate. The method includes providing the resin substrate, treating the surface of the resin substrate with the sandblasting so that a surface roughness thereof ranges between 0.1 and 10 microns, forming a conductive member on the treated surface of the resin substrate with the electroless plating, and forming the wiring by performing the electrolytic plating to the formed conductive member as a base layer.

In this embodiment, the surface of the resin substrate is treated with the sandblasting. Thus, the conductive member can be formed on the surface with the electroless plating. Typically, since the surface of the resin substrate is equal to or less than 0.1 microns and the surface is smooth, the electroless plating can not be formed on the surface. Moreover, even if the electroless plating can be formed, the adhesive strength between the conductive member formed with the electroless plating and the surface of the resin substrate is very weak, which frequently causes the trouble of the strip under utilization or during the treating process.

In this embodiment, it is achieved for the first time that the electroless plating is performed on the surface of the resin substrate by treating the surface of the resin substrate to 0.1 microns or more and 10 microns or less with the sandblasting. Thus, it is not required to use the vacuum apparatus to form the base layer for the plating. Accordingly, a large amount of investment is not necessary for a so-called manufacturing facility. Hence, the electronic circuit device can be manufactured at a very cheap cost.

Figure 30A:
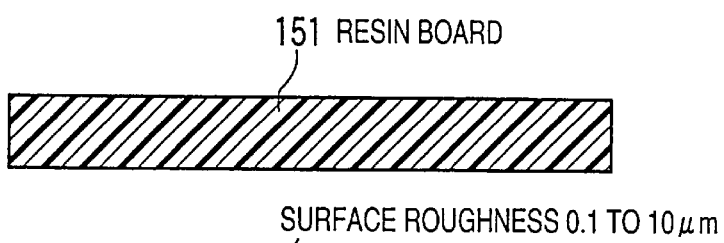
FIG. 30A is a view showing a manufacturing process of a thirteenth embodiment in the present invention.
Figure 30B:
FIG. 30B is a view showing a manufacturing process of a thirteenth embodiment in the present invention.

FIGS. 30A to 30E and FIGS. 31A to 31F show a thirteenth embodiment. At first, a resin substrate 151 is prepared in advance, as shown in FIG. 30A. Since this surface of the resin substrate 151 is smooth, the electroless plating can not be performed directly on this surface. Next, the surface treatment is done to perform the electroless plating, as shown in FIG. 30B. That is, the surface treatment is carried out such that the surface roughness ranges between 0.1 and 10 microns with the sandblasting.

Figure 30C:
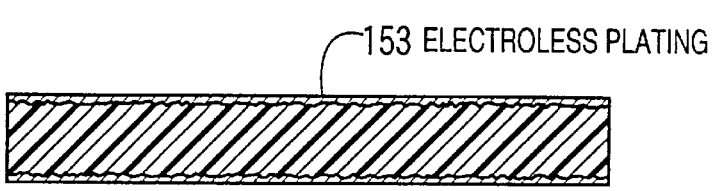
FIG. 30C is a view showing a manufacturing process of a thirteenth embodiment in the present invention.
Figure 30D:
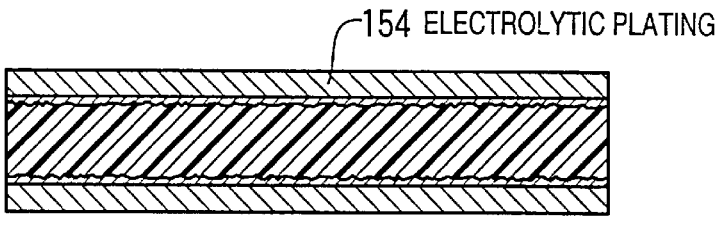
FIG. 30D is a view showing a manufacturing process of a thirteenth embodiment in the present invention.
Figure 30E:
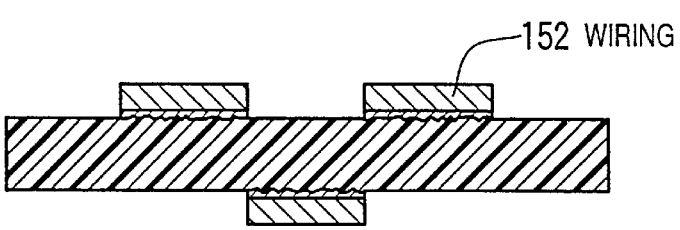
FIG. 30E is a view showing a manufacturing process of a thirteenth embodiment in the present invention.

If the surface is treated with the sandblasting so that the surface roughness ranges between about 0.1 and 10 microns, an electroless plating 153 can be directly formed on the resin substrate 151, as shown in FIG. 30C. In this way, the formation of the electroless plating 153 enables an electrolytic plating 154 serving as a wiring body to be easily formed on the electroless plating 153. After that, the electrolytic plating 154 may be treated as a wiring 152, as shown in FIG. 30E.

Figure 31A:
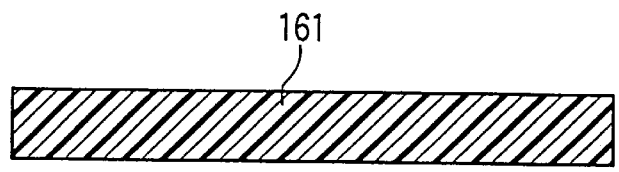
FIG. 31A is a view showing a manufacturing process of the thirteenth embodiment.
Figure 31B:
FIG. 31B is a view showing a manufacturing process of the thirteenth embodiment.
Figure 31C:
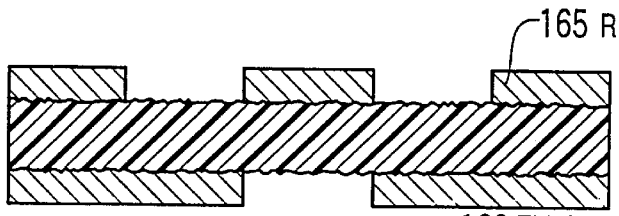
FIG. 31C is a view showing a manufacturing process of the thirteenth embodiment.
Figure 31D:
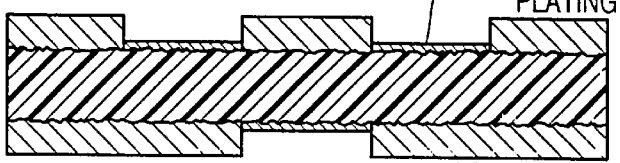
FIG. 31D is a view showing a manufacturing process of the thirteenth embodiment.
Figure 31E:
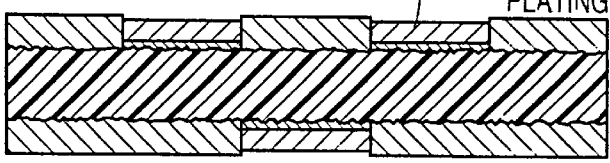
FIG. 31E is a view showing a manufacturing process of the thirteenth embodiment.
Figure 31F:
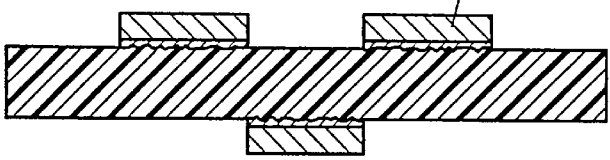
FIG. 31F is a view showing a manufacturing process of the thirteenth embodiment.

FIGS. 31A to 31F show another example. A resin substrate 161 is prepared as shown in FIG. 31A. This surface is treated with the sandblasting so that a surface roughness thereof ranges between 0.1 and 10 microns (FIG. 31B). Next, the portion where the electrolytic plating is not necessary is covered by a resist 165 (FIG. 31C). Next, an electrolytic plating 164 is performed on the conductive layer (FIG. 31D) including the electroless plating 163 as the base layer for plating (FIG. 31E). Then, the unnecessary resists 165 and the base layers are removed, and accordingly, wirings 162 are completed.

In this embodiment, the relatively thin conductive layer serving as the base layer for plating can be formed with the electroless plating, instead of the conventional vaporizing or sputtering method. It can be achieved by the sandblasting to make the surface of the resin substrate rough. Incidentally, this point is similar to that of the twelfth embodiment.

As the twelfth embodiment, for example, the wiring can be treated only with the electroless plating. In this way, if the wiring is treated only with the electroless plating, the plating can be directly formed on the resin substrate, similarly to the thirteenth embodiment. Thus, it is not necessary to use the vacuum apparatus. Hence, the electronic circuit device can be manufactured at a low cost without a large amount of facility investment.

A fourteenth embodiment will be described below. This is a method that manufactures an electronic circuit device in which wiring is formed on resin substrate. The method includes providing the resin substrate, forming through-holes and/or via-holes in the resin substrate, and treating the surface of the resin substrate and the inner surfaces of the through-holes and/or the via-holes with the sandblasting so that a surface roughness of the surface of the resin substrate and the inner surfaces of the through-holes and/or the via-holes ranges between 0.1 and 10 microns.

Figure 32A:
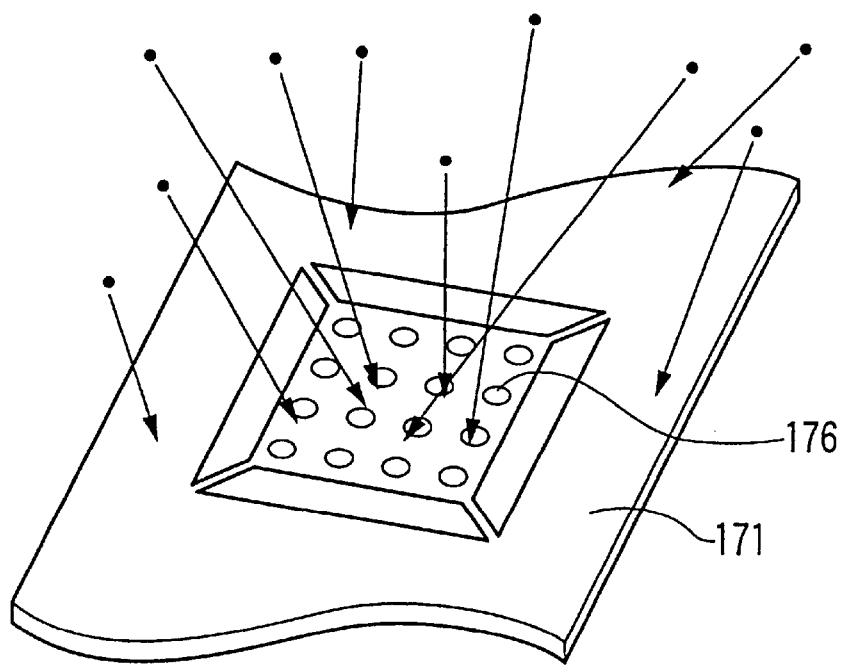
FIG. 32A is a view showing a manufacturing process of a fourteenth embodiment in the present invention.

As shown in FIG. 32A, a resin substrate (resin film) 171 is in advance treated to such a shape that IC and the like can be provided on the resin substrate 171. The surface of the resin substrate 171 is treated with the sandblasting so that a surface roughness thereof ranges between 0.1 and 10 microns. At this time, the shape on which the IC can be provided implies that a through-hole 176 to form an outer connection terminal can be formed at a necessary portion, for example, if this resin film is used as the interposer.

Typically, the through-hole is formed with a drill in a case of the printed circuit board. Or, it is formed with a laser in a case of the resin film. The micro through-hole can be treated extremely easily with the laser. A diameter of the through-hole formed in that case ranges between about 10 and 100 microns. Then, micro particles are collided against the above-treated surface of the resin substrate with the sandblasting, as mentioned above. This surface is treated to the predetermined surface roughness.

Figure 32B:
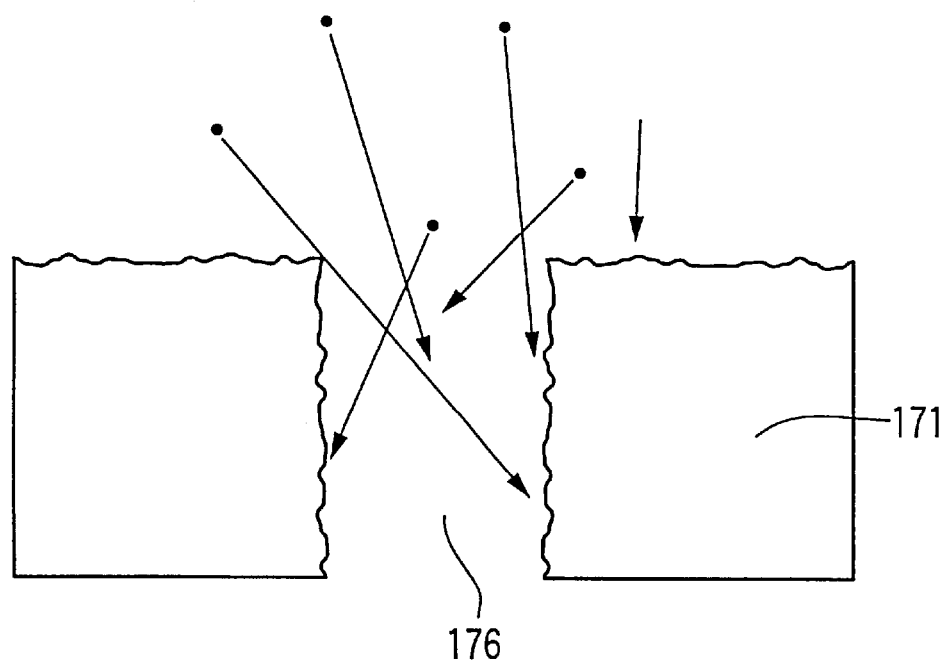
FIG. 32B is an enlarged side view of a part of FIG. 32A.

The via-holes and the through-holes are already formed, at this time. Thus, the inner surfaces of the via-holes and the through-holes are simultaneously treated with this sandblasting. FIG. 32B shows this situation in detail. If not only the surface of the resin substrate but also the inner surfaces of the through-holes 176 and the via-holes are treated, of course, a particle diameter of a grinding particle of the sandblasting (a particle diameter of a micro particle) must be smaller than the diameters of the through-holes or the via-holes. This sandblasting method may be the wet blasting as well as the dry blasting.

The reason why the inner surfaces of the through-holes and the via-holes are treated to the predetermined surface roughness is the same purpose as the treatment of the surface of the resin substrate to the predetermined surface roughness, as already explained in the above-mentioned embodiments. That is, a series of electrical wiring referred to as IC interposer outer connection terminals must be formed, if the outer connection terminals are provided to mount the IC and then maintain the electrical connection to this IC and further connect to an external connection terminal as in the interposer. This electric wiring, that is, the electric wiring penetrating the interposer is formed with the through-holes or the via-holes.

Thus, the plating having the predetermined thickness as the wiring must be formed on the inner surfaces of the through-holes and the via-holes. Hence, the adhesive strength must be sufficiently high between the conductive materials in these portions, namely, the wiring and the resin substrate. Especially, thermal stress is frequently generated relatively to thermal change, in the case of the through-hole. Thereby, the through-hole conventionally has the very insufficient adhesive strength. As a result, conventionally, there may be a fear in which defective accidents sometimes occur even in a usual mass production process. In this point, the achievement of the manufacturing method according to this embodiment enables such quality troubles and the like to be surely dissolved for the first time.

A fifteenth embodiment will be described below. This is a method that manufactures an electronic circuit device in which wiring is formed on resin substrate. The method includes providing the resin substrate, forming through-holes and/or via-holes in the resin substrate, treating the surface of the resin substrate and the inner surfaces of the through-holes and/or the via-holes with the sandblasting so that a surface roughness thereof ranges between 0.1 and 10 microns, forming conductive members on the treated surface of the resin substrate and the treated inner surfaces of the through-holes and/or the via-holes with the electroless plating, and performing the electrolytic plating on the formed conductive material as the base layer to forme the wiring.

In the fifteenth embodiment, the surface of the resin substrate serving and the inner surfaces of the through-holes or the via-holes as base material are treated by employing any optimal method of the sandblasting, namely, the dry blasting and the wet blasting so that a surface roughness thereof ranges between 0.1 and 10 microns. Next, the electroless plating is performed on the portion having the surface roughness to thereby form the base layer for the electrolytic plating. Thus, the electronic circuit device can be manufactured without the vacuum apparatus.

In the electronic circuit device manufactured as mentioned above, the surface of the resin substrate is rough as mentioned above. Thus, the adhesive strength is high between the resin substrate and the wiring formed thereon. Moreover, it is strong against the thermal stress resulting from the thermal cycle and the thermal change. A resin substrate 181 is prepared as shown in FIG. 33A. Through-holes 186 or the via-holes are formed as shown in FIG. 33B. A base electroless plating 184 is performed on the surface of the resin substrate 181 and the inner surfaces of the through-holes 186, as shown in FIG. 33C. A resist 185 is provided, as shown in FIG. 33D. A wiring body 182 is formed with the resist as a barrier as shown in FIG. 33E. Then, the unnecessary resists and the base layers are removed, and accordingly, the electronic circuit device is completed.

A sixteenth embodiment will be described below. In the fifteenth embodiment, the conductive member formed by the electroless plating is consisted of copper and inevitable impurity. Various materials can be used for the conductive member formed by the electroless plating, for example, the conductive member used as the base layer for the electrolytic plating performed in the later process as in the already-explained embodiments. In this case, the copper is optimal in view of an electric conductivity and a cost.

Conventionally, the copper is the especially difficult material when the electroless plating is performed on the surface of the resin substrate. Thus, the sixteenth embodiment intends to achieve the manufacturing process that can not be achieved up to now. It is possible to achieve the manufacturing method with a low cost and an electronic circuit device with a high reliability.

A seventeenth embodiment will be described below. This is an electronic circuit device provided with resin substrate and wiring formed on the resin substrate. In the resin substrate, a surface roughness thereof ranges between 0.1 and 10 microns. The electronic circuit device is used as the interposer. The interposer was already explained in the above-mentioned embodiments. Thus, it is not necessary to especially explain the interposer. The point to be especially emphasized in the seventeenth embodiment is as follows. That is, the resin substrate is used as the interposer. Hence, when the IC chip and this interposer are adhered to each other by using the adhesive, the adhesive strength is very strong between this adhesive and the surface of the resin substrate serving as the interposer.

Figure 34:
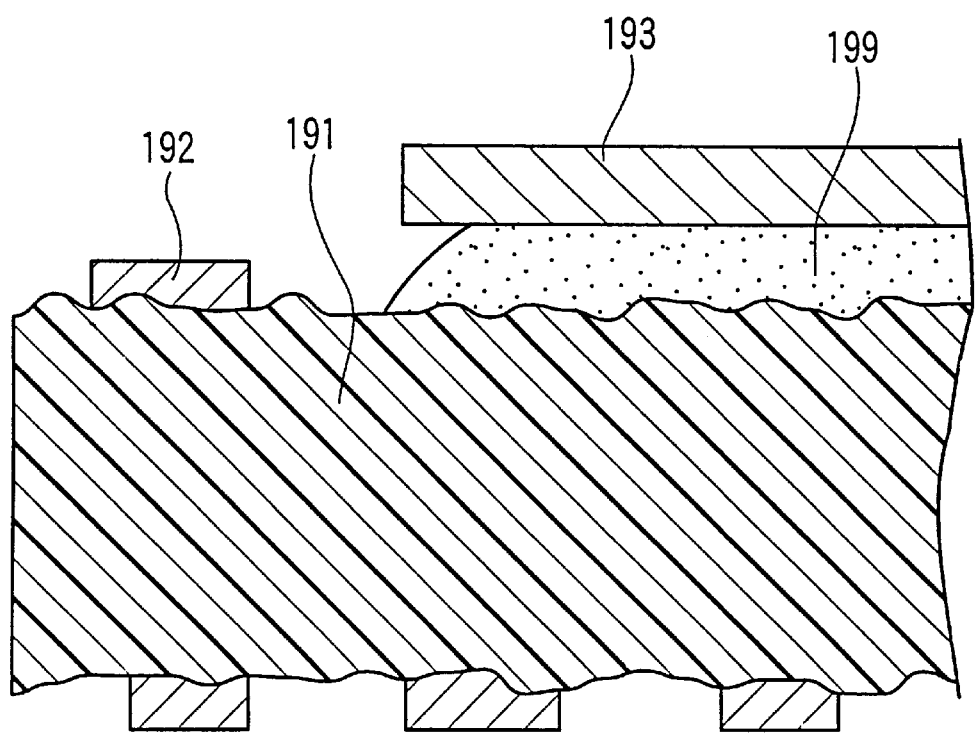
FIG. 34 is a side view showing a seventeenth embodiment in the present invention.

As shown in FIG. 34, the surface of a resin substrate 191 is treated such that a surface roughness thereof ranges between 0.1 and 10 microns. A wiring 192 is formed on the thus-treated surface by using a method peculiar to this embodiment. The adhesive strength between this wiring 192 and the surface of the resin substrate 191 is extremely strong as mentioned above. Moreover, the point to be especially emphasized in this embodiment is that the adhesive strength between an adhesive 199 and the surface of the interposer is high when an IC chip 193 is bonded to this interposer.

The IC chip is mounted in the interposer, and finally sealed with resin to be used. At this time, the IC chip is surely fixed on the interposer, as one condition of the high reliability in this apparatus. The surface roughness of the surface of the resin substrate serving as the interposer is treated as mentioned above, in this embodiment, from that viewpoint. Thus, the area into which the adhesive permeates can be wide to thereby ensure the very high adhesive strength. Hence, the present invention can minimize the trouble that the IC chip is stripped from the boundary between the adhesive and the interposer.

An eighteenth embodiment will be described below. This is an electronic circuit device in which wiring is formed on resin substrate. A surface roughness of the resin substrate ranges between 0.1 and 10 microns. The wiring includes inductor. The electronic circuit device is used as the interposer. Merits peculiar to this embodiment will be described below.

The merit is that the electronic circuit device functions as the interposer and simultaneously includes the inductor in the interposer. Presently, the treatment and the design of IC, MPU and the like are made extremely sophisticated. Thus, a large number of electronic parts can be provided therein. However, it is still impossible or very difficult to mount on the IC device the inductor with sufficient performance. From this standpoint, if the inductor can be provided on the interposer as in this embodiment, it is possible to substantially obtain the effect similar to the case in which the inductance is actually provided in the IC. It is also possible to miniaturize the apparatus as a whole to thereby achieve the inductor with high reliability.

Figure 35:
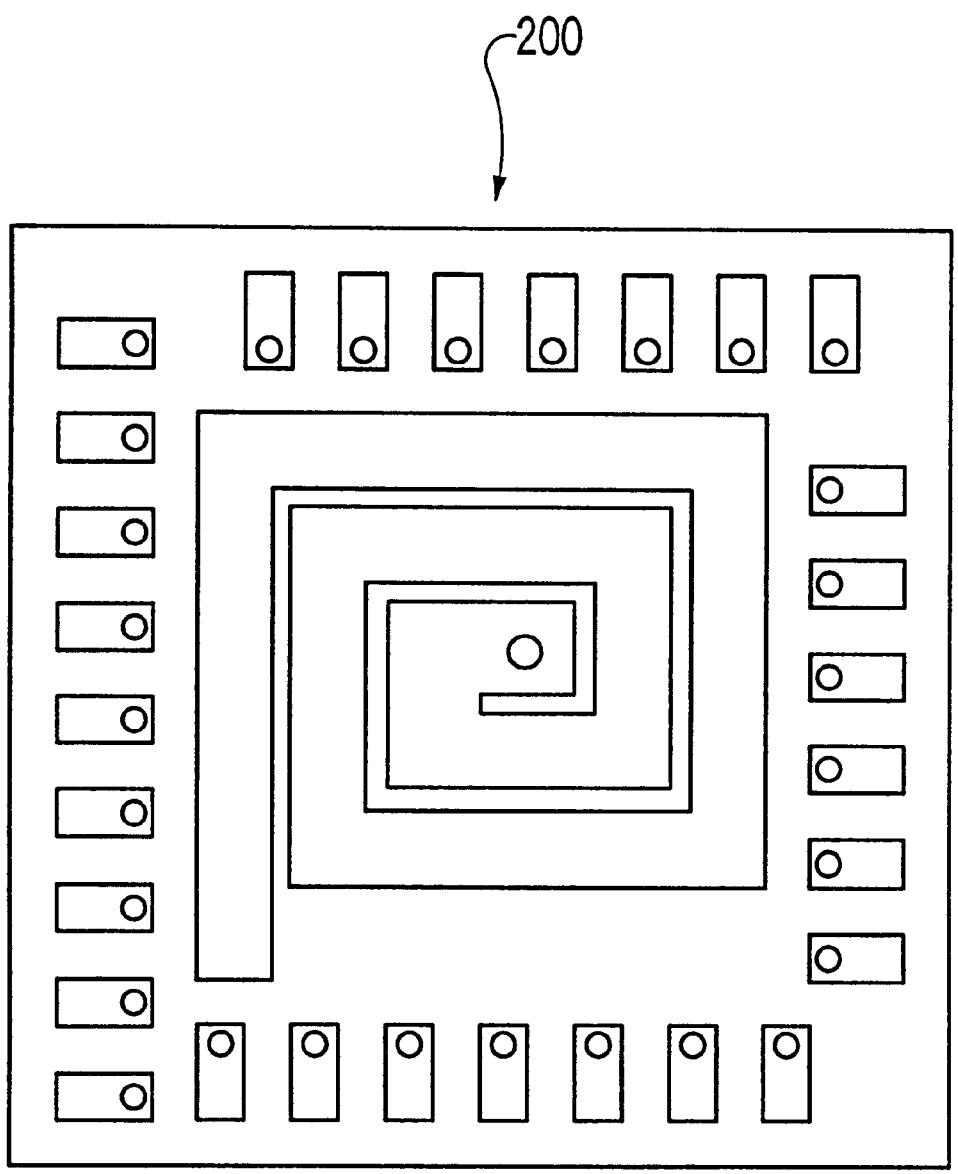
FIG. 35 is a plan view showing an eighteenth embodiment in the present invention.

Since the inductor is usually generated as a very long wiring, it is originally weak against the thermal stress. In this embodiment, the sufficient adhesive strength can be obtained if the inductor as the wiring is formed on the surface in which the surface roughness ranges between 0.1 and 10 microns, in the resin substrate. Thus, even in a case of the inductor having the long overall length, it is not stripped by the thermal stress. FIG. 35 shows an electronic circuit device 200 having the above-mentioned structure.

Figure 36:
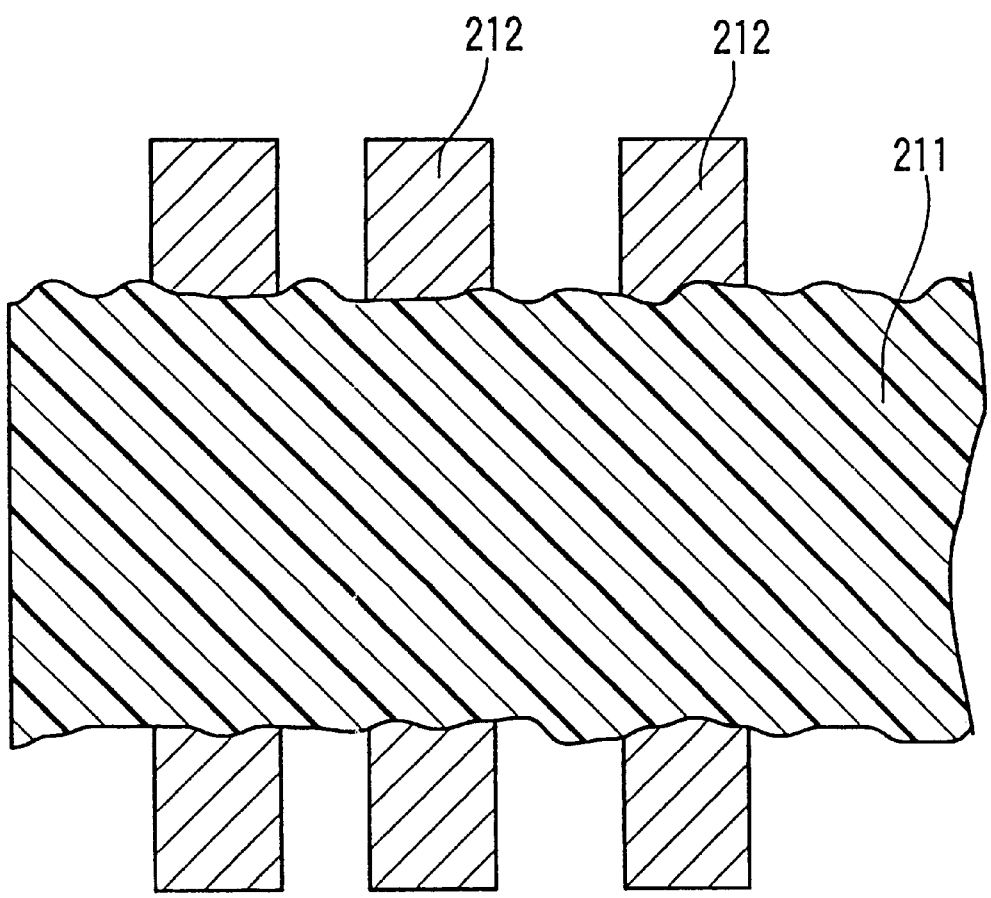
FIG. 36 is a view showing a side view of the eighteenth embodiment.

Another merit of using the inductor in this embodiment will be described below with reference to FIG. 36. If the surface roughness of the surface of a resin substrate 211 has the above-mentioned value and the adhesive strength between the surface of the resin substrate 211 and a wiring 212 is sufficiently high, an interval between the wirings 212 can be made narrower to thereby make a pitch between the wirings narrower, as shown in FIG. 36. This is not only the merit in the typical wiring, but also the especially large merit, as described below, if the inductor is formed on the interposer by this wiring, as in this embodiment.

The shorter the distance between the wirings and the smaller the pitch between the wirings, the higher the inductance can be achieved. Thus, if the interposer in which the surface roughness of the resin substrate has the above-mentioned value includes the inductor as the wiring as in this embodiment, the inductor can be integratedly formed as the IC device. This can be substantially treated similarly to the case in which the inductor is actually provided in the IC device. Moreover, the inductor with the high reliability and the high function can be achieved due to the above-mentioned points in this embodiment.

The background of the nineteenth embodiment will be described below.

The high dense structure has been developed more and more, especially in recent years. Then, a so-called build-up type of wiring forming method has been promoted. And, a build-up multiple-layer circuit board has been used in many cases.

High dense parts can be provided in the build-up type of multiple-layer circuit board. It has been used more and more in many cases in conjunction with the recent employment of a high dense package, such as BGA, CSP and the like. The employment of a roll lamination type of build-up system for public utilization can satisfy the necessary items for a low cost.

Figure 37:
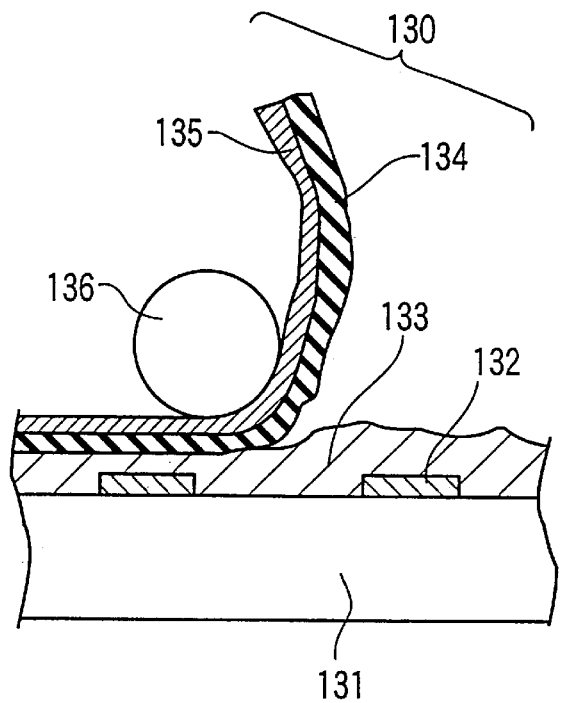
FIG. 37 is a view showing a roll lamination type manufacturing method with regard to background technique of a nineteenth embodiment in the present invention.

Here, the conventional build-up multiple-layer circuit board is described. FIG. 37 shows a part of a process for manufacturing the conventional build-up multiple-layer circuit board. A build-up multiple-layer circuit board 130 is constituted by sequentially laminating a circuit wiring 132 and an insulation layer on one surface or both surfaces of a core board 131. A roll lamination type manufacturing method shown in FIG. 37 has been employed, in recent years, from the request of the low cost, as mentioned above. As shown in FIG. 37, a first layer circuit wiring 132 is provided on the core board 131, and an undercoat material 133 is coated on the core board 131 and the circuit wiring 132. An insulation sheet 134 on which a copper foil 135 is formed is pasted on the portion on which the undercoat material 133 is coated, by using a thermal roll 136.

After the element in which the copper foil is pasted on the insulation sheet is piled on the core board, the etching is carried out such that this copper foil becomes the circuit pattern to then form a second layer circuit wiring. After the formation of the second layer circuit board, the undercoat material is similarly coated thereon. Then, this is properly chemically treated. The insulation sheet on which the copper foil is similarly pasted is laminated on the chemically treated element. The sequential repetition enables a third layer and a forth layer to be formed.

Figure 38:
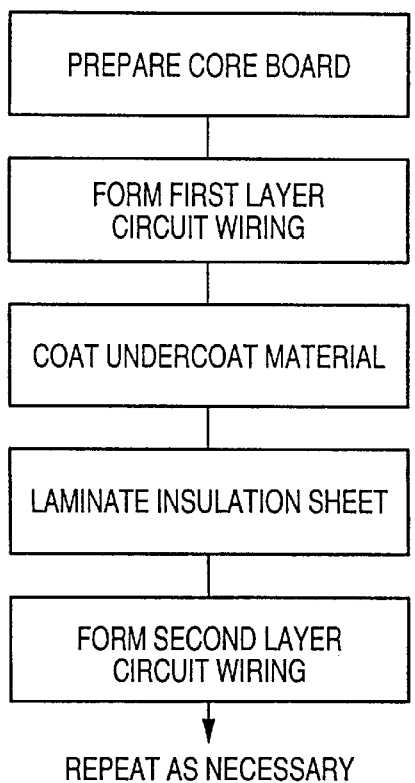
FIG. 38 is a view showing a manufacturing process of the background technique of the nineteenth embodiment.
Figure 39:
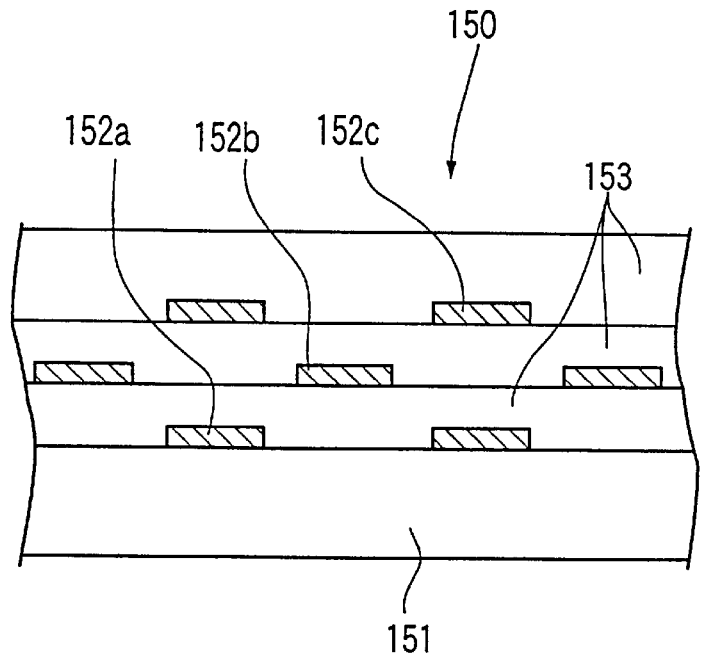
FIG. 39 is a section view showing an example of the background technique of the nineteenth embodiment.

FIG. 38 simply shows this process. The build-up multiple-layer circuit board is manufactured by preparing the core board and laminating in turn the circuit wiring on the insulation sheet on the core board. FIG. 39 shows an example of a build-up multiple-layer circuit board 150 manufactured as mentioned above. A first layer circuit wiring 152a is formed on a core board 151. A second layer circuit wiring 152b is formed through an insulation layer 153 on the first layer circuit wiring 152a. A third layer circuit wiring 152c is formed through the insulation layer 153 on the second layer circuit wiring 152b.

Figure 40:
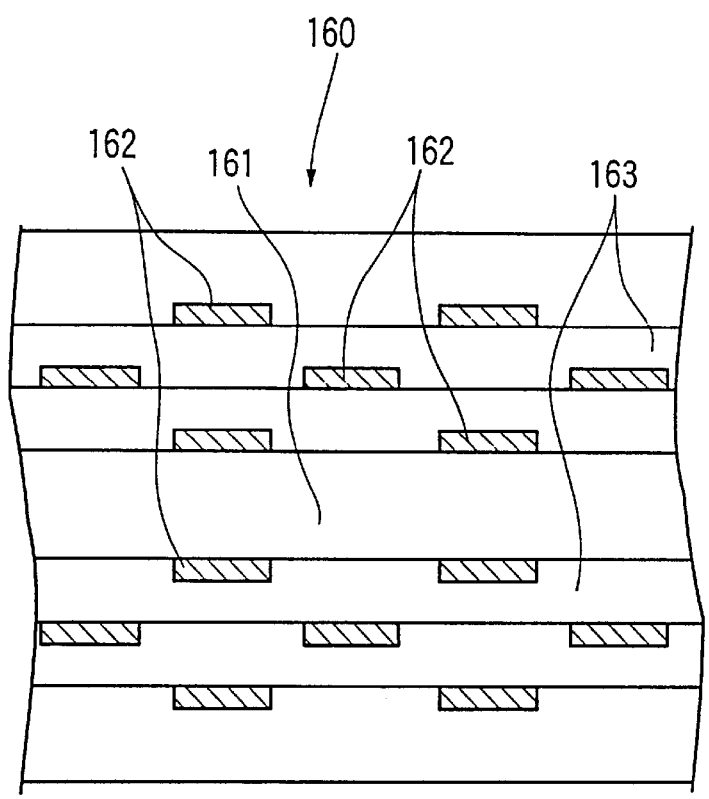
FIG. 40 is a section view showing another example of the background technique of the nineteenth embodiment.

FIG. 40 shows the case in which a circuit wiring 162 and an insulation layer 163 are build up in a form of multiple-layer on both sides of a core board 161, by using the similar method. In a build-up multiple-layer circuit board 160, the high dense circuit wiring can be constituted by sequentially laminating the insulation layer and the circuit wiring on one side or both sides of the core board as mentioned above. Accordingly, this can provide the multiple-layer circuit board that is optimal for the high dense package, such as the BGA, the CSP and the like, which is used in many cases in recent years.

As mentioned above, the build-up multiple-layer circuit board has been manufactured especially in the roll lamination type and has been used in many cases, in recent years. However, this method has the following problems.

If the build-up multiple-layer circuit board is constituted in the roll lamination type, the multiple-layer is created by pushing the element, in which the copper foil is pasted on the insulation sheet, onto the undercoat material by using the thermal roll, as mentioned above. In this case, since the element is pushed onto the undercoat material by using the thermal roll, both the thermal stress and the bending stress are applied to the insulation sheet on which the copper-foil is formed. Thus, this process can not be carried out unless the adhesive strength between the copper foil and the insulation sheet is very high.

Figure 41A:
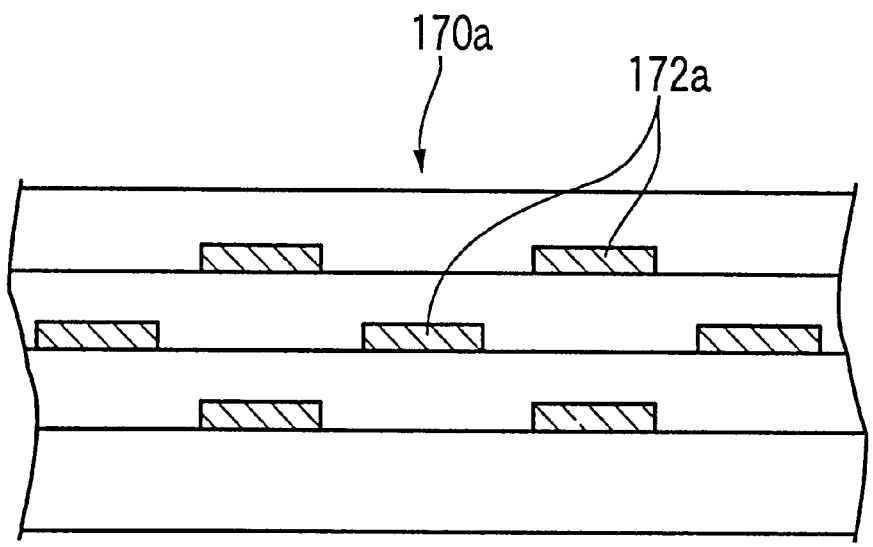
FIG. 41A is a section view showing a problem in the background technique of the nineteenth embodiment.
Figure 41B:
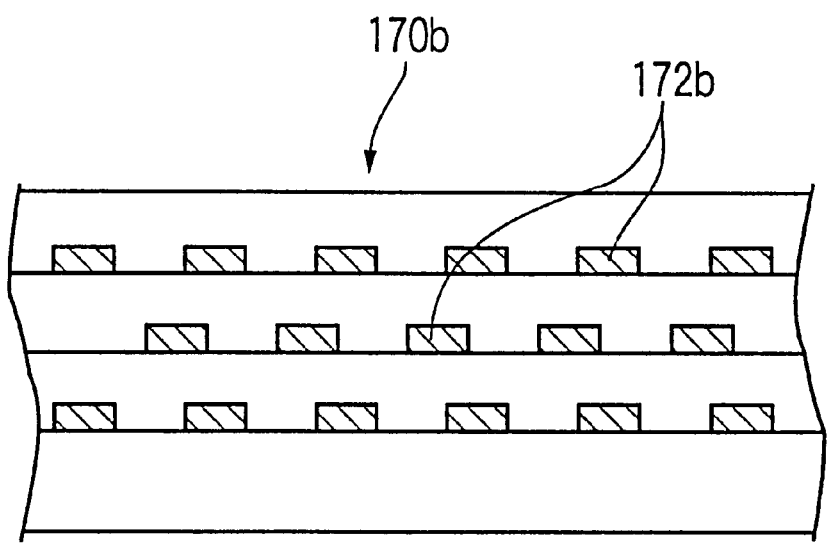
FIG. 41B is a section view showing a problem in the background technique of the nineteenth embodiment, together with FIG. 41A.

Thus, a method of thermally pressing and fitting the copper foil onto the insulation sheet and the like are usually used if the copper foil is formed on the insulation sheet. Hence, it is difficult to form the sufficiently thin copper foil on the insulation sheet. However, assuming that only the thick copper foil can be formed on such an insulation film, this results in a problem as shown in FIGS. 41A and 41B. FIG. 41A shows a build-up multiple-layer circuit board 170a formed in accordance with the roll lamination type by using, for example, a copper foil 172a. FIG. 41B shows a build-up multiple-layer circuit board 170b in which a circuit wiring 172b is formed on the insulation sheet by using another method, for example, any thin film forming technique.

As can be seen from the comparison between FIGS. 41A and 41B, in a case of the circuit wiring 172a including thick film, the film thickness is thick. Thus, the pitch between the wirings adjacent to each other can not be made narrower than a predetermined value. Hence, the thicker the thickness of the copper foil, the more difficult the patterning. Accordingly, the pattern pitch between the wirings adjacent to each other must be made wider. As the film thickness is thinner as in the circuit wiring 172b including thin film, the pattern pitch between the wirings adjacent to each other can be made narrower. This is the important factor in making the build-up multiple-layer circuit board denser. If the circuit wiring formed on the inner layer is thick, it is difficult to make that circuit wiring denser.

Figure 42:
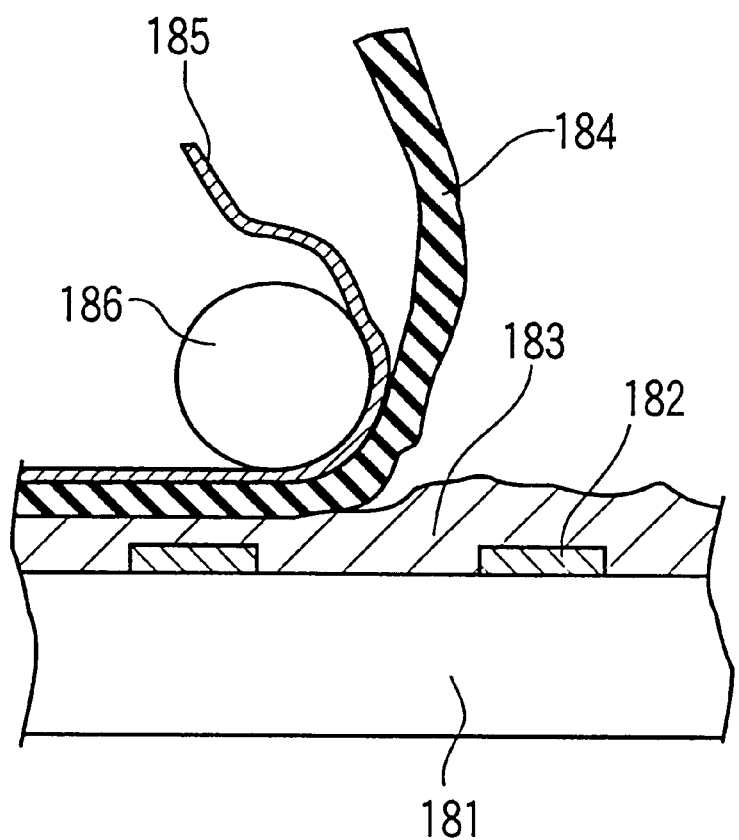
FIG. 42 is a side view showing a problem in the background technique of the nineteenth embodiment, together with FIGS. 41A and 41B.

As shown in FIG. 41B, tentatively, in order to create the circuit wiring from the thin film, if the thin copper foil is thermally pressed and fitted onto the insulation sheet and then the roll lamination is performed by the thermal roll, the adhesive property is made weaker. Thus, as shown in FIG. 42, the roll lamination performed on an undercoat material 183 by a thermal roll 186 causes the strip to occur between an insulation sheet 184 constituting a part of insulation layer and a metal layer 185 serving as a circuit wiring material having thin film.

From the above-mentioned viewpoints, when creating or manufacturing the build-up multiple-layer circuit board that has been especially used in many cases in recent years, it is necessary to thin the film of the inner layer wiring, namely, the circuit wiring constituting the multiple-layer circuit board. Simultaneously, it requires the adhesive property between the insulation layer and the metal layer constituting the circuit wiring, actually, the adhesive property between the insulation sheet and the metal layer.

As described above, this embodiment intends to solve those problems. Therefore, the object is to provide the element in which the thickness of the metal film constituting the circuit wiring in the build-up multiple-layer circuit board is thin and further the adhesive property to the insulation sheet or the insulation layer is strong.

A nineteenth embodiment will be described below. This is a build-up multiple-layer circuit board provided with a core board, wiring and insulation layer sequentially laminated on one surface or both surfaces of the core board. The insulation layer is formed of resin material. In the surface of the insulation layer, the surface is made rough to have the surface roughness of the value between 0.1 and 10 microns. So, in the build-up multiple-layer circuit board, metal layer serving as the wiring is directly formed on the rough surface of the insulation layer.

In this embodiment, the insulation layer on which the inner wiring, namely, the circuit wiring of the build-up multiple-layer circuit board is formed, is roughed to the surface roughness between 0.1 $\mu$m and 10 $\mu$m. The circuit wiring is constituted by directly forming the metal layer on the rough surface of the resin. Since the surface roughness of the insulation layer has the above-mentioned value, the adhesive property between the circuit wiring and the surface of the resin is improved, which prevents the strip between the insulation sheet and the metal layer even in the roll lamination type.

Here, although the surface roughness ranges between 0.1 $\mu$m and 10 $\mu$m, it preferably ranges between 1 and 5 $\mu$m. It further preferably ranges between 2 and 3 $\mu$m. The reason why the surface roughness is 0.1 $\mu$m or more is that if it is less than 0.1 $\mu$m, the adhesive property between the surface of the resin and the metal layer can not be made sufficiently high. If the surface roughness exceeds 10 $\mu$m, when the sufficiently thin metal layer is formed on the insulation sheet serving as the insulation layer, the surface is rough, which may cause the disconnection.

In this embodiment, the surface is made rough by setting the surface roughness of the resin surface itself to the above-mentioned value. So, the surface is not made rough by forming any adhesive layer on the surface of the resin and then making this adhesive layer rough. Since the resin surface itself is made rough as mentioned above, the insulation layer is not made into a multiple-layer having the number of layers than it is required, and the structure becomes simple. Moreover, the lamination of a plurality of layers can reduce the possibility of poor reliability.

The metal layer is typically formed of copper. However, any metal layer may be used if it is formed of conductive material that can constitute so-called circuit wiring. For example, gold, silver or plating material may be used.

This embodiment includes the composition that the surface of the core board is made rough to have the surface roughness of the value between 0.1 $\mu$m and 10 $\mu$m and then a first layer circuit wiring is formed on the rough surface.

The stress and the like are not applied to the core board, since the core board is not rolled in the roll lamination type. The core board is strong against the thermal stress, since the surface of the core board is made rough and then the metal layer is directly formed on the rough surface. Thus, this embodiment is effective in employing the method of manufacturing the roll lamination type of build-up multiple-layer circuit board in which a heating process must be used from the viewpoint of the thermal stress.

A part of the manufacturing process in the nineteenth embodiment will be described below with reference to FIG.

Figure 43:
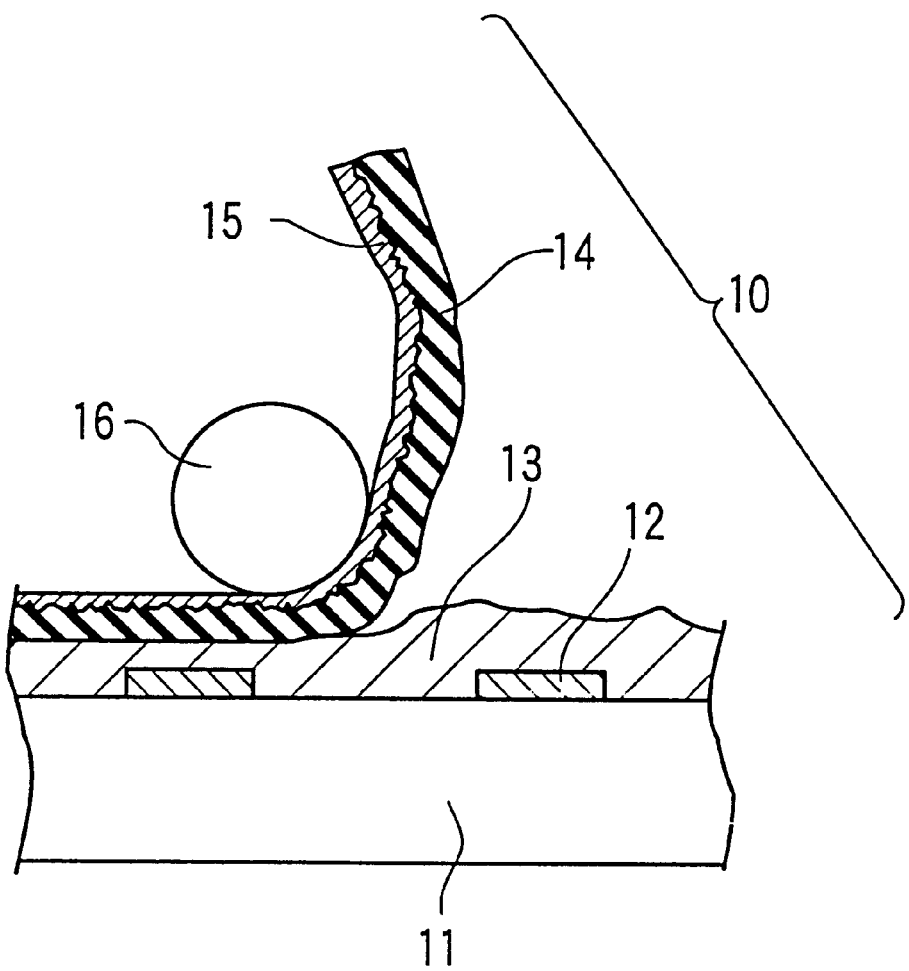
FIG. 43 is a side view showing a part of a manufacturing process of the nineteenth embodiment.

43. As shown in FIG. 43, a build-up multiple-layer circuit board 10 in this embodiment is completed by forming a first layer circuit wiring 12 on a core board 11 and then coating an undercoat material 13 thereon and further covering an insulation sheet 14 from above. Since the surface of the insulation sheet 14 is directly roughed to the predetermined surface roughness, the direct formation of a metal layer 15 on the surface enables the adhesive property to be excellent between the metal layer 15 and the insulation sheet 14 (the insulation layer).

Here, the insulation layer is provided with the undercoat material 13 and the insulation sheet 14. In this case, there is no problem with regard to the adhesive property between both the undercoat material 13 and the insulation sheet 14, since the undercoat material 13 and the insulation sheet 14 are both formed of organic material, namely, resin. Thus, the problem is the adhesive property of the metal layer 15 to the insulation sheet 14, as mentioned above. Especially, if the metal layer 15 is treated by a thermal roll 16 under the application of the bending stress, as shown in FIG. 43, the metal layer 15 need to have the sufficiently high adhesive property. This embodiment is effective especially if the insulation layer is formed by the roll lamination shown in FIG. 43.

A twentieth embodiment will be described below. This is a method that manufactures a build-up multiple-layer circuit board. The method includes providing a core board, providing insulation layer formed of resin material, making the surface of the insulation layer rough so that a surface roughness thereof ranges between 0.1 and 10 microns, forming metal layer directly on the rough surface of the insulation layer with the electroless plating, and laminating on the core board the insulation layer on which the metal layer is formed.

A twenty-first embodiment will be described below. This is a method that manufactures a build-up multiple-layer circuit board. The method includes providing a core board, providing insulation layer formed of resin material, making the surface of the insulation layer rough so that a surface roughness thereof ranges between 0.1 and 10 microns, laminating the insulation layer on the core board so that the rough surface of the insulation layer is exposed, and forming metal layer directly on the rough surface of the laminated insulation layer by the electroless plating.

In the method of manufacturing the build-up multiple-layer circuit board in the twenty-first embodiment, the laminating the insulation layer on the core board includes heating and compressing the insulation layer with the thermal lamination to laminate the insulation layer on the core board.

In the twentieth or twenty-first embodiment, the metal layer is formed directly on the rough surface of the resin by the electroless plating. The reason why the electroless plating can be performed directly on the resin is that this resin surface itself is made rough to have the surface roughness between 0.1 $\mu$m and 10 $\mu$m. If this resin surface is smoother than the surface roughness, the electroless plating can not be formed directly on the resin surface.

In general, if trying to form the electroless plating, it can not be formed. Even if it can be tentatively formed, this results in only the formation of the metal layer that is weak against the stress, the heat and the like. However, if the surface is made rough, the metal layer having the sufficiently high adhesive strength can be formed even if directly the electroless plating is performed to the rough surface.

Figure 44A:
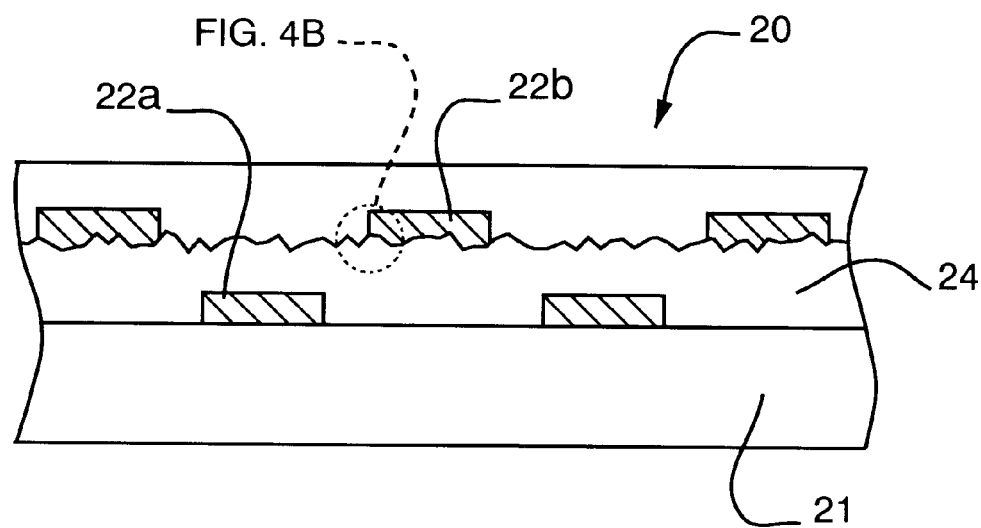
FIG. 44 is a section view showing a twenty-first embodiment in the present invention.
Figure 44B:
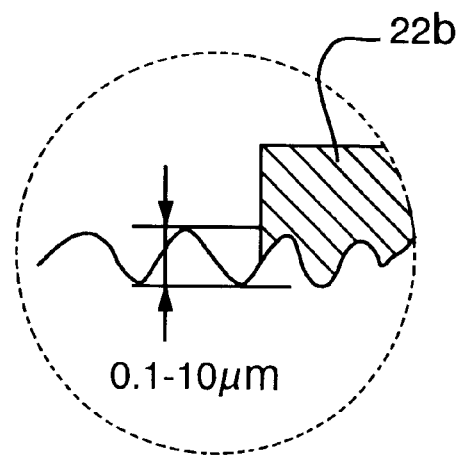

A build-up multiple-layer circuit board 20 shown in FIG. 44 is provided with two-layer circuit wirings 22a, 22b on one surface of a core board 21. Both the first layer circuit wiring 22a and the second layer circuit wiring 22b are directly formed on an insulation layer 24 whose surface is made rough to have the surface roughness of a value in a range of 0.1 $\mu$m and 10 $\mu$m.

The next two methods may be considered as a method of manufacturing such a build-up multiple-layer circuit board.

The first method mounts the first layer wiring on the core board, coats thereon the undercoat material, laminates the insulation sheet, on which the metal layer is not formed, in the roll lamination type, and then forms thereon the metal layer by the electroless plating. In this case, the metal layer is formed after the roll lamination. Thus, the metal layer does not suffer from the influences of the thermal stress, the heat and the like, due to the roll lamination.

The second method in advance makes the surface of the insulation sheet rough, directly forms the metal layer on the rough surface by the electroless plating and the like, coats the undercoat material in this state, and then performs the roll lamination thereon by the thermal roll. Even in this case, the excellently adhesive property between the metal layer and the insulation layer prevents the metal layer formed on the insulation layer from being stripped.

Figure 45A:
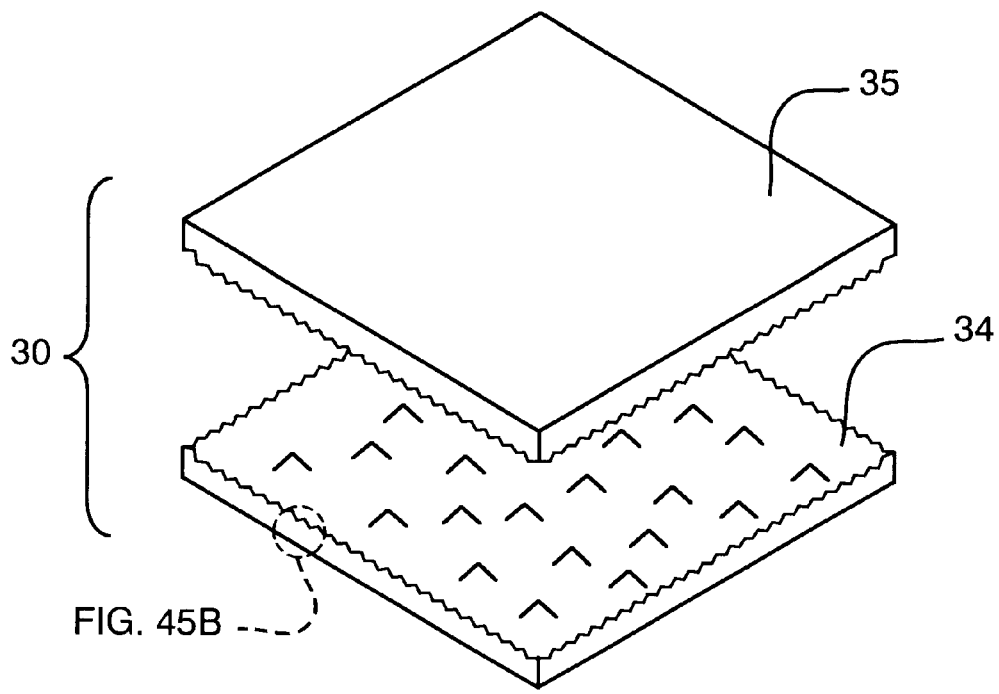
FIG. 45 is a perspective view showing the twenty-first embodiment.
Figure 45B:
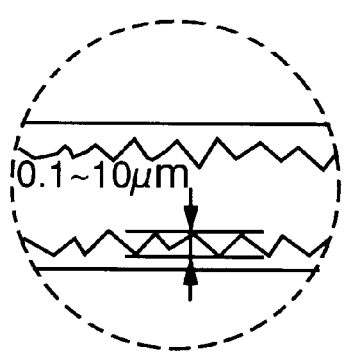

In any case of the first and second methods, if the surface of an insulation layer 34 serving as the insulation sheet is formed in the surface roughness between 0.1 $\mu$m m and 10 $\mu$m as shown in FIG. 45, preferably between 1 and 5 $\mu$m, further preferably between 2 and 3 $\mu$m, when a metal layer 35 is formed on the surface of the insulation layer 34, the adhesive strength is high between the insulation layer 34 and the metal layer 35. Thus, the thin (for example, about 5 $\mu$m) metal layer can be formed on the resin under the excellently adhesive property without the easy strip resulting from the heat and the stress.

A twenty-second embodiment will be described below. This is a method that manufactures a build-up multiple-layer circuit board. The method includes providing a core board, providing insulation layer formed of resin material, forming via-holes or through-holes in the insulation layer, making the inner surfaces of the via-holes or the through-holes rough so that a surface roughness thereof ranges between 0.1 and 10 microns, laminating the insulation layer on the core board, and forming the metal layer on the rough inner surfaces of the via-holes or the through-holes.

In the twenty-second embodiment, the process of making the surface of the resin rough is applied to even the inner surface of the through-hole or the via-hole. In a case of the multiple-layer circuit board, namely, this type of build-up multiple-layer circuit board, as the number of layers is increased, it is further necessary to establish the conductivity between the respective layers. Thus, the via-hole or the through-hole must be used. In this case, the adhesive property between the metal layer formed on the inner surface of the via-hole or the through-hole and the resin (the insulation sheet or the insulation layer) becomes the problem similarly to the above-mentioned embodiments.

Thus, the inner surface of the through-hole or the via-hole is also made rough so that a surface roughness thereof ranges between 0.1 and 10 microns. The direct formation of the metal layer on the inner surface causes the through-hole and/or via-hole wiring to be effectively provided.

Figure 46A:
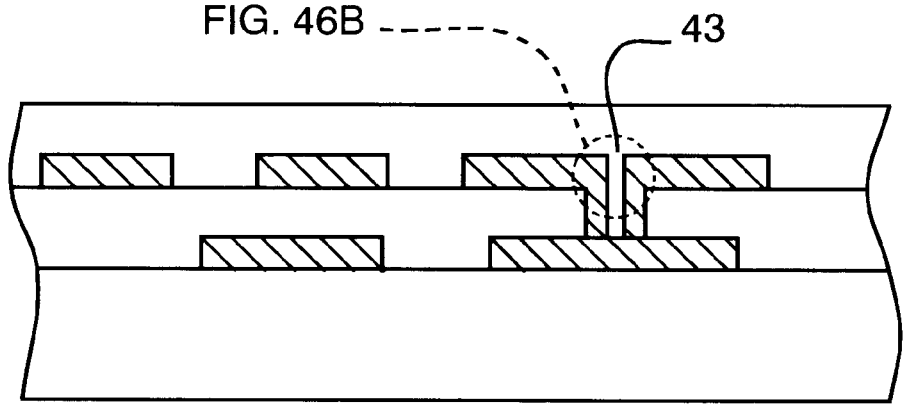
FIG. 46 is a section view showing a twenty-second embodiment in the present invention
Figure 46B:
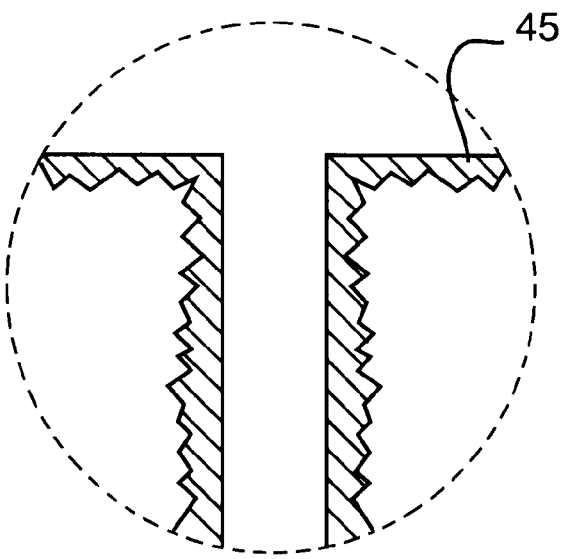

FIG. 46 shows an example of a build-up multiple-layer circuit board 40. A metal layer 45 is strongly bonded to and formed on the inner surface of a via-hole 43. FIG. 47 shows a process of manufacturing such through-hole or via-hole wiring.

Figure 47A:
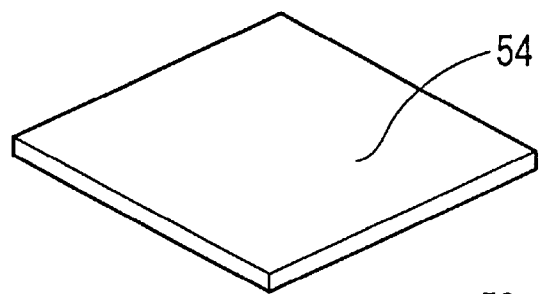
FIG. 47A is a view showing a manufacturing process of the twenty-second embodiment.
Figure 47B:
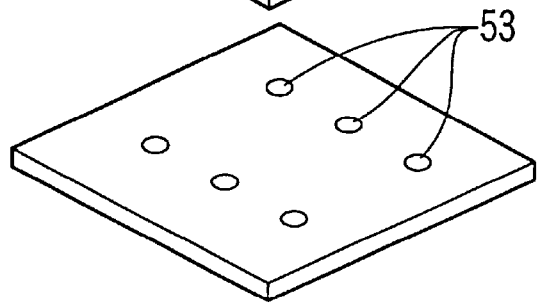
FIG. 47B is a view showing a manufacturing process of the twenty-second embodiment.
Figure 47C:
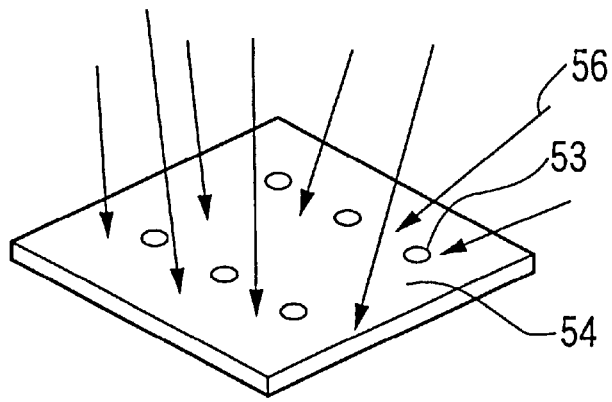
FIG. 47C is a view showing a manufacturing process of the twenty-second embodiment.

For example, an insulation sheet 54 is prepared in FIG. 47A. A via-hole or through-hole 53 is formed in this insulation sheet 54 (FIG. 47B). As shown by arrows, media 56 are collided against the entire insulation sheet 54 on which the via-holes or through-holes 53 are formed, by for example, the sandblasting. And, the insulation sheet 54 is made rough (FIG. 47C).

Figure 48A:
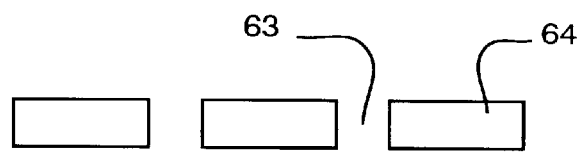
FIG. 48A is a section view showing a manufacturing process of the twenty-second embodiment.
Figure 48B:
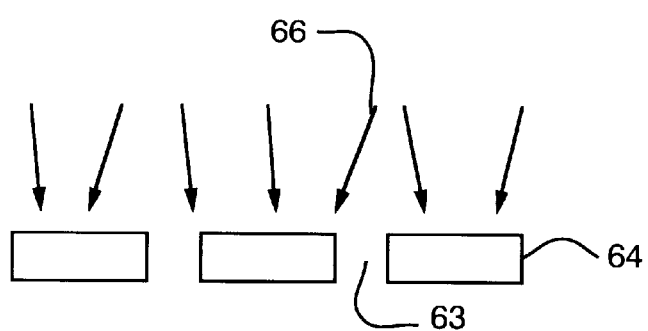
FIG. 48B is a section view showing a manufacturing process of the twenty-second embodiment.
Figure 48C:
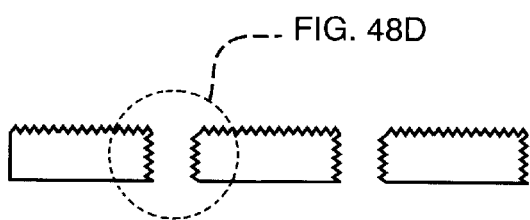
FIG. 48C is a section view showing a manufacturing process of the twenty-second embodiment.
Figure 48D:
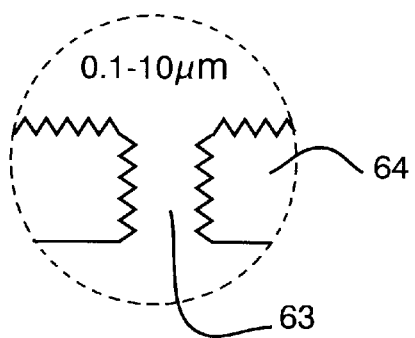
FIG. 48D is an enlarged view of part of FIG. 48C.

So, as shown in FIGS. 48A, 48B and 48C, micro media 66 used in the sandblasting are collided not only with the surface of an insulation sheet 64 but also with the inner surface of a through-hole or via-hole 63 to thereby make even this portion rough. Accordingly, if the electroless plating is performed on the entire section, the metal layer having the sufficiently high adhesive property is also formed on the inner surface of the through-hole or via-hole 63. Preferably, the surface roughness of the inner surface ranges between 0.1 and 10 microns, also in this case. Further preferably, it ranges between 1 and 5 microns. Furthermore preferably, it ranges between 2 and 3 microns.

In the nineteenth to twenty-second embodiments, it is desirable to make the surface of the resin material rough by using the sandblasting, especially, the wet blasting. Preferably, the resin material is one selected from a group consisted of epoxy resin, polymethyl pentene, polyphenylene ether, aromatic polyamide, polyacetal, polyetheramide, polyethylene terephthalate, polybutylene naphthalate, liquid crystal polyester, polyarylate, polyimide, polyamideimide, polyetheretherketone, polyphenylene sulfite, liquid crystal polymer, fluorocarbon resin, polysulfone, polyethersulfone, polyamide 46, polyethylene naphthalate, polybutylene terephthalate and aromatic polyester. The reason why the above-mentioned materials are selected as the resin material is as described above.

The above-mentioned materials are optimal in forming the insulation sheet, making the surface rough and then creating the build-up multiple-layer circuit board. So, the above-mentioned materials typically have the sufficient strength against the heat and the stress. If the sandblasting or the wet blasting is performed on the above-mentioned materials, the degree at which the surface thereof is made rough is not changed depending on the kind of material.

In general, if the chemical reaction and the like are used when the surface is made rough, the surface roughness is changed in accordance with the kind of material of the surface. On the contrary, if the sandblasting or the wet blasting is used, the substantially similar surface roughness can be formed even if any one of the above-mentioned materials is used. From such a viewpoint, the build-up multiple-layer circuit board having the very uniform quality can be created over a different kind of insulation layers.

The background of a twenty-third embodiment will be described below.

The process of using the sputtering apparatus and the evaporating apparatus and then forming the conductive layer requires the large vacuum apparatus. Thus, the facility investment becomes very expensive. Moreover, it takes a long time to exhaust. Hence, this results in a problem that TAT can not be made sufficiently short.

Thus, various methods of perfectly carrying out this process in air are tried. In a presently done manner of them, the electroless plating is performed on the resin substrate. Then, the electrolytic plating is performed to the conductive layer formed by the electroless plating as a base to thereby form the wiring layer having the sufficient thickness increased by the electrolytic plating.

In this electroless plating, there are typically the chemical reduction plating in which a metal ion in solution is reduced and precipitated by chemical medicine, and the reduction plating in which a plated element is reduced and precipitated by a metal ion in solution. The chemical reduction plating is used for the non-conductive material such as the resin substrate.

Figures 49, 50:
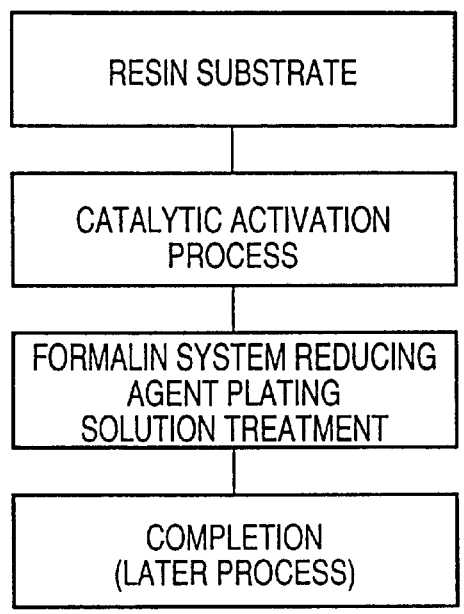
FIG. 49 is a view showing a chemically reducing plating method with regard to background technique of a twenty-third embodiment in the present invention.
FIG. 50 is a view showing a relation between heat resistance and reactivity of resin material, with regard to the background technique of the twenty-third embodiment.

FIG. 49 shows this manner of the chemical reduction plating. At first, the resin substrate is prepared, and then a catalytic activation process is carried out for putting catalyst on the surface of the resin substrate. After that, the electroless plating is performed by using the catalytic element and formalin system reduction plating liquid. Then, it proceeds to a necessary later process after that.

However, this process is not always effective for all the resin substrates. There may be a case that even by using this process, it is difficult to form the conductive layer by the electroless plating. This results in a problem that the function of the material or the product based on the material is restricted.

As mentioned above, conventionally, if the conductive layer is completely formed on the surface of the insulation layer such as the resin substrate with the treatment process in air, a product is manufactured by performing the electroless plating and then carrying out the later process, such as electrode plating and the like, with the conductive layer formed by the electroless plating as the base. However, this electroless plating can not be always performed on all kinds of insulation materials, namely, all kinds of resin substrates in this embodiment, as mentioned above. FIG. 50 simply shows this reason.

As shown in FIG. 50, the resin substrate is classified into a high heat resistant resin substrate, a heat resistant resin substrate and a non-heat resistant resin substrate. In this case, simply saying, the heat resistance reflects the reaction degree of the surface of the resin substrate. For this reason, the high heat resistant resin substrate is poor in the reaction degree of the surface of the resin substrate. The usual heat resistant resin substrate having the heat resistance lower than it is regular in the reaction degree of the surface. Although the heat resistance is not so well, the reaction degree of the surface is well.

This reaction degree of the surface has direct influence on the activation when the electroless plating and the like are performed on the surface. The easiness degree of the respective activations is excellent in order of the high heat resistant resin substrate, the heat resistant resin substrate and the non-heat resistant resin substrate. In other words, the higher the heat resistance, the poorer the reaction degree of the surface of the resin substrate. Thus, the catalytic activation process becomes difficult. The followings are the research result of the reduction by a reducing agent contained in the plating solution. The reduction of a reducing agent in non-formalin system is poor in the high heat resistant resin substrate, regular in the heat resistant resin substrate and excellent in the non-heat resistant resin substrate.

Not only the final product itself but also the environment problem in the manufacturing process has been emphasized in recent years. The reducing agent, which is contained in the plating solution and belongs to the formalin system, causes the problem of environmental hormone and the like. For this reason, it is desirable to use the non-formalin reducing agent also in the manufacturing process. However, the non-formalin reducing agent does not have the sufficient reducing force, as for the resin substrate having the high heat resistance or the regularly heat resistance, as shown in FIG. 50. Hence, it is difficult to perform the electroless plating surely and effectively.

This embodiment intends to mainly solve this subject. Thus, even if the resin substrate is high heat resistant or usually heat resistant and poor in the so-called substrate surface reaction degree, the electroless plating can be performed on the resin substrate sufficiently effectively and surely, by performing the predetermined treatment on the surface of the resin substrate and then using the non-formalin reducing agent.

A twenty-third embodiment will be described below. This is a method that manufactures a wiring board. The method includes providing resin substrate, performing the wet blasting process on the surface of the resin substrate and then treating the surface so that a surface roughness thereof ranges between 0.1 microns and 10 micron, and performing the electroless plating with the non-formalin reducing plating solution on the treated resin substrate and accordingly forming conductive layer.

In the method of manufacturing the wiring board in the twenty-third embodiment, the treating includes treating a part of the surface of the resin substrate selectively.

FIG. 51 explains the respective steps in the twenty-third embodiment. As mentioned above, since the electroless plating can not be performed directly on the non-conductive materials, such as plastic, ceramic, glass and the like, they require the catalytic activation process. In this embodiment, the electroless plating is especially performed on the plastic of the non-conductive materials, by using the non-formalin reducing agent. The resin substrate is prepared at first. Then, the surface of the resin substrate is treated to the surface roughness between 0.1 microns and 10 micron by the wet blasting process.

The value of the surface roughness between 0.1 microns and 10 micron has two meanings as described below. Firstly, the surface roughness having this value is suitable for the catalytic activation process. Secondly, if the catalytic activation process is carried out in the surface roughness having this value, the metal in the plating can not be sufficiently reduced by using the non-formalin reducing agent.

Although the detailed process is not known, the catalytic activation process can not be sufffciently performed if the surface roughness is less than 0.1 microns. If the surface roughness is rougher than 10 micron, it is inconvenient to form the fine pattern. From this viewpoint, as the method of forming the wiring board, especially forming the fine pattern, it is appropriate to perform the wet blasting process on the surface of the resin substrate having no surface activation, in the range of the above-mentioned value.

Especially in this embodiment, the plating process can be performed with the non-formalin reducing agent after the catalytic activation process. In this embodiment, there is no limitation on the kind of resin on which the plating process can be performed with this non-formalin reducing agent. The plating process can be performed on all kinds of resin substrates by using the non-formalin reducing agent. Various materials can be considered for the material of the resin substrate. For example, there are a general purpose plastic material such as ABS resin, polyethylene resin and the like, an engineering plastic material such as polyebutylene terephthalate resin, polyacetal resin and the like, a super engineering plastic material such as polyetheretherketone resin, polyetherimide resin and the like.

FIGS. 52A to 52D are conceptual views showing the plating process in the twenty-third embodiment. At fist, FIG. 52A shows the situation that this type of resin substrate 21 is prepared. FIG. 52B shows the situation that the surface roughness is made rough in the range between 0.1 microns and 10 micron by the wet blasting process. FIG. 52C shows the situation that the catalytic activation process is performed on the surface of the resin substrate 21 in this rough state. And, FIG. 52D shows the situation that the electroless plating is performed with a catalytic material 22 as the base and accordingly a wiring board 20 is completed.

As shown in FIG. 52C, if the surface is made rough as mentioned above, a surface area of the resin substrate 21 is substantially larger. Since the catalytic materials 22 are distributed at a constant rate for the surface area, the catalytic materials 22 are apparently distributed on the surface of the resin substrate 21 at a further high density. Thus, even if using the non-formalin reducing agent by which the electroless plating can not be always performed on all the kinds of resin substrates 21, a electroless plating layer 23 can be surely formed due to the sufficient existence of the catalytic materials 22.

FIGS. 53A to 53C show a conventional method of manufacturing a wiring board 30 on which the wet blasting process in this embodiment is not performed. FIG. 53A shows the situation that a resin substrate 31 is prepared. FIG. 53B shows the situation that catalytic materials 32 are sparsely present after the execution of the catalytic activation process. And, FIG. 53C shows the situation after the execution of the plating process using the non-formalin reducing agent. As shown in FIG. 53B, there may be a case in which the catalytic activation is not always sufficient. The plating process is performed on the surface of the resin substrate in such catalytic activation state by using the non-formalin reducing agent. Then, as shown in FIG. 53C, there may be a case in which an electroless plating layer 33 is adhered to only a part of the surface or adhered in very insufficient state, or the electroless plating can be performed at all.

In this embodiment, the wet blasting is used as a manner of making the surface of the resin substrate rough. In the wet blasting, a hard particle 42 having a diameter of about 100 microns or less is collided against the surface of a resin substrate 41 at a high speed. Accordingly, the physical mechanical force makes the surface of the resin substrate 41 rough.

The reason why the wet blasting is used as the method of making the surface of the resin substrate rough is as mentioned above. The dry blast of the so-called sandblasting process can treat the surface of the resin substrate to the surface roughness between 0.1 microns and 10 micron. However, the surface roughness is not always uniform. In other words, since the treated surface is relatively roughed, the dry blast is not suitable for the method of manufacturing the wiring board having the fine pattern. On the contrary, in the wet blasting, the surface of the resin substrate is uniform and fine, and further it can be treated to the surface roughness between about 0.1 microns and 10 micron.

After the wet blasting process is performed on the entire surface of the resin substrate, the electroless plating may be performed on the entire surface of a resin substrate 51. Or, after the wet blasting process is selectively performed on the resin substrate, the electroless plating may be selectively performed.

Another merit of the wet blasting is explained. Conventionally, before the catalytic activation process, the preliminary treatment must be performed on the surface of the resin substrate to accordingly carry out the degreasing operation. According to this embodiment, the surface of the resin substrate can be also degreased by carrying out the wet blasting and using the solvent for the execution of the wet blasting without separately adding the degreasing process. Thus, the process is not always increased as the degreasing process.

A twenty-fourth embodiment will be described below. In the twenty-third embodiment, the plating solution in the non-formalin system is the plating solution with hypophosphite, hydrazine, boron hydride compound, amino-borane compound and glucose as the reducing agent. As mentioned above, in recent years, there may be a tendency that the formalin system reducing agent is not used as much as possible because of the occurrence of the environmental hormone.

In this point, this embodiment has a process that can manufacture the wiring board by using the plating solution utilizing the non-formalin reducing agent, even in a case of the electroless plating process originally utilizing the formalin system reducing agent. As the plating solution in the non-formalin system, it is desirable to utilize hydrazine, amino-borane compound and glucose as the reducing agent. They are not always strong in reduction force. However, even if the reduction force is weak, the surface is made rough as mentioned above. Thus, the catalytic activation process can be sufficiently done to thereby carry out the electroless plating at a sufficient efficiency.

A twenty-fifth embodiment will be described below. The twenty-fifth embodiment is a method of manufacturing a wiring board noted in the twenty-third embodiment, in which the plating solution in the non-formalin is the mixture of the A solution containing 25% aqueous ammonia of 14 to 16 weight %, copper sulfate of 3 to 5 weight %, amino compound of 7 to 9 weight % and ion exchange water as the remaining % and the B solution containing dimethylamine borane of 4 to 6 weight % and ion exchange water as the remaining %.

The inventor et al. discover that the electroless plating can be performed in the optimal condition, especially if using the above-mentioned plating solution when the surface of the resin substrate is roughed to the surface roughness between 0.1 microns and 10 mircon by the wet blasting.

A twenty-sixth embodiment will be described below. The twenty-sixth embodiment is as shown in FIG. 54. That is, this is a method which manufactures a wiring board and has a process of forming insulation layer on conductive layer formed with the electroless plating process utilizing the above-mentioned non-formalin reducing agent, by using the electrolytic plating.

At first, resin substrate is prepared, and the surface treatment process is carried out with the wet blasting process. This wet blasting process has the conditions similar to the above-mentioned conditions. A medium particle diameter, a hardness, a medium diameter and the like may be properly selected in accordance with the desirable surface roughness.

The catalytic activation process is performed on the resin substrate on which the surface treatment is performed, as mentioned above. Next, the plating solution process is performed with the non-formalin reducing agent to accordingly form the conductive layer on the surface of the resin substrate by the electroless plating. The execution of the electrolytic plating with this insulation layer as the base enables the sufficiently thick wiring layer to be formed on the surface of the resin substrate.

In addition, the electroless plating process or both the electroless plating process and the electrolytic plating process may be selectively performed by using the resist, also in the twenty-sixth embodiment. Or, the above-mentioned processes may be uniformly carried out as a whole without using the resist. The merit in this embodiment can be obtained in any case.

A twenty-seventh embodiment will be described below. The twenty-seventh embodiment is a method of manufacturing a wiring board noted in the twenty-third embodiment, in which the resin substrate has the heat resistance equal to or higher than 150° C. and is one selected from a group consisting of polyimide, liquid crystal polymer, aromatic polyester, liquid crystal polyester, polyethylene, polyethylene terephthalate, polybutylene terephthalate, teflon and fluorine system resin.

As shown in FIG. 55, it is relatively difficult to perform the catalytic activation process on the surface of the resin substrate that originally has the high heat resistance or the heat resistance, because of the low surface reaction degree. Thus, it is difficult to utilize the non-formalin reducing agent to thereby perform the electroless plating. On the contrary, according to this embodiment, it is possible to use the wet blasting process to then make the surface of the resin substrate rough in the predetermined range. Hence, as shown by arrows of FIG. 55, it is possible to apparently improve the reaction degree of the surface of the board having the high heat resistance or the heat resistance and also possible to apparently improve the activation easiness degree.

As mentioned above, even if using the plating solution utilizing the non-formalin reducing agent, the electroless plating can be formed on the surface of the resin substrate having the high heat resistance or the heat resistance very effectively and surely, although it is conventionally impossible. In this implication, the twenty-seventh discloses the manner of performing the electroless plating on the resin substrate in which the heat resistance is 150° C. or more by using the plating solution utilizing the non-formalin reducing agent.

A twenty-eighth embodiment will be described below. The twenty-eighth embodiment relates to a wiring board. This is the wiring board having wirings on both surfaces of the resin substrate. In the wiring board, a through-hole connects the wirings on both the surfaces to each other. Then, the inner surface of the through-hole has the surface roughness between 0.1 microns and 10 micron by the wet blasting process. And, the non-formalin reducing agent is utilized to form conductive layer by the electroless plating. The wiring in this embodiment is not always limited to a form of line. The wiring includes a type of bonding land, or a type of land used for the thermal pressing and bonding operation.

FIG. 56 shows a wiring board film 120. IC having a bump electrode is thermally pressed and bonded onto a wiring board 121 of the wiring board film 120 to thereby fix the IC. This wiring board 121 is further provided on a basic board and the like to then create an electronic circuit as a whole. A through-hole 122 is essential in this kind of wiring board 121. Originally, it is very difficult to perform the plating on an inner surface 122a of the through-hole 122, and it is the portion at which the strip, the defective plating and the like are easily incurred.

The employment of the electroless plating process utilizing the wet blasting process according to this embodiment enables the electroless plating process to be performed on the resin substrate having the high heat resistance high effectively and surely. Not only it, but also the plating formed through this process is formed on the rough surface having the surface roughness between 0.1 microns and 10 micron. Thus, the adhesive force is high between the plating layer and the resin substrate. Hence, this is the electroless plating method optimal for the portion such as the inner surface 122a of the through-hole that is especially susceptible to the stress.

A twenty-ninth embodiment will be described below. The twenty-ninth embodiment is a method that manufactures a wiring board. The method includes performing the wet blasting process on the surface of resin substrate and then treating the surface so that a surface roughness thereof ranges between 0.1 microns and 10 micron, as mentioned above, performing the catalytic activation process on this treated resin substrate by using hydroxy carboxylic acid salt or inorganic metallic salt of copper family elements, platinum group elements and iron family elements, and performing the electroless plating on the resin substrate after the catalytic activation process, with any one of hypophosphite, hydrazine, boron hydride compound, amino-borane compound and glucose as the reducing plating solution and then forming the conductive layer.

This embodiment especially discloses the material for the catalytic activation action. Conventionally, the catalytic activation process is carried out with only expensive metal such as palladium. In the case of the surface of the resin substrate on which the wet blasting process according to this embodiment is performed, the surface can be sufficiently catalytically activated by using the hydroxy carboxylic acid salt of the copper family elements, the iron family elements and the like without always using this type of noble metal. Thus, the relatively cheap catalyst can be used as the catalyst during the manufacturing process. Hence, this can make the electroless plating cheaper and also reduce the manufacturing cost.

A thirtieth embodiment will be described below. The thirtieth embodiment is a method that manufactures a wiring board. The method include performing the wet blasting process on the surface of resin substrate and then treating the surface so that a surface roughness thereof ranges between 0.1 microns and 10 micron, performing the catalytic activation process on this treated resin substrate by using hydroxy carboxylic acid salt or inorganic metallic salt of copper family elements, platinum group elements and iron family elements, performing the electroless plating on conductive layer in plating solution, as for the resin substrate after the catalytic activation process, with any one of hypophosphite, hydrazine, boron hydride compound, amino-borane compound and glucose as the reducing agent, and forming wiring layer on the conductive layer by the electrolytic plating.

In the thirtieth embodiment, the conductive layer is formed with the electrolytic plating, on the conductive layer formed with the electroless plating. In the electroless plating of the thirtieth embodiment, there may be a case that the sufficient plating growth speed can not be obtained. Thus, the execution of the electrolytic plating to the conductive layer formed by the electroless plating as the base layer enables the conductive wiring layer having the sufficient thickness to be formed on the surface of the resin substrate easily, rapidly and cheaply.

Background of a thirty-first embodiment will be described below.

A process as a point to form a hyperfine pattern is a process of forming the plating wiring on the resin substrate. Conventionally, the resin substrate constituting an electronic circuit wiring is prepared as shown in FIG. 57, and the catalytic activation is carried out to form the conductive layer serving as the base layer for the electrolytic plating, by using the electroless plating. Then, the electroless plating is performed on the activated surface of the resin substrate, and the electrolytic plating is performed with this electroless plating as the base layer. Then, the operation proceeds to a later process.

In addition, for example, the electroless plating can be replaced by a drying process, for example, the evaporating process, the sputter CVD process and the like. However, they make the facility investment larger. Moreover, they have a demerit that a process TAT becomes long. Thus, they have a defect that a cheap product can not be manufactured.

In a case of a non-fine pattern, the following method is sometimes carried out. That is, a copper foil is pasted on the surface of the resin substrate, and then this is made into a pattern. However, the thickness of the copper foil can not be always made sufficiently thin, or the surface is not always flat. Accordingly, it is difficult to obtain a line width of several tens of microns or a line pitch of several tens of microns that is a pitch of the electronic circuit wiring requested in recent years. From this viewpoint, presently, the most frequently performed method is the method of forming the wiring by the plating as mentioned above. The electroless plating is performed as the base layer for the electrolytic plating.

Here, the plating is simply described. The plating is the method of reducing and precipitating a metal ion in solution on a material to be plated and then forming metal coat. As the plating method, there are three kinds of plating methods: an electrical plating method, a chemically reducing plating method and a substituting plating method. The electrical plating method electrolytically precipitates the metal material on the material to be plated, as mentioned above. The chemically reducing plating method reduces and precipitates the metal ion in the solution by using the chemical medicine. The substituting plating method substitutes and precipitates the metal ion in the solution by using the plated material.

The electrically plating method uses as a cathode the material to be plated, and then performs the reducing reaction thereon, and accordingly precipitates the metal ion in the solution on the material to be plated. At this time, the metal is dissolved at an anode so as to compensate for the metal precipitated on the plated metal at the cathode.

In the chemically reducing plating method, an electron discharged by the oxidation of the reducing material causes the metal ion in the solution to be precipitated as the metal on the plated material.

In the substituting plating method, if the material to be plated has the larger ionization tendency than that of the metal in the solution, a part of the material to be plated is dissolved and substituted for the metal ion. Then, the metal ion in the solution is precipitated on the material to be plated. The plating operation is done in this way.

In the above-mentioned plating methods, the electrolytic plating can not be directly performed on the resin substrate, since the surface of the resin substrate itself does not have the conductivity. Thus, if trying to form the metal wiring and the like on the resin substrate by the plating, it is necessary to firstly form the conductive layer on the resin substrate. As mentioned above, the electroless plating is conventionally performed to form this conductive layer. However, the electroless plating can not be directly performed on the surface of the resin substrate. Hence, the catalytic activation process is conventionally performed on the surface of the resin substrate. After that, with the catalyst as a core, the metal is precipitated from the plating solution in the electroless plating. Accordingly, the electroless plating is performed on the surface of the resin substrate.

The electrolytic plating must be finally performed in order to perform the plating for forming the electronic circuit wiring and the like on the surface of the conventionally used non-conductive material, such as the resin substrate and the like, as mentioned above. This is because the electroless plating has the feature that it has the slow growth speed and it does not grow beyond a certain thickness. Thus, the plating process to form the electronic circuit and the like on the surface of the resin substrate and the like always needs the electroless plating process to form the conductive layer used when the electrolytic plating is performed.

However, in the electroless plating process, the step is long as shown in FIG. 58. At first, the electroless plating must be performed in order to perform the electrolytic plating. In order to perform the electroless plating, it is necessary to carry out the preliminary treatment having a relatively large number of steps. Hence, the excessive long steps prior to the electrolytic plating cause the entire steps to be longer.

Moreover, as shown in FIG. 58, defects may be incurred if the catalytic treatment always necessary for the electroless plating is insufficient. For example, the defect referred to as wildness or eruption is incurred on the surface on which the electroless plating is performed.

On the other hand, a new method shown in FIG. 9 has been recently proposed as a method of solving the above-mentioned problems. Although this method is not put to practical use, it is successful in a stage of an experiment room. As shown in FIG. 59, the resin substrate is prepared, the preliminary treatment is carried out, metallization is done, and the electrolytic plating is performed. In the plating process in FIG. 59, the electroless plating process is not included prior to the electrolytic plating. The metallizing process is included instead of this electroless plating process. This metallizing process immerses the resin substrate in particular solvent and then coats a thin conductive film directly on the surface of the resin substrate. The conductive film formed by the metallizing process is used as the base layer for the electrolytic plating.

However, this process shown in FIG. 59 also has problems shown in FIG. 60. At first, a first problem is that the step of the preliminary treatment is long similarly to the step of FIG. 57. Here, the step of the preliminary treatment is the preliminary treatment step corresponding to the former step of the metallization shown in FIG. 59. In this preliminary step, for example, acid solution and the like are used to degrease and arrange the surface of the resin substrate. Then, chromium oxide, sulfuric acid and the like are used to etch the surface. Moreover, HCL and the like are used to neutralize this. Moreover, HCL is used to carry out pre-dip. Furthermore, the treatment of activator and the like is carried out to then perform the metallization.

It takes a relatively long time to carry out the preliminary treatment step. That is, it takes five minutes to do the acid degreasing operation, it takes about 15 minutes to do the etching, it takes two minutes to do the neutralization, it takes two minutes to do the pre-dip, and it takes eight minutes to do the activation. In this way, there is still the problem that the step of the preliminary treatment for the metallization is long.

As a second problem, the metallization layer formed as the base layer for the electrolytic plating can not be formed as the sufficiently strong base layer, such as the electroless plating shown in FIG. 57. Thus, that metallization layer is weak in adhesive strength, and the strip is easily incurred.

As explained above, the object of this embodiment is to solve the problem that these long treatment steps cause TAT of the process to be long. Moreover, the object thereof is to solve the problem of the defect of the completed wiring board, the adhesive strength or the like.

A thirty-first embodiment will be described below. This is a method that manufactures a wiring board. The method include providing resin substrate, making the surface of the resin substrate rough by the wet blasting, making the rough surface of the resin substrate conductive by using the palladium catalyst, and performing the electrolytic plating on the conductive surface of the resin substrate.

FIG. 61 shows a basic process. The resin substrate is prepared at first. This surface of the resin substrate is made rough by the wet blasting. The rough surface of the resin substrate is made conductive by the palladium catalyst. Then, the electrolytic plating is performed on the conductive surface of the resin substrate.

Here, this has the step of making the surface rough by the wet blasting and a step of making the surface conductive by the palladium catalyst.

At first, the step of making the surface conductive by using the palladium catalyst is explained. The step of making the surface of the resin substrate conductive is conventionally done by the electroless plating. However, it is done with the palladium catalyst, in this embodiment.

As the materials of achieving the step of making the surface conductive, there are three systems: a system of utilizing the conductivity of colloidal palladium, a system of utilizing the conductivity of palladium sulfide and a system of utilizing the conductivity of metal palladium-tin mixture. In addition, there is a method of using a conductive polymer system or a method of using a carbon system, as the material to make the surface of the non-conductive material such as the resin substrate conductive by merely immersing the resin substrate in the solution. The inventor et al. discover that the method of making the surface conductive by using the palladium system is optimal, especially from the relation of the compatibility to the wet blasting described later.

FIG. 63 shows the electrical resistances of the respective films made conductive as mentioned above. In a case of the electroless copper plating, an electrical resistance is $1\Omega$ or less. In a case of the conductive polymer or the carbon system, it has an electrical resistance of about $100\ K\Omega$. In a case of the palladium collide system, it has an electrical resistance of several megohms. In a case of the palladium sulfide, it has an electrical resistance of $100\ K\Omega$. In a case of the metal palladium-tin mixture, it can achieve an electrical resistance of about $10\Omega$ or less. Thus, it is especially desirable that the palladium catalyst according to the thirty-first embodiment is formed of the metal palladium-tin mixture.

FIGS. 64A to 64D show the situation of the surface treatment by using the catalyst. At first, a resin substrate 41 is prepared as shown in FIG. 64A. The surface of the resin substrate 41 is typically smooth as shown in FIG. 64A. Next, a surface 41a of the resin substrate 41 is made rough, as shown in FIG. 64B. The wet blasting is employed as the roughing manner in this case. However, there are actually a method of making the surface rough by using the dry blast or a method of making the surface rough by using a mechanical tool, other than the wet blasting as the method of making the surface 41a of the resin substrate rough. Moreover, there are a method of making the surface rough with a medicine and a method of making the surface rough by making the resin substrate itself foamy.

Next, as shown in FIG. 64C, the rough surface of the resin substrate 41 is made conductive by using a palladium catalyst 42. The palladium catalyst 42 is adhered onto the resin substrate whose surface is made rough, at a certain rate. In this case, the rough surface has a substantially larger surface area than that of the non-rough surface. Thus, the adhesive density of the palladium 42 is apparently higher on the rough surface.

The adhesive density of the palladium catalyst is apparently higher, as mentioned above. The formation of a certain amount of an electrolytic plating layer 43 for the palladium catalyst 42 per unit area is apparently promoted as shown in FIG. 64D. Thus, as the apparently adhesive density of the palladium catalyst 42 is higher, the denser electrolytic plating layer 43 is formed. The electrolytic plating is densely performed by increasing the apparently adhesive density of the palladium catalyst 42 on the surface 41a of the resin substrate 41. Accordingly, this enables the adhesive strength of the plating on the surface 41a of the resin substrate 41 to be higher.

Conventionally, if a surface 51a of a resin substrate 51 is not made rough as shown in FIG. 65A, a catalyst 52 adhered to the surface 51a of the resin substrate 51 is relatively low in catalyst density as shown in FIG. 65B. The electrolytic plating is performed in this state of the catalyst density. Then, the distance between the catalysts 52 serving as the core is separated as shown in FIG. 65C. Thus, even after the growth of an electrolytic plating layer 53, an area of a metal directly bonded to the resin substrate 51 at the lower layer thereof, namely, an area of the plating layer 53 is small.

The inventor et al. discover that the wet blasting can rough the surface of the resin substrate more uniformly than the dry blast, as various consideration results.

The surface roughness of a surface 71a of a resin substrate 71 uniformly roughed by the wet blasting ranges between about 0.1 and 10 microns. Thus, it is possible to use the palladium catalyst to easily make the surface conductive, at the later process. It is especially desirable that the surface roughness ranges between about 0.1 microns and 1.0 micron. If the surface roughness belongs to that range, the plating having the high adhesive strength can be sufficiently formed on the surface of the resin substrate. Moreover, since the surface roughness is not so high, there may be few cases that the formation of the fine wiring pattern causes the disconnection and the like.

A thirty-second embodiment will be described below. The resin substrate in the thirty-first embodiment is formed of one selected from a group consisted of epoxy resin, polymethyl pentene, polyphenylene ether, aromatic polyamide, polyacetal, polyetheramide, polyethylene terephthalate, polybutylene naphthalate, liquid crystal polyester, polyarylate, polyimide, polyamideimide, polyetheretherketone, polyphenylene sulfide, liquid crystal polymer, fluorocarbon resin, polysulfone, polyethersulfone, polyamide 46, polyethylene naphthalate, polybutylene terephthalate and aromatic polyester.

The reason why the various materials can be used in the thirty-second embodiment as mentioned above is as follows. That is, if the treatment is done by the wet blasting as in the thirty-first embodiment, the condition of making the surface rough is not different depending on the various resin materials in the thirty-second embodiment. The various resin substrates originally have various properties. The rough situation is varied depending on, for example, chemical resistance and other conditions. However, if this wet blasting is used, it is possible to use any material to carry out the roughing operation uniformly and substantially identically.

In the thirty-second embodiment, the resin substrate is formed of any one of the above-mentioned various materials. Conventionally, in order to make the surface rough, the resin substrate is formed of a plurality of materials, namely, the composite material, and the surface is made rough by partially etching or removing the material. In this embodiment, the resin substrate can be formed of any one material selected from the above-mentioned various materials to thereby make the resin substrate sufficiently rough and further form the plating having the sufficient adhesive strength.

A thirty-third embodiment will be described below. The thirty-third embodiment is a method that manufactures a wiring board. The method includes making a surface of resin substrate rough by using the wet blasting, making the rough surface of the resin substrate conductive by using the palladium catalyst, coating the conductive surface of the resin substrate except for a wiring pattern with the resist, and forming the wiring pattern by using the electrolytic plating after the coating.

After the surface of the resin substrate is made rough by using the wet blasting, the palladium and the like are adhered to the surface by using the catalyst. In this way, the adhesion of the palladium and the like enables this surface to be made conductive.

Then, the wiring pattern is left on the surface, and the resist is coated. Conventionally, in the semi-additive method, the resist is used to then grow the plating on the remaining portion. However, there may be a case that the erroneous adhesion of the resist causes the wiring to be disturbed.

On the contrary, the surface of the resin substrate is made sufficiently rough in this embodiment. Thus, the adhesive strength between the resist and this surface of the resin substrate can be made sufficiently high. Also, this can extremely reduce such a fear that a part of the resist is stripped and the wiring pattern is disturbed as in the conventional case. Hence, there are two points as the effect of making the surface of the resin substrate rough. Firstly, the apparently adhesive density of the palladium catalyst adhered to the surface is made stronger. Secondly, the adhesive strength is made stronger between the resin substrate and the resist formed on the resin substrate.

A thirty-fourth embodiment will be described below. This is a method that manufactures a wiring board. The method includes providing resin substrate, forming a penetration hole in the resin substrate with the laser or the drill, roughing the surface of the resin substrate in which this penetration hole is formed and the inner surface of the penetration hole, and performing the plating on the rough surface of the resin substrate and the inner surface of the penetration hole.

The penetration hole is formed in the resin substrate with the laser or the drill. When this penetration hole is formed, there may be a case in which the hole is formed in the condition that this inner surface is not always roughed and it is smooth. Especially, in a case of the laser, the emission of high energy causes the resin at that portion to be fused. Accordingly, the penetration hole is opened. Thus, the surface is rarely rough.

Thus, in this embodiment, the surface of the resin substrate is made rough, even on the inner surface of the through-hole. Moreover, the present plating may be any one of the electroless plating and the electrolytic plating. In this case, the process can be made shorter by making the surface conductive with the palladium catalyst and the like, and then performing the electrolytic plating process without performing the electroless plating. Furthermore, it is possible to obtain a product with high reliability.

A thirty-fifth embodiment will be described below. This is a method that manufactures a wiring board. The method includes forming a penetration hole in resin substrate with the laser or the drill, roughing the surface of the resin substrate in which this penetration hole is formed and the inner surface of the penetration hole while removing the smear generated when the penetration hole is formed, and performing the plating on this rough surface of the resin substrate and the inner surface of the penetration hole.

FIGS. 66A and 66B show a problem when a penetration hole 153 is formed on a resin substrate 151 by using the conventional method and then a smear 157 is removed and further the plating process is performed. FIG. 66A shows the generation of the smear 157 around the penetration hole 153 immediately after the penetration hole 153 is formed with the laser or the drill. This smear 157 implies the deterioration of the resin substrate 151 or the minute dust of the resin substrate 151, and has bad influence on the formation of the plating wiring and the like.

Conventionally, the smear 157 formed around the penetration hole 153 is typically etched and removed by using acid or alkali solution, as shown in FIG. 66A. In this case, an etching speed at the portion of the smear 157 is slower than that of the other portion. This results in a problem that a periphery 154 of the penetration hole 153 is swollen, as shown in FIG. 66B.

As shown in FIG. 67A, a resin substrate 141 is prepared as shown in FIG. 67A, and a hole is formed with a drill 146 as shown in FIG. 67B. When the hole is formed with the drill 146, as shown in FIG. 67B, the residuum of the resin substrate 141 discharged from the inner side of the hole is dispersed and adhered to periphery. This is referred to as a smear 147. As shown in FIG. 47C, after the formation of the hole is ended, the smear 147 is adhered to the periphery of the holes on a front surface and a rear surface and the inner surface of the penetration hole 143.

The plating can not be performed on that portion under the condition that the smear 147 is still adhered. Or, even if it is done, the adhesive strength is very weak. Then, as shown in FIG. 67D, the smear 147 is removed by a spray flow 148 of the wet blasting. The thirty-fifth embodiment represents the operation done simultaneously with the removal, as the roughing operation. Thus, it is not always limited to the wet blasting. Then, it may be done by spray flow (liquid is not contained) of the dry blast. However, if this is done by the wet blasting, this can obtain the effect noted in the above-mentioned embodiment collectively.

A thirty-sixth embodiment will be described below. In the resin substrate, the conductive layer is formed on a bottom portion thereof. In the penetration hole penetrating the resin portion of the resin substrate, a bottom thereof is covered with this conductive layer. After the step of forming the penetration hole by using the laser or the drill, the smear accumulated in the conductive layer that is the bottom of the penetration hole is removed in the above-mentioned roughing process.

The peripheral structure of the penetration hole is represented by merely the penetration hole, in the thirty-fifth embodiment, and it is not specified except that the hole is opened in the resin substrate. On the contrary, it is evident in the thirty-sixth embodiment that this penetration hole is covered in the conductive layer of the bottom surface. The penetration hole is covered. So, it may be the that the penetration hole is a so-called via-hole. Under such situation, the problem is the above-mentioned smear.

Similarly to the thirty-fifth embodiment, the smear is the inevitable problem when the hole is formed with the drill, the laser or the like. As shown in FIG. 68C, the smear is incurred on a resin substrate 161 around the penetration hole or on the inner surface of a penetration hole 163. If the bottom is covered with a conductive layer 169 as in the thirty-sixth embodiment, a smear 167 is also present in this covered portion.

The conductive layer 169 is typically a part of an electronic circuit which is connected through a plating portion to an electronic circuit formed on the surface of the resin substrate 161 and is formed on a bottom side. The conductive layer 169 constituting the electronic circuit on the bottom side performs the especially important roll in performing the conductive plating on the inner surface of the penetration hole 163. This is because the plating is grown with the conductive layer on this bottom side as the core, when the plating is grown on the inner surface of the through-hole, namely, the penetration hole 163 by the electrolytic plating.

Thus, if the smear 167 is accumulated on the conductive layer 169 serving as the core at the time of the plating growth, the sufficient plating growth is not attained from that portion. Hence, it is necessary that the smear 167 on this portion is also removed as clear as possible. This smear is removed by the roughing process, as the manner of removing it. The above-mentioned wet blasting and dry blast may be considered as the roughing process.

A thirty-seventh embodiment will be described below. The above-mentioned roughing process is carried out with the dry blasting or the wet blasting.

A thirty-eighth embodiment will be described below. In a roughing operation according to the above-mentioned roughing process, the resin substrate is roughed to the surface roughness between 0.1 and 10 microns. If directly performing the electrolytic plating with the palladium catalyst as the conductive layer without using the base layer formed by the electroless plating on the surface of the resin substrate, the surface roughness of the resin substrate preferably belongs to the above-mentioned range, as mentioned above. This is not always limited to the front surface and the rear surface of the resin substrate. So, it is similar with regard to the inner surface of the through-hole formed in the resin substrate.

A thirty-ninth embodiment will be described below. This is a wiring board device in which an electronic circuit is formed on the surface of resin substrate and sealed with seal resin and further the surface of the resin substrate is made rough in the boundary between the surface of the resin substrate and the seal resin. The surface of the resin substrate in the boundary portion between the resin substrate and the seal resin is made rough when the seal resin is used to seal the electronic circuit formed on the resin substrate.

Such a roughing operation extremely improves the adhesive property in the boundary between the seal resin and the surface of the resin substrate. Thus, there is no drop of the reliability of the circuit wiring, the electronic parts or the like in the electronic circuit formed on the resin substrate resulting from the leakage of the seal. As shown in FIG. 69A, various wiring, electronic parts 172 and the like constituting the electronic circuit are placed on a surface 171a of the resin substrate. This surface 171a is made rough by using the various methods, especially the wet blasting or the dry blast.

As shown in FIG. 69B, when a resin 173 is poured from above the surface of the resin substrate and thereby these electronic parts 172 are sealed, the seal resin 173 is adapted to be directly adhered to the rough surface 171a of the resin substrate 171. Accordingly, this improves the adhesive property between the surface 171a of the resin substrate 171 and the resin 173. Such mechanism makes the strip difficult even if the compatibility between the seal resin 173 and the resin substrate 171 is not excellent. For this reason, the selection width becomes wider, as for any material of the resin substrate 171 and the seal material 173.

A fortieth embodiment will be described below. This is a method that manufactures a wiring board. The method includes making the surface of resin substrate rough with the dry blasting or the wet blasting, forming wiring on the rough surface of the resin substrate and then connecting electronic parts to this wiring with a flip-chip method or a wire bonding method and further forming an electronic circuit, and sealing with seal resin the surface of the resin substrate containing the exposed surface roughed by the above-mentioned step on which the electronic circuit is formed.

After the formation of the wiring on the surface of the resin substrate, the electronic parts are connected with the flip-chip method or the wire bonding method. This flip-chip method or the wire bonding method connects the electronic parts to the wiring formed on the resin substrate. However, it is not always the that this adhesive strength is sufficiently high.

Thus, as shown in FIG. 70A, such an electronic part 182 is sealed on the resin substrate. Accordingly, this electronic part 182 is protected against external mechanical stress. However, as shown in FIG. 70B, the sealing with this resin 183 may cause the connection of the wire bonding or the flip-chip to be damaged. Firstly, the circulation of the resin 138 when the resin 183 is poured may cause the stress to be applied to a bonding portion of a wire 184, a flip-chip or the like, namely, a part of an electronic circuit 185, and thereby the connection may be damaged. Secondly, although the electronic circuit 185 is sealed with the injected resin without damaging the connection, the application of the thermal stress resulting from the thermal variation and the like may cause the wiring to be disconnected.

This embodiment solves the second problem resulting from the thermal stress. Since a surface 181a of a resin substrate 181 is made rough as shown in FIG. 70C, the adhesive force is very strong between the surface 181a of this resin substrate and the seal resin 183. Thus, the selection width for both the materials is wider as mentioned above. Especially, it is possible to select the material suited to avoid the problem resulting from the thermal stress.

Moreover, if the adhesive strength between the surface 181a of the resin substrate and the seal resin 183 is strong, the heat is applied so that the swell when the seal resin 183 is thermally swelled becomes uniform on the entire surface of the resin substrate 181. Thus, there is no case in which the stress is concentrated on only a part of the surface of the resin substrate 181 to thereby generate the large stress of damaging the connection of the bonding wire 184.

What is claimed is:

1. A method of manufacturing an electronic circuit device, comprising:
    providing a resin substrate;
    forming a through-hole and/or via-hole in said resin substrate; and
    making a surface of said resin substrate and said through-hole and/or said via-hole rough by wet blasting such that a surface roughness of said surface of said resin substrate and said inner surface of said through-hole and/or said via-hole is in a range of 0.1 microns to 10 microns.

2. A method of manufacturing an electronic circuit device according to claim 1, further comprising:
    forming a conductive member on said rough surface of said resin substrate and said rough inner surface of said through-hole and/or said via-hole by performing electroless plating; and
    forming a wiring by performing electrolytic plating to said conductive member as a base layer.

3. A method of manufacturing an electronic circuit device according to claim 2, wherein said conductive member substantially consists of copper.

4. A method of manufacturing a wiring board, comprising:
    providing a resin substrate;
    forming a penetration hole in said resin substrate;
    making a surface of said resin substrate and an inner surface of said penetration hole rough while removing a smear without using an etching solution wherein said smear is generated when said penetration hole is formed; and
    performing a plating on said rough surface of said resin substrate and said rough inner surface of said penetration hole.

5. A method of manufacturing a wiring board according to claim 4, wherein said making a surface of said resin substrate and an inner surface of said penetration hole rough includes making a surface of said resin substrate and an inner surface of said penetration hole rough, while removing a smear generated when said penetration hole is formed.

6. A method of manufacturing a wiring board according to claim 4, wherein said making a surface of said resin substrate and an inner surface of said penetration hole rough includes making a surface of said resin substrate and an inner surface of said penetration hole rough by using one of dry blasting and wet blasting.

7. A method of manufacturing a wiring board according to claim 4, wherein said making a surface of said resin substrate and an inner surface of said penetration hole rough includes making a surface of said resin substrate and an inner surface of said penetration hole rough such that a surface roughness of said surface of said resin substrate and said inner surface of said penetration hole is in a range of 0.1 microns to 10 microns.

8. A method of manufacturing a wiring board, comprising:
    providing a resin substrate;
    forming a conductive layer on a bottom surface portion of said resin substrate;
    forming a hole which penetrates said resin substrate and does not penetrate said conductive layer, wherein said forming said holes causes formation of a smear;
    making a surface of said resin substrate and an inner surface of said hole rough, while removing, without an etching solution, said smear existing on said conductive layer corresponding to a bottom portion of said hole, and inside said hole; and
    performing a plating on said rough surface of said resin substrate and said rough inner surface of said hole.

* * * * *